United States Patent [19]

Fiala et al.

[11] Patent Number: 4,906,991
[45] Date of Patent: Mar. 6, 1990

[54] TEXTUAL SUBSTITUTION DATA COMPRESSION WITH FINITE LENGTH SEARCH WINDOWS

[75] Inventors: Edward R. Fiala; Daniel H. Greene, both of Sunnyvale, Calif.

[73] Assignee: Xerox Corporation, Stamford, Conn.

[21] Appl. No.: 187,793

[22] Filed: Apr. 29, 1988

[51] Int. Cl.⁴ ............................................. H03M 7/30
[52] U.S. Cl. ...................................... 341/51; 341/79; 341/87
[58] Field of Search ........................ 341/51, 64, 65, 67, 341/87, 90, 95, 107; 364/200, 260.6, 513.5, 148; 370/83, 79, 84

[56] References Cited

U.S. PATENT DOCUMENTS 4,464,650  8/1984  Eastman et al. ...................... 341/51
4,558,302  12/1985  Welch .................................. 341/51

Primary Examiner—William M. Shoop, Jr.
Assistant Examiner—Brian Young

[57] ABSTRACT

In accordance with the present invention source data is encoded by literal codewords of varying length value, with or without the encoding of copy codewords of varying length and displacement value. Copy codeword encoding is central to textual substitution-style data compression, but the encoding of variable length literals may be employed for other types of data compression.

7 Claims, 15 Drawing Sheets

ASTRAY ASTRIDE ASTRINGENT

Step 1

Step 5

Step 6

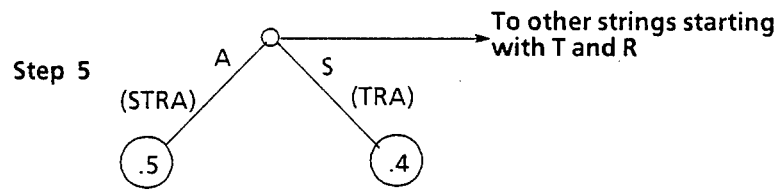
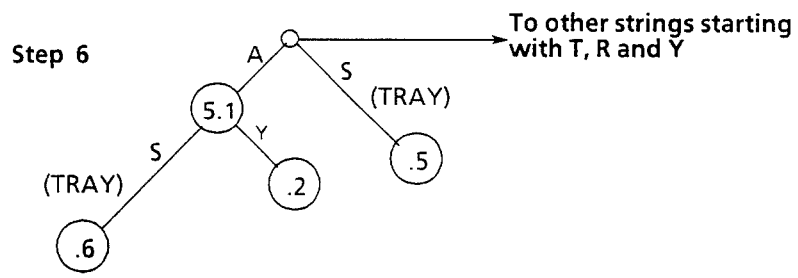
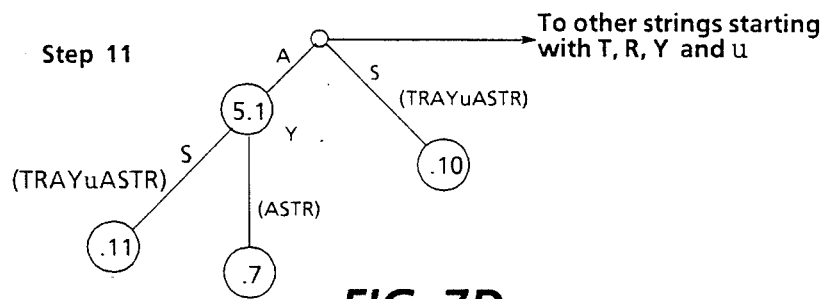

TEXTUAL SUBSTITUTION DATA COMPRESSION WITH FINITE LENGTH SEARCH WINDOWS

FIELD OF THE INVENTION

This invention relates to digital data compression systems and, more particularly, to adaptive and invertible or lossless digital data compression systems.

CROSS-REFERENCE TO RELATED APPLICATION

This is one of three commonly assigned and concurrently filed United States patent applications of the named inventors. The others relate to "Start, Step, Stop Unary Encoding for Data Compression" Application Ser. No. 07/187,697 and to "Search Tree Data Structure Encoding for Textual Substitution Data Compression Systems" Application Ser. No. 07/187,699. A common detailed description has been used because the inventions covered by the different applications may be combined in various ways.

BACKGROUND OF THE INVENTION

Digital data compression is an important tool because it can be utilized, for example, to reduce the storage requirements for files, to increase the rate at which data can be transferred over bandwidth limited communication channels, and to reduce the internal redundancy of data prior to its encryption in order to provide increased security.

There are special purpose and general purpose data compression systems. Special purpose systems often are satisfactory when used to compress source data for which they have been optimized. However, general purpose systems customarily are designed to adapt to the source data, so they usually are better suited for compressing unknown or diverse source data types. Ideally, these general purpose systems are not only able to adapt promptly to fundamental changes in the compositional structure of the source data as may be required to provide significant compression for small files and for sources with internally inconsistent statistical characteristics, but also are able to provide near optimal compression for large files with stable statistical characteristics. Designers have taken various approaches to resolving these competing design goals, but the results of their efforts have not been fully satisfactory.

Shannon communication theory (C. E. Shannon, "A Mathematical Theory of Communication," *The Bell System Technical Journal*, Vol. XXVII, No. 3, 1948, pp. 379–423 and No. 4, 1948, pp. 623–656) indicates that the ideal encoding of a given source symbol uses space equal to $-\log_2$ of the probability, P, of the occurrence of the symbol. When the encoding conforms to this memoryless model, the average space needed to represent any symbol is the entropy of the source:

$$H_0 = -\sum_{i=0}^{n-1} P(x = c_i)\log_2 P(x = c_i) \quad (1)$$

where:

x is a randomly chosen symbol from a source containing n unique symbols; and $c_i$ ranges over all possible source symbols.

D. A. Huffman, in "A Method for the Construction of Minimum Redundancy Codes," *Proceedings of the I.R.E.*, Vol. 40, 1952, pp. 1098–1110, suggested mapping variable length codes onto the source symbols in accordance with the statistical frequency distribution of the symbols to provide a discrete approximation of such ideal encoding. Thereafter, arithmetic coding techniques were developed to further optimize the encoding by arithmetically modifying the last few bits of the previously encoded symbols, thereby avoiding the waste of fractional bits. See, for example, R. C. Pasco, "Source Coding Algorithms, for Fast Data Compression," Ph. D. Dissertation, Stanford University, 1976; G. G. Langdon, Jr. et al., "Compression of Black-White Images with Arithmetic Coding," *IEEE Transactions on Communications*, Com-29, No. 6, 1981, pp. 858–867; G. G Langdon, Jr. et al., "A Double Adaptive File Compression Algorithm," *IEEE Transactions on Communications*, Com-31, No. 11, 1983, pp. 1253–1255; and J. Rissanen et al., Universal Modeling and Coding," *IEEE Transactions on Information Theory*, It-27, No. 1, 1981, pp. 12–23.

As a practical matter, however, the zero-order entropy model of equation (1) fails to capture a significant part of the redundancy of many conventional sources. For example, English language text normally exhibits a substantial drop in first-order entropy:

$$H_1 = -\sum_{i,j=0}^{n-1} P(x = c_i)P(y = c_j | x = c_i)\log_2 P(y = c_j | x = c_i) \quad (2)$$

where: xy is a randomly chosen pair of adjacent source characters.

Thus, several of the above-identified references have extended Huffman and arithmetic coding techniques by basing the coding on statistics that are conditioned by the frequency at which any given symbol is preceded by at least one and usually two or more other symbols. Unfortunately, however, the increased compression that is achieved in that way characteristically requires substantially more memory and processing time to carry out the compression process.

Others have proposed so-called "textual substitution" data compression processes for capturing the high-order coherence of text and similar source data, without having to pre-condition the capture mechanism on statistical probabilities. J. Ziv and A. Lempel proposed an algorithmic model for a textual substitution process based on the notion that a reoccurrence of a string of previously encoded symbols can be represented by prefacing the symbol immediately following such a reoccurrence (i.e., the suffix character of the reoccurring string) with a copy codeword which (1) points to one end (e.g., the lead end) of the prior occurrence of the string and (2) identifies the length of the reoccurring string. They recognized that such a copy codeword would fully and completely define the reoccurring symbol string, so they envisioned "substituting" the codeword for the symbols of the reoccurring symbol string to provide a compressed representation of them. See J. Ziv et al., "A Universal Algorithm for Sequential Data Compression," *IEEE Transactions on Information Theory*, IT-23, No. 3, 1977, pp. 337–343.

Regrettably, compression systems based on the original Ziv-Lempel algorithm tend to be unacceptably slow and have not achieved particularly high compression. To improve speed, they and other workers in the field have developed various alternatives. Some of these alternatives adopted artificially rigid parsing mechanisms to simplify the generation of the copy codewords and to limit the size of the data structures that are needed to carry out the compression. See, for example, J. Ziv et al., supra; J. Ziv, "Coding Theorems for Individual Sequences," *IEEE Transactions on Information Theory*, IT-24, No. 4, 1978, pp. 405–412; J. Ziv et al., "Compression of Individual Sequences Via Variable-Rate Coding," *IEEE Transactions on Information Theory*, IT-24, No. 5, 1978, pp. 530–536; and W. L. Eastman et al., U.S. Pat. No. 4,464,650, which issued Aug. 7, 1984 on "Apparatus and Method for Compressing Data Signals and Restoring the Compressed Data." However, these modified Ziv-Lempel style data compression systems have not been fully satisfactory because their performance typically is disappointing as measured by the speed at which they adapt and/or the compression they provide.

A somewhat different approach that has been proposed for utilizing textual substitution for data compression is based upon building adaptive lists or dictionaries of individual symbols and symbol strings. See, for example, V. S. Miller et al., "Variations on a Theme by Ziv and Lempel," IBM Research Report, RC 10630, #47798, 1984, *Combinational Algorithms on Words*, NATO, ASI Series F, Vol. 12, 1985, pp. 131–140; T. A. Welch, "A Technique for High Performance Data Compression," *IEEE Computer*, Vol. 17, No. 6, 1984, pp. 8–19; and J. L. Bonkley, "A Locally Adaptive Data Compression Scheme," *Communications of the ACM*, Vol. 29, No. 4, 1984, pp. 320–330. But, these systems are slow to adapt and achieve inferior compression.

Still further background on the textural substitution digital data compression art is provided, for example, by M. Rodeh et al., "Linear Algorithm for Data Compression Via String Matching," *Journal of the Association for Computing Machinery*, Vol. 28, No. 1, 1981, pp. 16–24; J. A. Storer, "Data Compression Via Textual Substitution," *Journal of the Association for Computing Machinery*, Vol. 29, No. 4, 1982, pp. 928–951; G. Guoan et al., "Using String Machine to Compress Chinese Characters," *Stanford Technical Report*, STAN-CS-82-914, 1982; and G. G. Langdon, Jr., "A Note on the Ziv-Lempel Model for Compressing Individual Sequences," *IEEE Transactions on Information Theory*, IT-29, No. 2, 1983, pp. 284–287.

In view of the disadvantages of the prior art, it will be apparent that there still is a need for practical general purpose, adaptive and invertible (i. e., lossless) data compression systems for reliably and efficiently compressing large sources having stable statistical characteristics, as well as less extensive sources and sources having variable statistical characteristics. Textual substitution techniques would be well suited to that task, but improved methods and means for carrying out such a data compression process in practice are needed to more fully realize its potential.

SUMMARY OF THE INVENTION

In accordance with the present invention source data is encoded by literal codewords of varying length value, with or without the encoding of copy codewords of varying length and displacement value. Copy codeword encoding is central to textural substitution-style data compression, but the encoding of variable length value literals may be employed for other types of data compression.

BRIEF DESCRIPTION OF THE DRAWINGS

These and other features and advantages of the present invention will become apparent when the following detailed description is read in conjunction with the attached drawings, in which:

FIGS. 7A-7E diagrammatically illustrate the construction of a PATRICIA tree organized data structure;

DETAILED DESCRIPTION OF THE PREFERRED EMBODIMENTS

While the invention is described in some detail hereinbelow with reference to certain illustrated embodiments, it is to be understood that there is no intent to limit it to those embodiments. On the contrary, the aim is to cover all modifications, alternatives and equivalents falling with the spirit and scope of the invention as defined by the appended claims.

A. Overview

Figure 1:
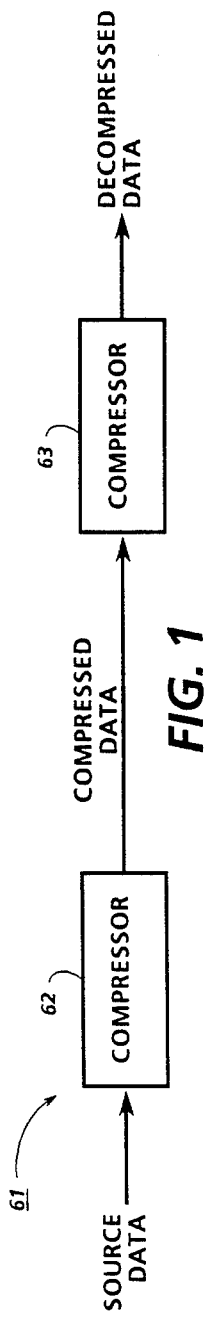
FIG. 1 is a simplified block diagram of a data compression system.

Turning now to the drawings, and at this point especially to FIG. 1, there is a data compression system 61 having a compressor 62 for compressing serial, digitally encoded source data and an expander 63 for serially decompressing the data. Various embodiments of the present invention are described and others will suggest themselves, but each of them provides an invertible or lossless data compression system, thereby ensuring that the expanded or decompressed data is essentially identical to the original source data. Furthermore, all embodiments of this invention are adaptive, so the source data may be composed, for example, of alphanumeric text, scanned or synthetic images, human or machine readable computer code, or different combinations of those and/or other source types.

It is to be understood at the outset that the compressor 62 and expander 63 may be implemented by means of suitably configured hardware or through the use of appropriately programmed general purpose digital computers. Moreover, the compressor 62 and the expander 63 may be located at the same site if it is desired to localize them, such as for loading compressed source data into and retrieving decompressed source data from a file server (not shown). Indeed, a single site software implementation of the compressor 62 and expanded 63 can utilize the same computer for executing the compressor and expander programs on command. Alternatively, the compressor 62 and the expander 63 may be located at different sites if it is desired to distribute their functions, such as for transmitting and receiving data via a limited bandwidth communications medium (also not shown). File and stream compressors and expanders will be discussed, so it is to be understood that the primary distinctions between them relate to the flow control of their input data and to the padding of the compressed data with pad codewords to restore their byte alignment. Data is "pushed" into stream compressors and "pulled" from stream expanders by the "client" being a data sink), while data is "pulled" into file compressors and expanders under their internal control. Some passing references will be made to the padding of the compressed data with pad codewords, but that subject is generally beyond the scope of the present invention and is within the working knowledge of persons skilled in the art.

To carry out the present invention, the compressor 62 assembles and maintains a complete and current record of all recently compressed source symbols linked in accordance with the order of their occurrence. This record is retained in a suitable memory to provide a first in/first out ("FIFO") "search window" which spans all of the previously compressed symbols in the source data stream between the position, i, of the most recently compressed symbol and a position, i - w, of an earlier compressed symbol, where w is the symbol length of the search window.

In operation, the source symbols are tested prior to being inserted into the search window to determine whether the search window contains matches for any of the extended symbol strings that are formed by supplementing a test symbol at symbol position i+1 with one or more of the symbols that follow it, and, it so, to determine the symbol length of the longest of those matches. If no match is found, or if the longest existing match is too short to satisfy a predetermined "minimum meaningful copy length" criterion, the compressor 62 inserts the test symbol into the compressed data stream behind a fixed or variable length literal codeword having the general form "literal $x_l$." The expander 63, in turn, interprets this codeword as instructing it to pass the next "$x_l$" symbols directly to its output. If, on the other hand, the search window contains a sufficiently long match for such an extended test symbol string, the compressor 62 looks still further ahead symbol-by-symbol in the uncompressed data stream, until either (1) it comes upon a symbol that terminates the longest existing match (i. e., a symbol that fails to further extend the length of that match), or (2) it determines that a maximum permissible match length has been found. In response to either of those events, the compressor 62 inserts a fixed or variable length copy codeword of the general form "copy $c_c$,'y" into the compressed data stream in lieu of the matched symbol string. This codeword instructs the expander 63 to jump back over "y" previously decompressed source symbols, where $y \leq w$, and to then copy "$x_c$" consecutive symbols of progressively more recent vintage into its output, starting the copying process with the symbol at the jump entry position.

B. An Elementary Embodiment

Figure 2:
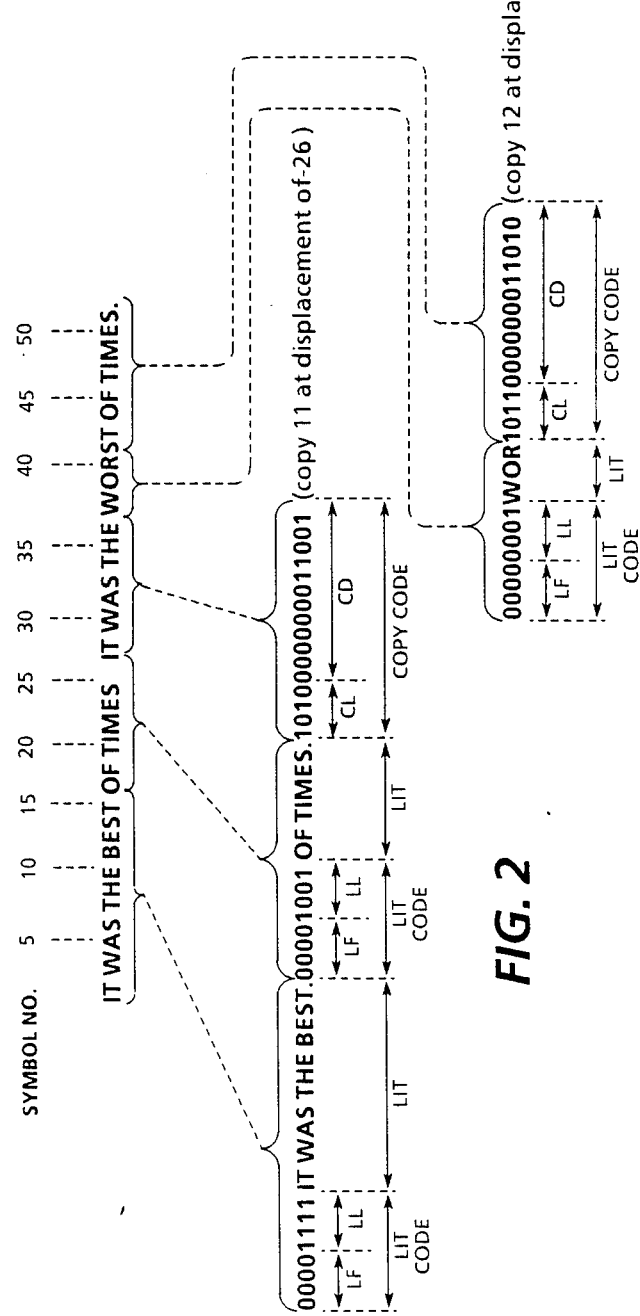
FIG. 2 is a diagram illustrating the encoding of a string of sample text in accordance with a basic embodiment of the present invention.

As will be appreciated, the compression achieved depends on the space required for the copy and literal codewords. FIG. 2 illustrates a single pass compression of a familiar passage of text using fixed length, eight and sixteen bit literal and copy codewords, respectively. While the lengths of these codewords are not a fundamental feature of the present invention, it is to be understood that these particular codewords are sufficient for a practical implementation of this invention and have the advantage of byte aligning with source data composed of ordinary eight bit per character text and/or computer source code.

Focusing for a moment on the layouts of the codewords, it will be seen that the first four bit positions of an eight bit literal codeword typically are allocated to a literal flag or identification field, LF, to accommodate a reserved introductory bit sequence, such as "0000," for uniquely identifying the literal codeword. In that case, the other or last four bits of such a codeword reside in a literal length field, LL, for encoding a literal length, $x_l$, in the range [1 ... 16], whereby up to sixteen literal symbols may be appended to such a codeword (i. e., the "maximum permissible literal length"). A copy codeword, on the other hand, contains both a copy length and a displacement or location value. Here, for example, the first four bit positions of each copy codeword are allocated to a copy length field, CL, for encoding a copy length, $x_c$, in the range [2 ... 16], while its remaining or final twelve bit positions provide a copy displacement field, CD, for encoding a displacement, y, in the range [1 ... 4096], Therefore, up to sixteen symbols may be represented by a single copy codeword, thereby defining the "maximum permissible copy length" (this is one of a number of instances in which codes suitably are shifted down by one, so a code having a binary value of 1 means a copy length of 2, a code having a binary value of 2 means a copy length of 3, etc.). Furthermore, the effective length of the search window is determined because the origin of a matching symbol string is uniquely identifiable only if it is one of 4096 most recently processed symbols positions.

To simplify the example shown in FIG. 2, it has been assumed that the search window of the compressor 62 is initially empty and is of sufficient length to store all of the alphanumeric characters, punctuation, and intermediate spaces of the sample text (i.e., all of its "source symbols"). A simplified computer program for compressing and expanding source data in accordance with one embodiment of this invention is set forth in Appendix A (with some of the more straightforward procedures only functionally described), which is hereby incorporated by reference, As will be seen, the Appendix A embodiment of the invention imposes the following logical rules on the operation of the compressor 62: (1) if the compressor 62 is idle and if the longest match that is found within the search window for a given test symbol as extended by one or more of the symbols that follow it (i. e., an extended test symbol string) is less than two symbols long, a "literal" is initiated; (2) once initiated, a literal is not interrupted prior to attaining its maximum permissible length, unless a match spanning at least three symbols is found; (3) a "copy" is initiated (i) in the event of such an interrupt or (ii) if the compressor 62 is idle and a match spanning at least two symbols is found; (4) a literal codeword and the literal source symbols appended to it are inserted into the compressed data stream whenever (i) a literal is interrupted or (ii) a literal of maximum permissible length is available; and (5) a copy codeword is inserted into the compressed data stream whenever it is determined that the matched input or test symbol string (i) is terminated by a symbol that does not further extend the length of the longest available match or (ii) spans a maximum permissible copy length. The comments appearing in the Appendix will help correlate the foregoing rules with the code. Moreover, the preface of Appendix A refers to several techniques which may be utilized for increasing the execution speed of the compression program and for reducing the amount of memory needed to execute it.

In view of the simplifying assumption that the search window of the compressor 62 initially is empty, it will be evident that the above summarized compression rule cause the compressor 62 to append the first few symbols of the sample text shown in FIG. 2 to a literal codeword. Indeed, in this instance, the compression rules require literal encoding of symbols 1-26, so there are more literals in this first symbol string than any one literal codeword of maximum permissible literal length can effectively communicate to the expander 63. Such a situation is likely to occur from time-to-time, especially during start-up and while the compressor 62 is transitioning from one type of source data to another, so it is important to understand that the compressor 62 recycles whenever it assembles a literal symbol string of maximum permissible literal length. As a result of this recycling, the compressor 62 subdivides longer literal symbol strings into two or more substrings of permissible length and appends those substrings to separate literal codewords for conveying them to the expander 63. For example, symbols 1-16 of the text set forth in FIG. 2 are appended to a first literal codeword having a length value of sixteen, and then symbols 17-26 are appended to a second literal codeword having a length value of ten. As will be appreciated, one benefit of these longer literals is that they effectively reduce the number of literal codewords that are inserted into the compressed data stream while the compressor is adapting to a new source data type.

While symbol 27 of the FIG. 2 text is in symbol position i+1, a three symbol long match is found because symbols 27-29 match previously occurring symbols 1-3. Consequently, the "literal" which is then in progress is interrupted and a "copy" is initiated. This happens to be the first instance of "copy" in this particular example, even though a brief review of the sample text will reveal some prior two symbol long matches. It, therefore, is to be understood that those prior matches were ignored in keeping with the compression rules of Appendix A because each of them was only two symbols long and occurred while a literal was being generated.

Having initiated a "copy" in response to the match found for symbols 27-29, the compressor 62 further extends the matched symbol string with one after another of the following source symbols, until it finds a source symbol which terminates the match (i. e., a symbol that fails to further extend the length of the longest match), as at symbol 38, or until it finds a match of maximum permissible copy length. When either of those events occurs, the compressor 62 issues a copy codeword into the compressed data stream in lieu of the matched symbol string. The copy codeword indicates the length of that symbol string and provides a pointer for locating the lead symbol of its prior occurrence, thereby enabling the expander 63 to recover the symbols represented by the codeword by means of the previously described "jump back" and "copy forward" process.

Figure 3:
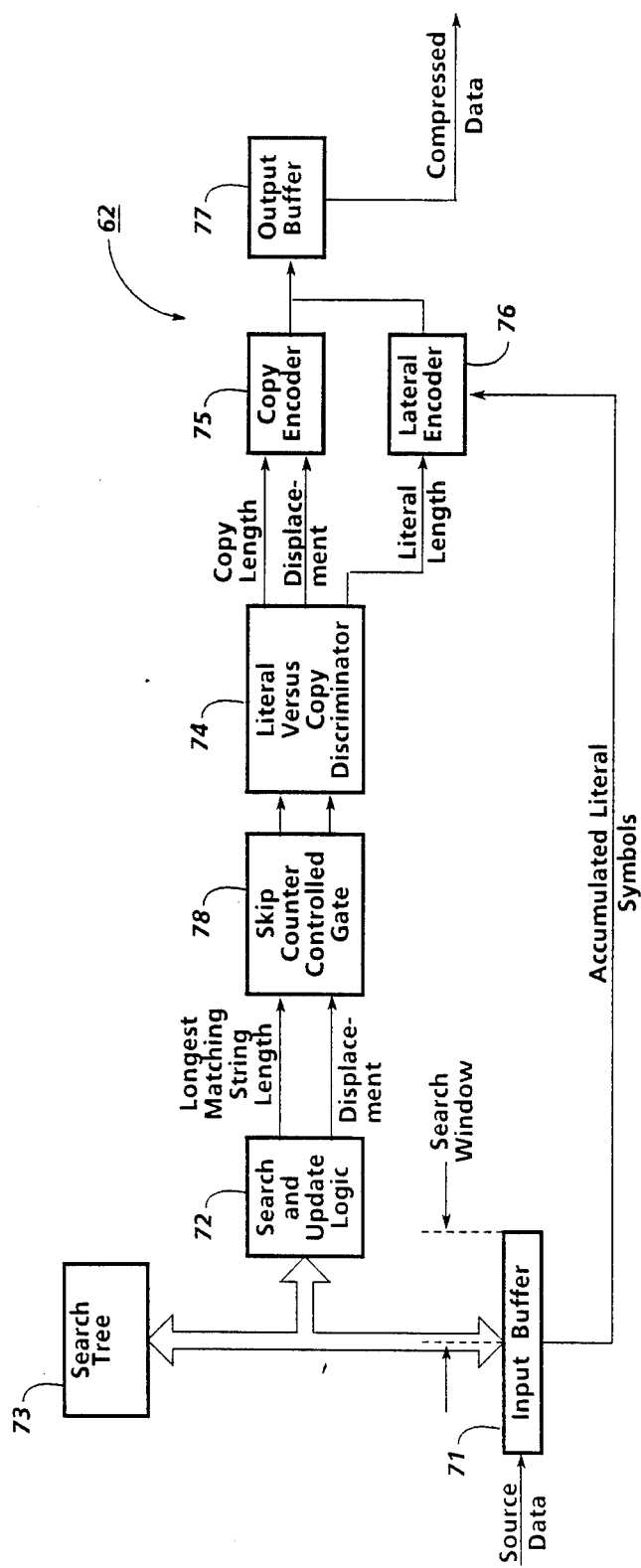
FIG. 3 is a more detailed block diagram of a data compressor constructed to perform the encoding illustrated in FIG. 2.

Referring to FIG. 3, the Appendix A embodiment of the compressor 62 comprises a first in/first out (FIFO) input buffer 71 for storing (1) symbols from an about to be compressed portion of the source in symbol positions leading up to and including symbol position i+1, preceded by (2) the most recently compressed symbols in the search window symbol positions i through i-w. In a software implementation, the buffer 71 suitably is a circular buffer which is divided into quadrants so that a batch transaction can be employed for regularly reloading source symbols into it quadrant-by-quadrant until the source to be compressed is exhausted (e.g., until the end of the current source file is reached). That reduces the number of I/O transactions that are required for maintaining a timely flow of source symbols for the compressor 62. In such an implementation, the quadrants are selected to be sufficiently large to effectively isolate the compression performed by the compressor 62 from the reloading of its input buffer 71.

A search and update logic 72 assembles and maintains a search tree organized data structure 73 which links the symbols within symbol positions i through i-w of the buffer 71 (i. e., the search window) to each other in accordance with the order of occurrence and which tracks the most recent occurrence of those symbol strings as successive symbols are shifted into, through and out of the search window. The cut-off depth of the links provided by the search tree data structure 73 suitably is selected to equal the maximum permissible copy length, thereby limiting the amount of memory required to store it and the processing time required to maintain it. Several other techniques that may be utilized for further reducing the size of the search tree 73 and the time that is required for updating it are described in further detail hereinbelow.

In operation, the search and update logic 72 employs the search tree 73 for determining whether there is a match anywhere within symbol positions i through i-w of the buffer 71 for the test symbol appearing at symbol position i+1. If a match is found, the logic 72 extends the test string by appending the symbol at symbol position i+2 to it and then determines whether there also is a match within the search window for this extended input symbol string. This is a reiterative process, whereby the search and update logic 72 progressively supplements the test symbol string by extending it with one after another of the uncompressed symbols until a symbol that fails to extend the length of the longest existing match (i. e., a match terminating symbol) is encountered or until the existence of a match of maximum permissible copy length is identified. When either of these events occurs, the search and update logic 72 issues a report to a discriminator 74, which operates in accordance with the above summarized encoding rules to determine whether the symbol or symbols being tested are to be encoded as a copy codeword by a copy encoder 75 or are to be appended to a literal codeword by a literal encoder 76. To that end, the report provided by the search and update logic 72 identifies the length of the longest match that has been found and the search window position of the prior occurrence of the matched symbols (the positional information need not be reported if the length of the match is less than the minimum match length required for a copy). In this instance, the location of the lead or first symbol of the matching symbol string is reported to the copy encoder 75 as a displacement from symbol position i+1, but it will be evident that its location could be unambiguously identified in other ways.

A copy codeword is inserted into an output buffer 77 by the copy encoder 75 in response to a report from the search and update logic 72 which causes the discriminator 74 to conclude that a match of sufficient length to be encoded by such a codeword has been identified. The copy codeword is substituted for the symbols of the matched symbol string, so all of the symbols of the matched symbol string are shifted into the search window quadrant or sector of the buffer 71 before the discriminator 74 responds to any further reports from the search and update logic 72. To that end, a count corresponding to the length of each copy is loaded into a character skip counter of a counter controlled gate 78 for temporarily disabling the encoding logic 74-76 from producing further codewords while the symbols represented by the copy are being loaded into the search window sector of the input buffer 71. The count is decremented as each of the successive symbols of the match symbol string is loaded into the search window, so the encoding resumes with the symbol following the matched string.

A literal, on the other hand, is initiated by the discriminator 74 when the search and update logic 72 fails to find a match of sufficient length to be encoded as a copy, even though the length of the literal is still unknown. Once a literal is initiated, the search and update logic 72 tests the extension of successive ones of the uncompressed symbols as they are shifted into symbol position i +1 until it finds a match for an extended test symbol string of sufficient length to warrant interrupting the literal (e g., at least three symbols long) or until the number of symbols that have been tested reaches the maximum permissible literal length. Whenever either of those events occurs, the literal encoder 76 inserts a literal codeword identifying the length of the literal into the output buffer 77 and then copies the accumulated symbols of the literal into the buffer 77 in serial order, thereby appended them to the literal codeword. The literal codeword and its appended literal symbols may be loaded in to the output buffer 77 as soon as a match of sufficient length for a copy is found or, as in the illustrated embodiments, after the match for the copy has been extended to its ultimate length such that the copy encoder 75 is ready to issue a copy codeword.

Figure 4:
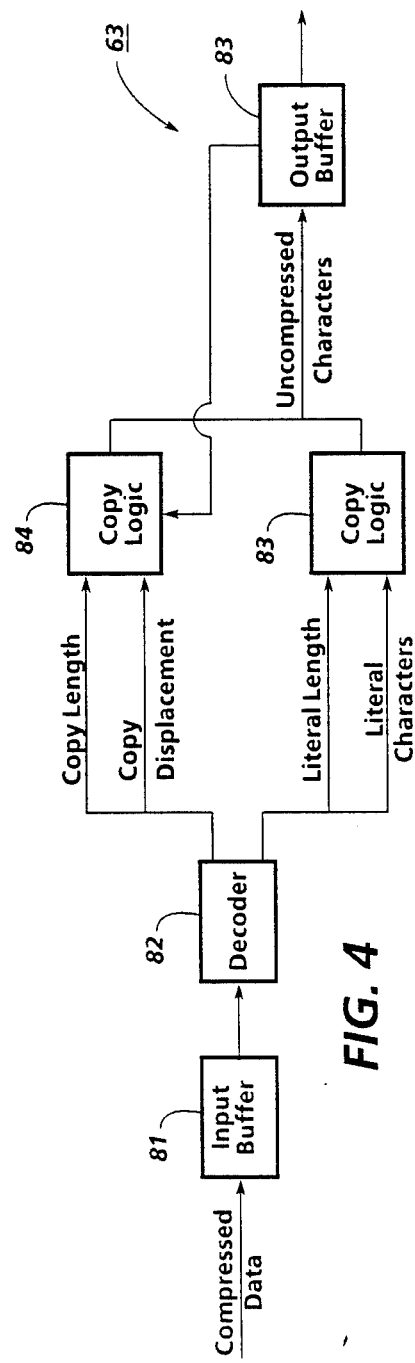
FIG. 4 is a block diagram of an expander for decompressing data compressed by the compressor shown in FIG. 3.

As shown in FIG. 4, for decompressing the compressed source data, the expander 63 comprises an input buffer 81 for supplying the compressed data to a decoder 82 at a suitable rate or as requested. The decoder 82, in turn, decodes the literal and copy codewords for a literal logic 83 and a copy logic 84, respectively. When a literal codeword is decoded by the decoder 82, the literal logic 83 responds to the decoded length of the literal, $x_l$, to serially load the next $x_l$ symbols directly into a FIFO output buffer 85. On the other hand, when a copy codeword is decoded, the copy logic 84 responds to its displacement, y, and length, $x_c$, for serially copying into the output buffer 85 a string of previously decompressed symbols, starting with the $y^{th}$ previously decompressed symbol in the buffer 85 and extending the copy from there through a string of $c_c$ progressively more recently decompressed symbols.

C. More on Search Trees

Advantageously, the search tree 73 branches in accordance with the "digits" of its keys to its "leaves," which are defined by the source symbols that are within the search window symbol positions i through i-w of the input buffer 71 at any given time. Focusing, for example, on the highly redundant English language text shown in FIG. 5, it will be evident that a search tree 73 which branches in accordance with the individual characters of any portion of the text that is within the search window symbol positions of the input buffer 71 is well suited for providing the pointers that are needed for locating prior occurrences of reoccurring symbols and symbol strings, provided that the pointers are updated during operation to account for the FIFO shifting of the compressed source symbols into, through and out of the search window. Symbols are shifted into the window via symbol position i immediately after it is determined whether they are to be associated with a literal or copy codeword as previously described, while older symbols are shifted out of the window via symbol position i-w when space occupied by them is needed for storing the more recently compressed symbols and symbol strings. Although the relative motion between the source symbols and the fixed length search window is most easily visualized as a physical shifting of the symbols with respect to the search window, it is to be understood that it may be implemented in software by employing pointers which are shifted with respect to the source symbols under software control.

Referring to FIGS. 6A–6E, it will be evident that a Trie tree data structure (see D. E., Knuth, *The Art of Computer Programming. Vol. 3: Sorting and Searching,* Addisson-Wesley, Second Print, 1975, p. 481) satisfies the basic functional requirements of the search tree 73. As is known, a symbol string is inserted into a Trie tree by descending down from the root of the tree one additional level for each successive symbol in the string. Consequently, the $j^{th}$ level of the tree branches in accordance with the $j^{th}$ symbol in any given symbol string, with the result that the tree inherently contains all of the necessary pointers for locating all symbols and symbol strings within the search window. However, a substantial amount of processing time is required to insert symbol strings into a Trie tree (i. e., the worst case insertion time for a file composed of n symbols is O(d·n), where d is the maximum permissible copy length. Moreover, the size of such a data structure grows to O(d·w), where w is the search window size, so a simple Trie tree data structure is likely to be too large for most practical applications of this invention.

Turning to FIGS. 7A–7E, a PATRICIA tree (see D. R. Morrison, "PATRICIA-Practical Algorithm to Retrieve Information Coded in Alphanumeric", *Journal of the Association for Computing Machinery,* Vol. 15, No. 4, 1968 pp. 513-534) is a relatively compact alternative to the Trie tree. As is known, the internal nodes of a PATRICIA tree include pointers to the file it is indexing, so the data structure of such a tree need only include a single "digit" or symbol for each search path branch, thereby eliminating the superfluous internal nodes of a Trie tree (i. e., those with only one descendant). For instance, if the search tree 73 (FIG. 3) is a PATRICIA tree, the symbols parenthetically referenced on its arcs in FIGS. 7B–7E need not be explicitly included in the data structure because they do not affect the branching of the tree. Those symbols can be recovered, however, by scanning the symbols within the search window symbol positions identified by the position and level pointer pairs of the nodes for the arcs upon which they reside, so they are effectively represented by those arcs.

A classical PATRICIA tree requires only a single file access and comparison at the end of each search. However, when a PATRICIA-style search tree 73 is used to carry out the present invention, it generally is preferable to scan the symbols that are represented by the arcs traversed during the insertion of symbol strings in to the tree, so that the position pointers within the nodes to which those arcs lead can be updated while descending downwardly into the tree. Typically, the "digits" that are inserted into the search tree 73 are bytes (e. g., eight bit characters) so a branching factor as large as 256 can be provided. As a general rule, however, the nodes do not have that many descendants, so the amount of space that must be reserved within the nodes of the tree 73 to define the branching of its search paths may be reduced by hashing its arcs.

A PATRICIA tree is an acceptable choice for the search tree 73 if sufficient compression can be achieved while employing a search tree with a relatively shallow cut-off depth. As previously pointed out, such a tree is defined by a reasonably compact data structure, but it relies on essentially the same insertion process (i. e., return to the root and then descend into the tree) as the Trie tree. Consequently, the time required for inserting longer symbol strings into a PATRICIA tree tends to limit the practical application of that type of tree to embodiments in which the maximum permissible copy length is relatively short (again, the worst case insertion time for a file of n symbols is O(d.n), where the depth, d, required of the tree is equal to the maximum permissible copy length.

Figure 8:
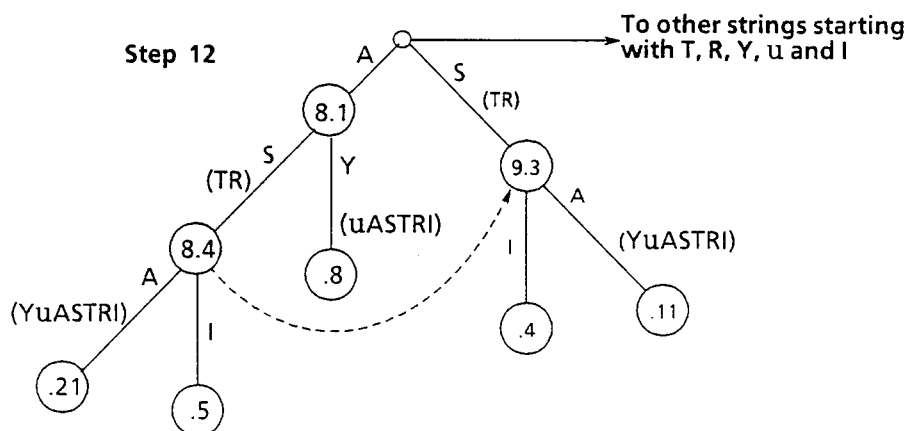
FIG. 8 diagrammatically illustrates a suffix tree organization of the data structure shown in FIG. 7E.

Fortunately, a slightly modified suffix tree, such as shown in FIG. 8, can be utilized for embodiments in which it is necessary or desirable to be able to insert symbol strings into the search tree 73 (FIG. 3) in O(n) time. As described by E. M. McCreight, "A Space-Economical Suffix Tree Algorithm," *Journal of the Association for Computing Machinery*, Vol. 28, No. 1; 1976, pp. 262–272. a suffix tree is similar to a PATRICIA tree, except that the internal nodes of a suffix tree include pointers which link them to the nodes for their suffixes, such as illustrated by the dashed line in FIG. 8. More particularly, turning to the generalized suffix tree shown in FIG. 9, it will be seen that its internal nodes for suffix extended symbol strings, such as the string aX, include pointers to the nodes representing their suffix extensions, such as X. Thus, if a suffix extended symbol string starting at position p in the search window has just been inserted at level l of a suffix-style search tree 73, the string starting at position p+1 can be inserted into the search tree, without returning to its root, because there always is a nearby suffix pointer leading from the node representing a suffix extended symbol string (e. g., the string starting at position p) to the node for its suffix extension (e. g., the string starting at position p+1).

Figure 9:
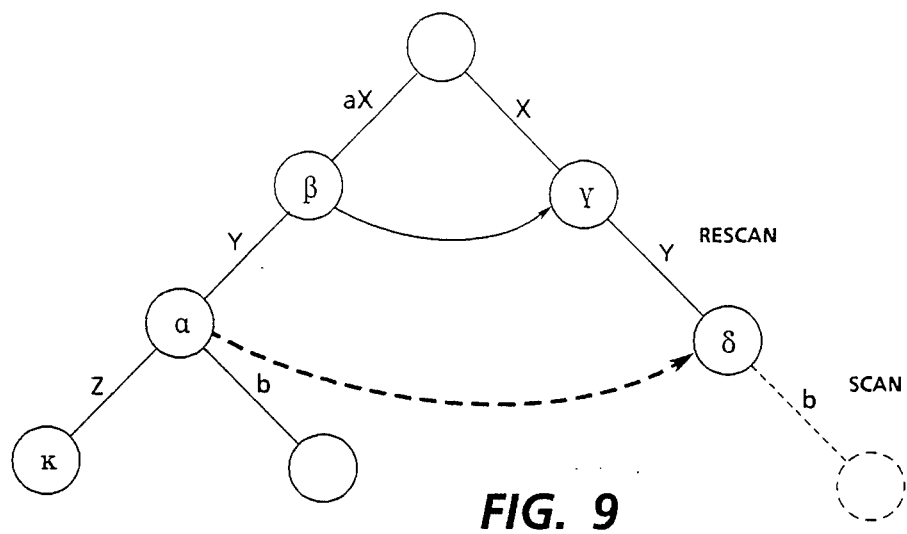
FIG. 9 is a generalized representation of a suffix tree.

Considering FIG. 9 in some additional detail, it will be seen that it depicts a situation in which a match has been found on the previous interaction for a string composed of aXY, where a is a single symbol, X and Y are strings composed of one or more symbols, and b is the first unmatched symbol following Y. To illustrate a further complication that occur from time-to-time, it has been assumed that α is a new internal node which has just been added to the tree to discriminate between the search path for the string aXYb and the search path for the string aXYZ, where Z does not being with b. In view of that assumption, it will be understood that it still is necessary to compute the suffix link for the node α.

In accordance with McCreight's above-identified teachings, the next string, XYb, can be inserted into the tree by initially moving up the tree (i. e., toward its root) from the node α (which does not yet have a suffix link) to the next higher node β, thereby stripping Y from the string aXY. The node β necessarily represents the string aX, so its suffix pointer is followed to the node γ, which by definition represents the suffix X of the string aX. Having found the node representing X, the suffix extended symbol string, XYb, can now be inserted by descending into the tree, first to "rescan" the string Y and then to "scan" still further down into the tree to find the longest existing match for the symbol string beginning with the substring XY. If there is an existing match for its suffix extension, XYb, the "rescan" will terminate on the node, δ, corresponding to the substring XY. On the other hand, if there is no match for the suffix extended string, XYb, the node δ will be created by breaking an arc representing a string beginning with Y to insert the new node δ with Y represented by its incoming arc. In either event, the node δ branches to the symbol b and represents the suffix, XY, for the previous symbol string, aXY. Thus, a pointer to it is entered into the suffix link field of the node α, thereby restoring the invariant that every internal node within the suffix tree, with the possible exception of the one most recently created, has a suffix link.

Fortunately, the symbol strings represented by the arcs that are "rescanned" during the above described process (e. g., the string Y) need not be compared against the corresponding symbols of the string being inserted into the tree because the identity of those two symbol sets was established during the prior iteration (i. e., while the suffix XY of the symbol string aXY was being inserted into the tree). This prior knowledge permits symbol strings to be inserted into a suffix-style tree 73 in essentially linear time because only their most recent suffix extensions need to be compared against the contents of the search tree.

In accordance with one of the features of this invention, several important modifications are made to the data structure of the suffix-style search tree described by McCreight, supra, to limit its size and to reduce the time required for maintaining it. As previously pointed out, the leaves of the tree are serially shifted into through and out of the search window symbol positions i through i-w of the buffer 71 (FIG. 3) on a FIFO basis, thereby providing an orderly procedure for maintaining the most recently compressed portion of the source data within the fixed length search window. Furthermore, "son count" fields are included in the internal nodes of the tree for identifying nodes that are to be deleted. As will be appreciated, internal nodes are added to the tree only when they are needed to discriminate between alternative search paths. A "parent node" which has only one remaining "son" does not provide any search path discrimination. Thus, whenever the value in the son count field of any node drops to one, the node is deleted and the symbol or symbol string represented by its sole remaining or "orphaned" son is combined with the symbol or symbol string represented by the arc from the next higher level or "grandparent" node.

Still another departure from the known suffix-style search tree is that provision is made for updating the position pointers in the internal nodes of the suffix tree, without necessarily requiring a return to the root of the tree to accomplish that. More particularly, in keeping with one of the more detailed features of the present invention, a "percolating update" may be employed for updating the pointers in the internal nodes of a suffix tree, thereby maintaining those pointers on the suffix leaves of the tree as the leaves (i. e., the recently compressed source symbols) are shifted through the search window. To that end, each internal node of the tree includes a single "update" bit in addition to its aforementioned position and level pointers, suffix pointer, and son count field. Furthermore, whenever a new symbol string is inserted into the tree, the current position in the scan window of the initial or lead symbol of the string is propagated upwardly to the parent node for the new leaf of the just inserted symbol string, whereby (1) the current position of the lead symbol of the most recent occurrence of the given symbol string is written into the position field of its leaf parent node to distinguish that occurrence from any prior occurrences of the same symbol string which still may be within the search window, and (2) the state of the update bit for the parent node of the new leaf is reversed. If the update bit of the parent node is switched from a "false" state to a "true" state, there is no further propagation of the position update. However, if the update bit of the parent node of the new leaf is switched from a "true" state to a "false" state, the current search window position of the lead symbol of the newly inserted symbol string propagates upwardly into the tree (back towards its root) to update the position fields of all nodes on the search path for the symbol string, until the update reaches a higher level node having a "false" update bit. This updating process is called a "percolating update" because the propagation of the update is terminated at the first node (the lowest level node) which receives an update while its update bit is in a "false" state. The position field of such an update terminating node is updated to point to the lead symbol of the newly inserted symbol string, and the update bit of the node is switched to a "true" state, thereby conditioning the node for propagating the next update it receives to its parent node. Finally, the last symbol of the newly inserted symbol string is shifted into the search window, thereby causing the oldest leaf of the search tree 73 (FIG. 3) to be deleted (i. e., shifted out of the search window) if the search window is full.

As previously pointed out, the deletion of leaves from a suffix-style search tree 73 desirably triggers the deletion of any parent nodes that are left with just one son. For that reason, the position of a parent node that is being deleted from such a tree also is percolated upwardly toward the root of the tree more or less in accordance with the above-described process (i. e., the position pointer of the node being deleted always is written into the position field of the next higher level node, but is only conditionally propagated upwardly from there depending upon the state of the update bits of the higher level nodes). The basic distinction is that during a percolating update from a deleted node, the existing position pointer for each of the higher level nodes which receives such an update is compared against the position pointer of the proposed update, thereby permitting the most recent of those two pointers to be selected (1) as the position pointer for the node receiving the update, and (2) as the proposed update for the next higher level node if the update is permitted to propagate to it.

In the worse case, all nodes on the path from the parent node for the suffix leaf or final symbol of a newly inserted symbol string to the root of the tree may have "true" update bits, thereby causing an update to percolate all the way up to the root of the tree. However, it can be shown that the above-described percolating update process can be performed in a constant amount of time per symbol or character when the time required to perform it is amortized over all of the leaves of the search tree 73. Even more importantly, it also can be shown that the process is effective in maintaining valid position pointers in all of the internal nodes of the search tree 73, so that the nodes are accurately referenced to the search window symbol positions which contain the symbols they represent.

Still other implementations of the search tree 73 will suggest themselves. For example, it will be evident from the foregoing discussion of Trie trees and PATRICIA trees that the percolating update provided for the suffix tree could be avoided by simply returning to the root of the tree for the insertion of each symbol string. In that event, the internal nodes of the tree would not require any update bits, and it would be unnecessary to perform updates when nodes are deleted. Likewise, suffix links are not essential for locating suffix nodes during the insertion of symbol strings into such a search tree, although they significantly reduce the average time required to perform that task. In their absence, it would be possible to start at the suffix leaf for a given string and to then follow parent pointers back toward the root of the tree until reaching the suffix node. As will be appreciated, the suffix leaf for a given symbol string is easily located because it is the first unmatched symbol following a string, such as the string aXY (FIG. 8), which is known to have a match originating at a predetermined symbol position, p, in the search window. Moreover, the suffix node for such a symbol string can be identified by using the parent pointers to move upwardly from the suffix leaf toward the root of the tree an appropriate number of levels as determined by the length of the string that is being inserted, thereby preserving the advantage of not having to return to the root of the tree for the insertion of each symbol string (as will be appreciated, the cost of moving through the search tree is not uniform because hash table look-ups normally are required to move down from level-to-level toward the suffix leaves). When, however, the maximum permissible copy length is long, this alternative suffix node based string insertion process is undesirably slow in the worst case. Similarly, if some parts of the search tree 73 are deep, an excessively long average update time is required when all updates must propagate to the root of the tree. Therefore, the suffix links and the percolating update usually are preferred.

D. Extended Embodiments

1. Statistically Sensitive Encoding

Figure 10:
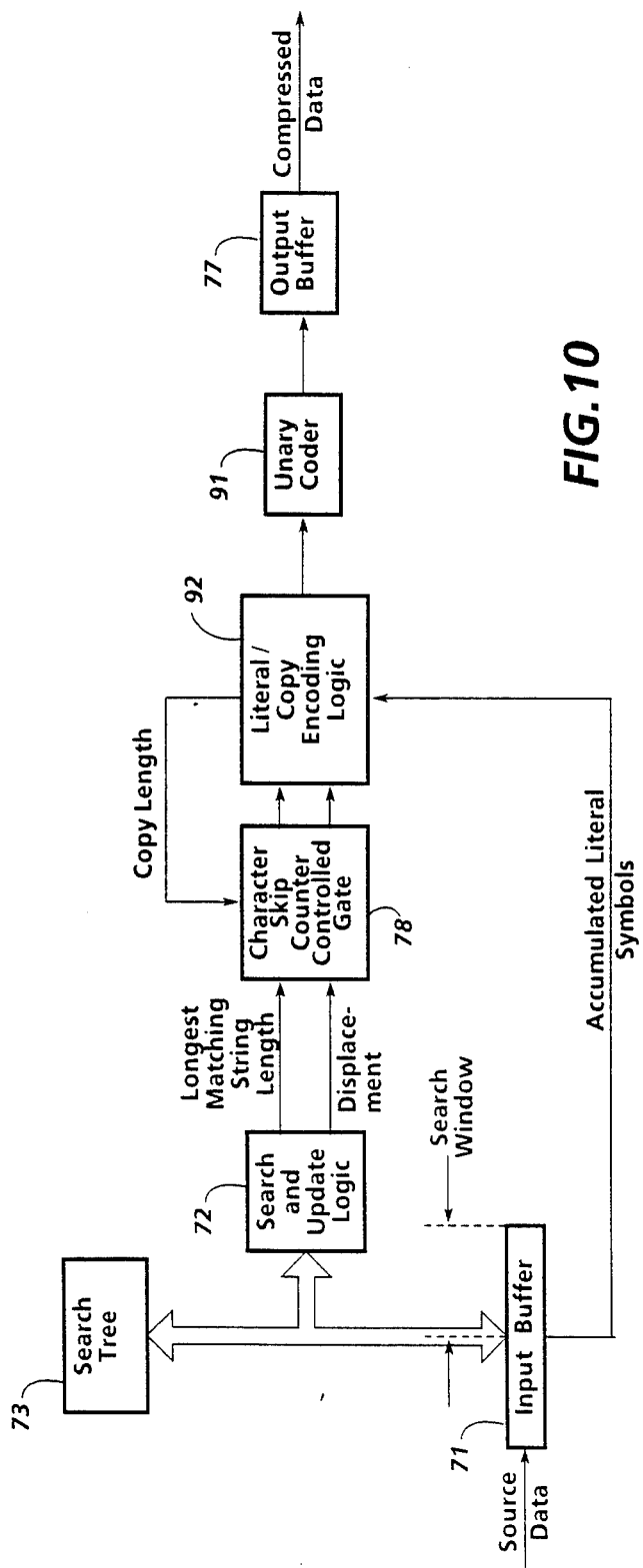
FIG. 10 is a schematic block diagram of a compressor having a unary coder.

As will be appreciated, an efficient use of fixed length literal and copy codewords requires a careful balancing of the length of those codewords against the average lengths of the literals and copies into which the source data tends to decompose. Increasing the size of the search window tends to increase the average length of the matching symbol strings that can be found, but the size of the position pointers required for specifying the individual symbol positions within the search window also increases. These larger pointers may reduce the compression that is achieved if they are employed indiscriminately because the pointers referencing the more recent symbol positions are more likely to be used. Furthermore, shorter literals and copies are more probable than longer literals and copies. Accordingly, statistically sensitive variable length literal and copy codewords advantageously are utilized to carry out the present invention when increased compression is desired. Various techniques may be employed for providing such statistically sensitive variable length codewords, For example, adaptive Huffman encoding or arithmetic coding of the literal lengths and the copy lengths and displacements reported to the encoding logic 74 (FIG. 3) could be used. However, such coding generally is slow, and it would merely yield a secondary adaptive advantage because the fixed length search window of the compressor 12 (FIG. 3) already causes it to adapt to the source. Still another approach is to pre-assign an extended family of unique codewords of different lit lengths to the encoding of literals of various lengths as well as to the encoding of copies of various lengths and displacements. In that event, short literals and short nearby copies typically are encoded by assigning relatively short codewords to them, while longer literals and longer and/or more remotely displaced copies are encoded by assigning longer codewords to them, thereby tailoring the lengths of the codewords used to a predetermined model of the frequency distribution of the literal and copy components into which an average source decomposes. A representative family of mutually distinguishable codewords (see their introductory indicator bit sequences) ranging in length from four to thirty bits long (see their sizes) are set forth below, together with the encoding tasks to which they are assigned (see their names and the string lengths covered by them within different displacement ranges of 16k long search window), as well as the layouts which enable these codewords to uniquely encode the literals and copies to which they are assigned (see the codeword layouts):

placements of the copy. As will be seen, the encoding rules or policy are enforced by encoding logic 92 located ahead of the unary coder 91, but otherwise the compressor shown in FIG. 10 is sufficiently similar to the compressor shown in FIG. 3 to permit the use of like reference numbers to identify like parts. As a matter of definition, a <start, step, stop> unary code comprises a unary code for specifying the bit length of the field in which the length of the literal or the length or displacement of the copy is being digitally recorded, followed by the value field itself. The value field is, in turn, constrained to contain no fewer bits than the specified "start" number and no more bits than the specified "stop" number. Moreover, the bit length of the value field incrementally varies as a linear function of the specified "step parameter to define a linear progression of variable length codes. Therefore, the $n^{th}$ codeword of such a code comprises $n-1$ "1's" terminated by a single "0" (i. e., the unary field length indicator) followed by a value field of size $(start+(n-1)\cdot step)$. Integers are laid out sequentially through these different size codewords. For example, the four distinct length codewords of a <3, 2, 9> unary code map onto the integer counting numbers as follows:

| Codeword | Range |
|---|---|
| 0xxx | 0-7 |
| 10xxxxx | 8-39 |
| 110xxxxxxx | 40-167 |
| 111xxxxxxxxx | 168-679 |

As will be seen, the single "0" terminator for the unary field length indicator can be omitted when the bit length of the value field is equal to the given "stop" size. A simplified psuedo-code computational procedure for generating unary codes is set forth in Appendix B, which is hereby incorporated by reference, although it is to be understood that a table look-up procedure is a viable alternative for encoding unary codes. Furthermore, Appendix C also is incorporated by reference because it is a Cedar source code listing for a textual substitution data compression system which applies unary coding to literals and copies that are identified by decomposing the source data in accordance with the logical rules outlined above. It is to be understood,

| Name | Size (bits) | Codeword Layout | Indicator (binary) | Lengths Covered for Various Positions | | |
|---|---|---|---|---|---|---|
| | | | | [0 ... 256] | [256 ... 4k] | [4k ... 10k] |
| SC(short copy) | 12 | 2i.2l.8d | 00 | [2 ... 5] | | |
| CS(short/mid copy) | 16 | 2i.2l.12d | 01 | [6 ... 9] | [2 ... 5] | |
| CL(long/mid copy) | 16 | 3i.1l.12d | 100 | [10 ... 11] | [6 ... 7] | |
| L1 | 4 | 4i | 1010 | 1 | | |
| L(literal) | 6 | 4i.2l | 1011 | [2 ... 5] | | |
| LC(long copy) | 20 | 2i.4l.14d | 11 | [12 ... 23] | [8 ... 19] | [3 ... 14] |
| VLC(very LC) | 23 | 5i.4l.14d | 11110 | [24 ... 39] | [20 ... 35] | [15 ... 30] |
| VVLC | 27 | 6i.7l.14d | 111110 | [40 ... 135] | [36 ... 131] | [31 ... 126] |
| VVVLC | 30 | 8i.8l.14d | 11111011 | [136 ... 391] | [132 ... 387] | [127 ... 382] |
| LL(long literal) | 10 | 6i.4l | 111111 | [7 ... 22] | | |

However, in keeping with one of the more important features of this invention, it has been found that one of the more straightforward and effective techniques for generating statistically sensitive, variable length, literal and copy codewords is to provide a unary coder, such as shown at 91 in FIG. 10, for supplying linear progressions of <start, step, stop> unary codes for representing the lengths of the literals and the lengths and dishowever, that unary coding may be utilized for various types of run length or string length dependent data compression for capturing the length over which the compressible coherency exists (and/or the length over which the incompressible incoherency exists) and, in the case of a textual substitution style data compression system, the location at which the redundancy can be found. Even more generally, unary coding may be used in digital data compression system to provide variable length coding of numerical values, including run lengths, copy lengths, copy displacements, literal lengths, etc.

Figure 11:
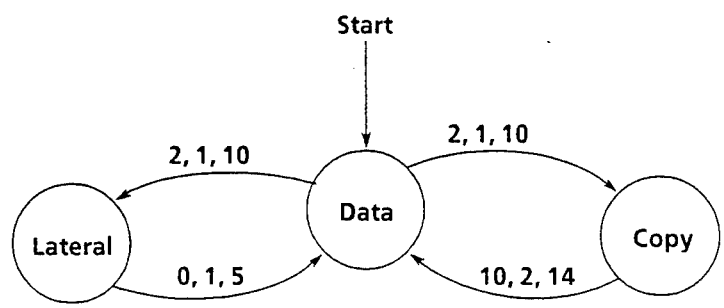
FIG. 11 is a finite state diagram for illustrating the operation of the unary coder shown in FIG. 10.

As will be appreciated, various factors may influence the selection of the <start, step, stop> unary codes for coding the literal lengths and the copy lengths and displacements of data compressed in accordance with the above-described encoding rules. For example, as illustrated by the simplified finite state machine (FSM) shown in FIG. 11, a <2, 1, 10> unary code may be employed for encoding copy length, thereby limiting the maximum permissible copy length to 2044 symbols. A copy length of zero signals a literal; the length of which is then encoded using a <0, 1, 5> unary code, so that maximum permissible literal length is 63 symbols. If, on the other hand, the copy length is non-zero, the copy displacement may be encoded with a <10, 2, 14> unary code to point to copies originating anywhere within a 21,504 symbol position wide search window. In practice the maximum copy and literal lengths typically are selected to avoid wasted states in the unary progressions. A similar technique is sometimes also used for avoiding wasted states in the unary coding of copy displacements.

The unary codes employed may also be refined (not shown) to avoid wasted states. For instance, the previously described rules for decomposing source data into literals and copies ensure that a literal of less than maximum permissible literal length is never immediately followed by either another literal or a copy of length two. Thus, whenever such a non-maximum length literal is encoded, the <2, 1, 10> code may be shifted down by two for the encoding of the copy which must follow such a literal, with the result that a code value of zero then means a copy length of three, a code value of one means a copy length of four, and so forth.

Another refinement that is of value during start-up is to phase in the copy displacement encoding as the search window is being filled. For example, such a phase-in may be realized by using a <10−x, 2, 14−x> unary code for copy displacements, where x is initially set equal to ten and is then decremented to zero when and as required to enable the displacement pointer to identify all window positions containing previously compressed symbols.

Still another technique that may be utilized to avoid wasted states in the copy displacement encoding is to shrink the largest field in its unary progression until it is just large enough to provide a family of "sparse" codewords for uniquely identifying each of the different displacement values that field is required to represent. Thus, if there are a total of v values to be encoded in the largest or "stop" size field of a <10−x, 2, 14−x> unary code, "sparse coding" of that field causes the smaller of those v values to be encoded with $\log_2 v$ bits and the larger of them to be encoded with $\log_2 v$ bits. As will be appreciated, such sparse coding avoids the need for using 14—x bits for encoding each of the v values, thereby reducing the bit size of the copy codewords with the largest displacement values.

To further illustrate this sparse coding technique, consider coding of one of six values. If a 3-bit field is used for coding the value, two of the eight possible states will be 2 wasted states. But, there are no wasted states if the values 0 and 1 are coded in 2 bits and the values [2 ... 5] in 3 bits as follows:

| Value | Code |
|-------|------|
| 0 | 00 |
| 1 | 01 |
| 2 | 100 |
| 3 | 101 |
| 4 | 110 |
| 5 | 111 |

Typical sparse encoding and decoding procedures are set forth below:

```
Encode: PROC[value, nFreeValues, nBits: CARDINAL]= {
IF value < nFreeValues THEN Output[value, nBits−1]
ELSE Output[value + nFreeValues, nBits];
};
Decode: PROC [nFreeValues, nBits: CARDINAL] RETURNS
[value: CARDINAL] = {
IF nFreeValues = 0 THEN value←Input[nBits]
ELSE {
value←Input[nBits−1];
IF value > = nFreeValues THEN value ← value + value −
nFreeValues + Input[1];
};
```

2. Faster Compressors

Figure 5:
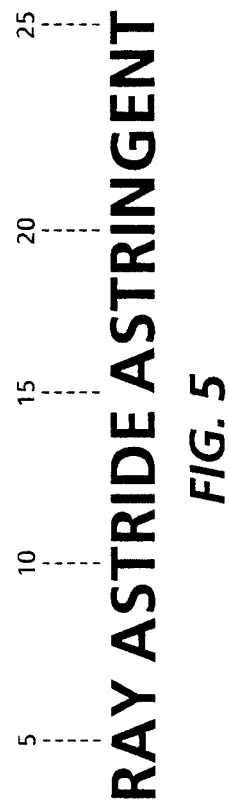
FIG. 5 illustrates the symbol-by-symbol parsing of a sample symbol string.
Figure 6A:
FIGS. 6A-6E diagrammatically illustrate the construction of a Trie search tree organized data structure.
Figure 6B:
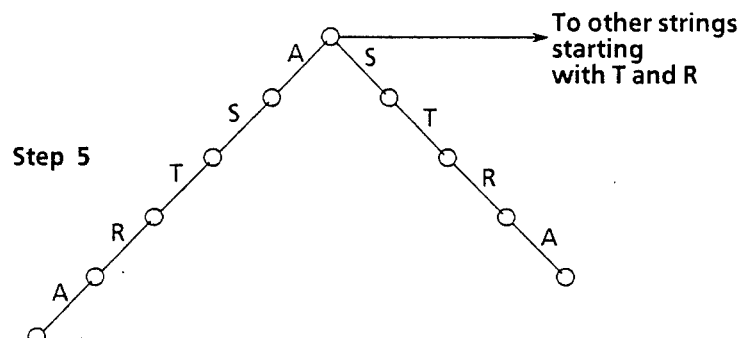
Figure 6C:
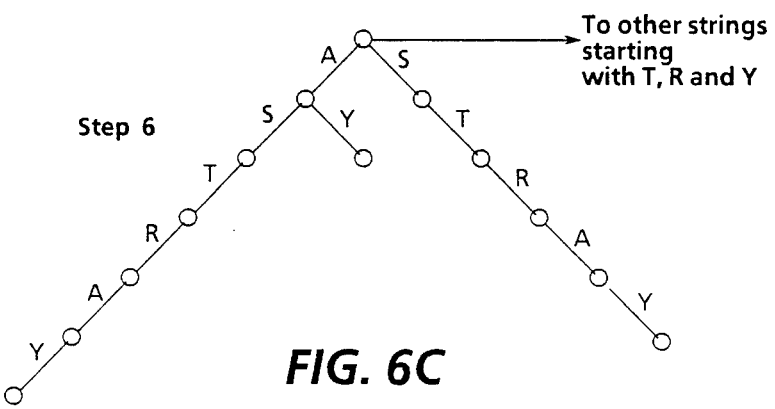
Figure 6D:
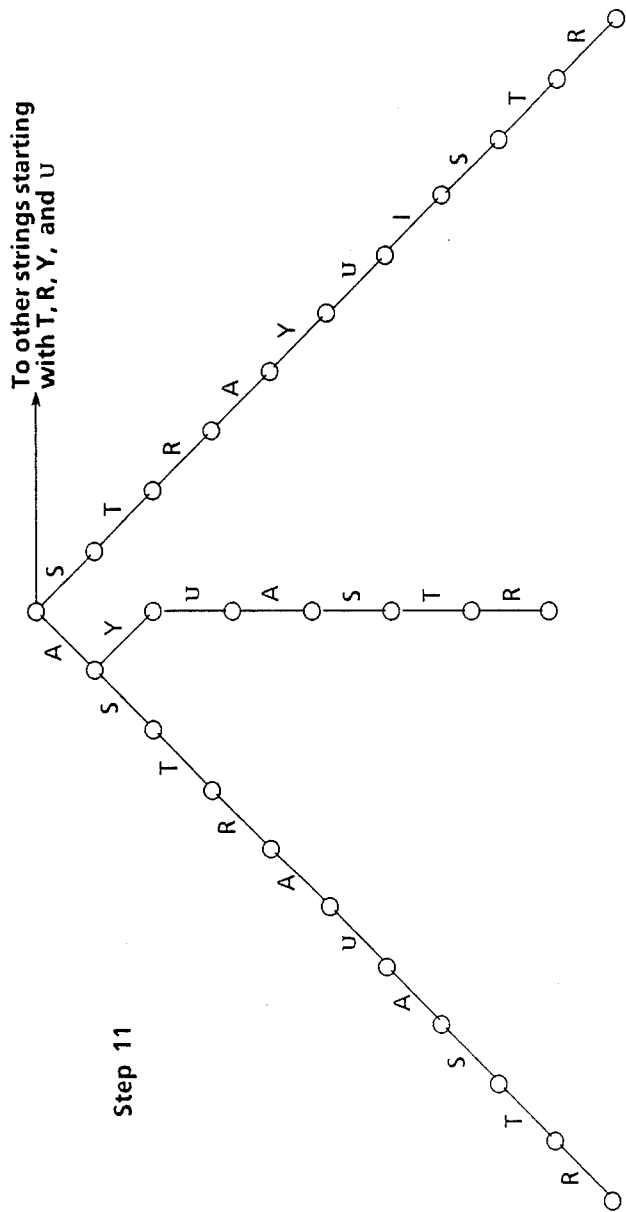
Figure 6E:
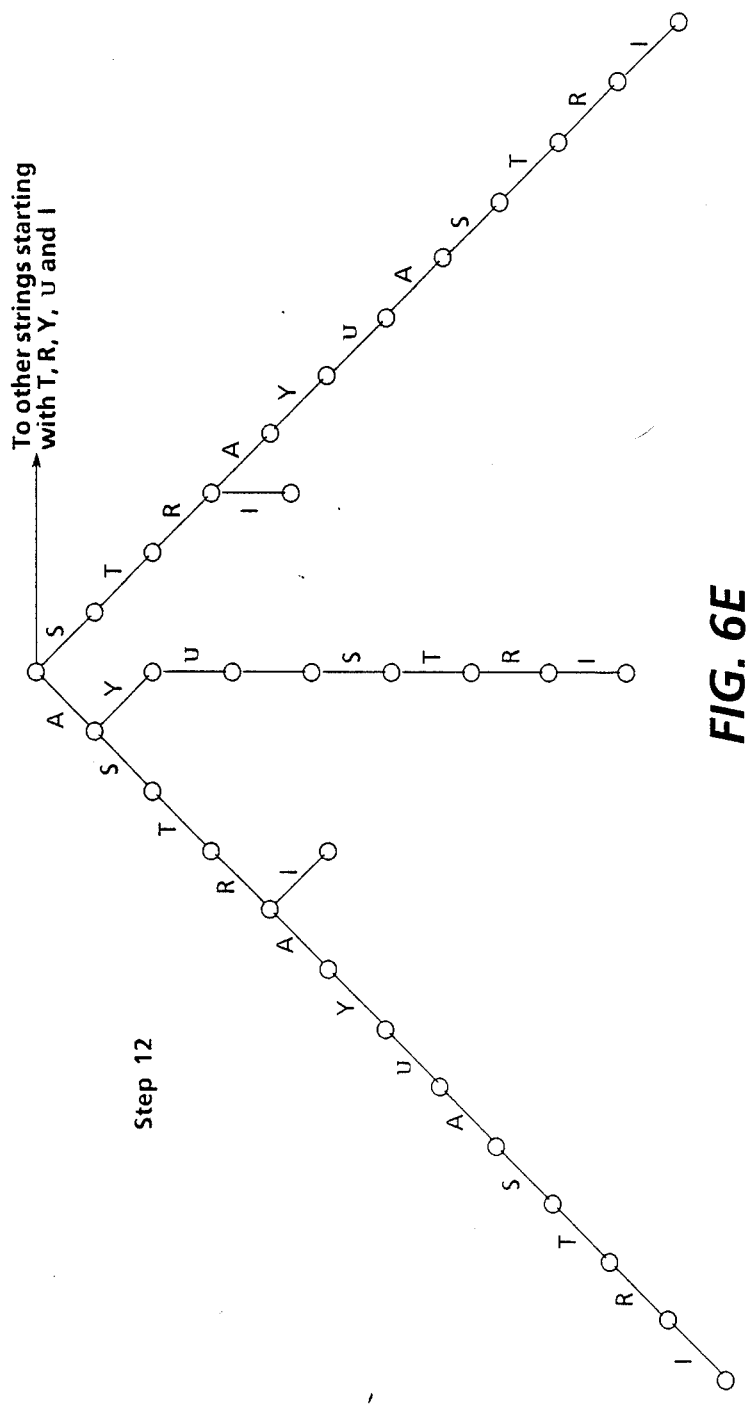
Figure 7E:
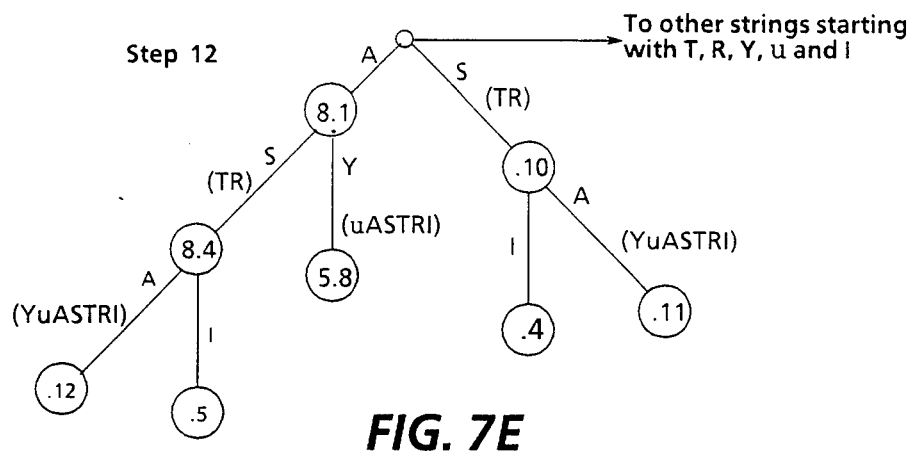

The foregoing compressors format the compressed data so that it can be expanded relatively rapidly by means of expanders which have limited storage capacity, such as the expander 63 (FIG. 5). Therefore, they are particularly well suited for applications in which compression speed is less important than simplifying the design and optimizing the performance of the expander, such as when it is desired to produce a mass release of software in compressed form on floppy disks for distribution to and expansion by the ultimate users, in addition, the foregoing compressors lend themselves to a natural and reasonably straightforward hardware implementation. For example, in a VLSI hardware embodiment, the search tree is eliminated and replaced by a number of comparators, which operate simultaneously on many characters in the search window to determine the longest match. Suitably, the symbols contained by the search window are stored on a semiconductor memory chip, so no external memory references are required while determining the longest match. Partly because no external memory references are required, this kind of compressor can run extremely fast and achieve excellent compression on a wide variety of data. In addition, because it fits on a single chip, it has advantages in applications where a "stand alone" data compression function is wanted, without any requirement for general purpose computing functions.

However, there are other situations in which faster software compressors may be preferred, such as when files are to be archived in compressed form. Thus, in keeping with still another feature of the present invention, the compression speeds of the above-described fixed length codeword and unary coded variable length codeword embodiments of the present invention can be increased significantly by restricting copies to begin on a boundary defined by the initial symbol of a prior copy or by a symbol that was previously inserted into the compressed data stream as a literal. Rather than having one leaf in the search tree 73 (FIG. 3) for each symbol in the search window as in the previously described compressors, these faster embodiments of the invention have only one leaf in the search tree 73 for each copy codeword and each literal. This reduces the computation required to search and update the tree 73, thereby significantly increasing the compression speed for average data. Matches originating at the second or subsequent symbols of a previous copy are ignored, so the "longest available match" may or may not be the longest match anywhere within the search window. It, therefore, will be evident that the increased compression speed provided by this approach is achieved at the cost of slowing the rate at which the system adapts to changes in the source data. In addition, for reasons which will become apparent, the complementary expander for these faster compressors is slowed somewhat and requires more storage.

One of the advantages of constraining all copies to originate on a prior copy or literal is that the position pointers for locating the prior occurrences of the reoccurring symbol strings can be compressed because they need only be able to identify the beginning of the $y^{the}$ previous codeword or literal character emitted. For example, "compressed displacements" can be implemented as follows: First, an array of storage elements of length equal to the window size is provided for storing pointers into the compressor input buffer. Each element of this array points to a different one of the copy codewords or literal characters issued by the compressor, so there is a one-to-one correspondence between leaves in the search tree 73 and elements in this array, and every interval node in the tree identifies the array element corresponding to one of its descedent leaves. Next, copy displacements are measured in terms of the number of array elements between the one corresponding to the leaf of the matched symbol string (i. e., the symbol string for which the copy is being substituted) and the array element corresponding to the leaf or internal arc upon which the longest match was found. In other words, copy displacements are measured in a "fixed length window" as in the previous embodiments, but the position in the character buffer of the lead symbol of a prior occurrence of a reoccurring symbol string is determined by going "indirectly" through this array of pointers, rather than by directly addressing the "search window" symbol positions. Thus, the size of the reference pointer array is fixed, but the length of the search window may expand and contract depending on composition of the recently compressed data. Copy lengths are still measured in symbols, so the preceding description of the measurement and encoding of copy lengths are applicable to these modified embodiments. Appendix D, which is hereby incorporated by reference, is a Cedar source code listing for a compression system based on the above-described compression rules in combination with compressed displacements and unary coding.

Symbol strings are inserted into the search trees 73 (FIG. 3) of these faster compressors by starting at the root of the tree on each iteration. The strings can be inserted in linear time because they are only inserted on existing codeword/literal character boundaries. Suffix pointers and propagating updates are unnecessary, so the search tree 73 (FIG. 3) for these embodiments preferably is a relatively simple PATRICIA tree (see FIGS. 7A-7E). It is to be noted, however, that it is useful to create an array of permanent nodes for all symbols at depth 1 of a PATRICIA-style search tree 73 for these embodiments. That can be done, even though the search window may not contain a symbol corresponding to each of these permanent nodes at all times, because a copy of length 1 is never issued. If such a permanent array of nodes is provided for the search tree 73, symbol strings may be inserted into the tree by indexing into the permanent node array based on the first symbol of the string that is being inserted. Thereafter, the insertion process typically relies on hash table look-ups and arc comparisons to descend deeper into the tree as previously described in connection with the use of PATRICIA-style search trees in general. Inasmuch as all nodes on the search path for any symbol string inserted into the tree are passed while the string is being inserted, the updated search window symbol positions for the symbols represented by those nodes can be written into the position fields of the nodes while descending down into the tree during the insertion process.

Constraining copies to originate with symbols that begin prior copy codewords or with symbols contained by prior literals reduces the ability of these modified compressors to capture the local coherence of the source data, but it permits the use of compressed pointers of relatively modes bit size for reaching relatively far back into the previously compressed source data, thereby making it feasible to use larger search windows to provide longer matches. This is advantageous for source data having a natural word structure, such as text. But, the foregoing constraint may be found to be undesirable for the compression of source data having a substantial amount of highly localized coherence, such as usually exists, for example, when the source represents a scanned image.

3. Additional Variations

Several variations on these schemes may be employed for updating the search tree 73 (FIG. 3) more frequently than on every prior copy/literal boundary. For example, a leaf could be added to the search tree 73 between the symbols represented by each length 2 copy codeword, and/or a leaf could be inserted into the search tree following the final symbol of every symbol string represented by a length 3 copy codeword. Indeed, any variation of inserting leaves into the tree intermediate the extremes represented by the foregoing compressors (in one of which a leaf is entered into the tree for every symbol, and in the other of which a leaf is entered once per copy codeword and once per literal character) is feasible within the general framework of this method. Some increased compression is likely to be achieved by using these and other techniques for increasing the ability of these faster compression systems to capture the local coherence of the source data, but their compression and expansion speeds would be reduced. There are also variations in which the tree is frozen at some point and not updated, so additional source symbols thereafter are encoded as copies and literals on the basis of the static data structure of the search tree, but the tree is not updated for the string just coded. In that event, the compression may fall off due to non-stationary statistics of the source data, but cycling of the tree can be resumed if need be. This approach might be used in applications where the highest speed is required, though it is likely to result in lower compression.

There also are variations on either of the two foregoing methods in which the window is primed or initialized with useful symbols, so that the compression of the earliest part of the source can be improved. While this is likely to improve compression when the source data resembles the priming data, it is slightly more complex and will worsen compression when the source data does not resemble the priming data.

In addition to variations on when strings are added to or removed from the search tree, there are variations on the data structures used in a software embodiment. In Appendix C we have used a suffix tree in which the arcs are inserted into a chained, circular has table. It will be appreciated that in a hardware embodiment, no tree is required, and only the window itself is central to the compression method. It will also be appreciated that in a software embodiment many other kinds of hash tables, lists, or other data structures could be used to implement a suffix tree. Furthermore, it will be appreciated that the suffix tree could be replaced by the simpler PATRICIA tree, though we believe that this implementation is not as good; or it could be replaced by a binary tree, sorted list, or other data structure. Such variations are also possible for Appendix C. All of these variations are within the capabilities of a person skilled in the art of programming.

Additionally, it will be appreciated that, while the implementations in Appendices A, C and D employ 8-bit symbols or characters, it is possible to implement equivalent compressors using other symbol sizes.

Still further, it will be understood that while the embodiments in Appendices A, C and D are "greedy" in the sense that their copy codewords always refer to the longest match found in the window, it is within the capabilities of a person skilled in the art to implement a variation in which a match shorter than the longest match is sometimes encoded, if it can be represented by a shorter codeword than the longest match. Such a variation is likely to be slower than the "greedy counterpart methods, but it may achieve slightly higher compression on average (and, in the worst case, it may achieve much higher compression).

Moreover, the two foregoing compressors employ particular policies for selecting between Copy and Literal codewords and for deciding at what point to terminate a Literal codeword in favor of a Copy. It will be appreciated that many other policies are possible and implementing any of these is within the capabilities of a person skilled in the art.

Finally, while the embodiment of Appendix C codes copy length and displacement independently using unary <start, step, stop> codes, it is possible to use variations where the unary or other encoding of copy length is dependent upon the already-encoded copy displacement or where the unary or other encoding of copy displacement is dependent upon the already-encoded copy length. Indeed, still other variations will suggest themselves, including the use of a single prefix code for determining the coding of both copy length and copy displacement (see the fixed length encoding discussed hereinabove). All of these variations are within the capabilities of a person skilled in the art of programming, and particular choices would be governed by simplicity of implementation and the statistical characteristics of representative source data samples.

4. Improving the Compression Ratio

The encoding of the compressed data by the above-described compressors is suboptimal because the compressed data may contain multiple encoded instances of identical symbol strings within the addressable span of the search window, even though only one instance of each symbol string is required to permit all necessary copies to be made. The search tree data structures do not, however, waste space because reoccurring symbol strings share common search paths within them.

Therefore, to improve the compression ratio, the encoding may be performed using copy codewords that are directly based on the search tree data structure, such as the structure of a PATRICIA tree (FIGS. 7A-7E). For example, a single bit prefix ("0" or "1") may be employed for distinguishing between copy codewords representing matches terminating on any of the leaves of such a tree (a LeafCopy) and matches terminating on internal arcs of the tree (a NodeCopy). Identical search trees are constructed in the compressor and expander, with the expander using the codewords it receives from the compressor to replicate the tree constructed by the compressor. As will be seen, each LeafCopy and NodeCopy codeword contains two elements of information for specifying the symbol string which it represents: a node or leaf and an arc displacement (the displacement is required because the arcs of a PATRICIA tree may represent more than one symbol). It is to be understood that strings appearing two or more times within the span of the search window appear as a single node arc, so they are compressed as NodeCopies with no redundancy in their encoding.

More particularly, when a NodeCopy is called for, its identifying prefix is followed by a node number referencing the next free node within a range [0 ... maxNodeNo], where maxNodeNo is the largest node number used since initialization of the compression system. Then, the arc displacement is encoded based on the number of symbols on the incoming arc. If, as is often the case, there is only a single symbol on the incoming arc, the displacement can be encoded inferentially by suppressing the length field. But, if the incoming arc represents a plurality of symbols, a length field is appended to the node number for recording a value indicating the location along the arc at which the match occurred. Typically, the recorded value is 0 for a match occurring exactly at the new node, 1 for a match occurring at a displacement of one symbol down from its parent node, 2 for a match occurring two symbols down from the parent node, etc. Suitably, a sparse code is employed for encoding the NodeCopy arc displacements so the length fields of these codewords are usually composed of only one or two bits.

On the other hand, when a LeafCopy is called for, its identifying prefix is followed by a <1,1,11> unary coded length field (such a unary progression can encode arc lengths of up to 4094 symbols long) for specifying the distance down the leaf arc from the parent node at which the match terminated (with an arc displacement of zero denoting a literal). Following the length field of a LeafCopy having a non-zero arc displacement value (i. e., one that does not denote a literal), the search window symbol position of the lead symbol of the matching symbol string is coded; preferably by gradually phasing in another suitable unary progression, such as the <10−x, 2, 14−x> progression described above.

Literals suitably are uniquely identified by employing a LeafCopy having an arc displacement of 0 as their introductory bit sequence or "flag." Those introductory flag bits are followed by a length field into which the length of the literal is encoded using still another <start, step, stop> unary progression, such as a <0,1,5> code. The encoding rules prohibit a literal of less than maximum permissible length from being immediately followed by another literal, so the unary codes for the arc displacement of a LeafCopy encoded immediately after such a literal, may be shifted down by one, such that an arc displacement of 1 is then coded as 0, a displacement of 2 is coded as 1, etc.

Node numbers for NodeCopies are encoded using a sparse encoding for the values [0 ... maxNodeNo], even though it might be desirable to manage them according to a least recently used (LRU) selection algorithm and to employ an encoding which reduces the number of bits required to identify the more recently used nodes. As will be appreciated, such a node management and encoding scheme could be implemented at the discretion of the designer.

As previously pointed out, to decompress the data, the expander for this embodiment must reconstruct and maintain a search tree which contains identical search paths to those of the compressor search tree during the compression/expansion of corresponding portions of the source data. Unlike the compressor, however, the codewords applied to the expander enable it to determine the length of each copy and to immediately locate the parent of any new nodes which are to be added to the tree. Thus, no hash table are required for inserting symbol strings into the tree at the expander, provided that the encoding policy is restricted so that a copy is always selected if the longest match spans two or more symbols. With this restriction on the encoding policy, the expander can reconstruct the tree by hanging each new leaf from the node or arc indicated by the particular NodeCopy or LeafCopy codeword that it has decoded. Moreover, in the case of a decoded literal, the expander can hang the leaf from the permanent depth or level 1 node for the literal symbol (as will be recalled, a permanent depth 1 node is advantageously provided for each source symbol).

E. Representative Functional Flow Diagrams

To supplement the foregoing description, representative functional flow diagrams are described hereinbelow. While these diagrams are simplified and are specific to certain embodiments, they will provide a general framework for persons interested in carrying out this invention in its various forms. In an invertible or lossless compression system, the expander necessarily complements the compressor, so the functional performance requirements of the expander. Some of the above-described compressors permit direct addressing of all symbols within the search window for locating prior occurrences of reoccurring symbol strings, while others locate such prior occurrences by indirect addressing of certain symbols within the search window (i. e., those which begin prior codewords or which have been previously emitted as literals) through the use of an array of pointers or by encoding the tree structure. The encoding and decoding of the tree structure for the compression and expansion of the source data is slightly more involved than the direct or indirect addressing of the search window contents, so tree structure encoding and decoding is featured in the following flow diagrams.

1. Locating and Extending a Matching Symbol String

Figure 12:
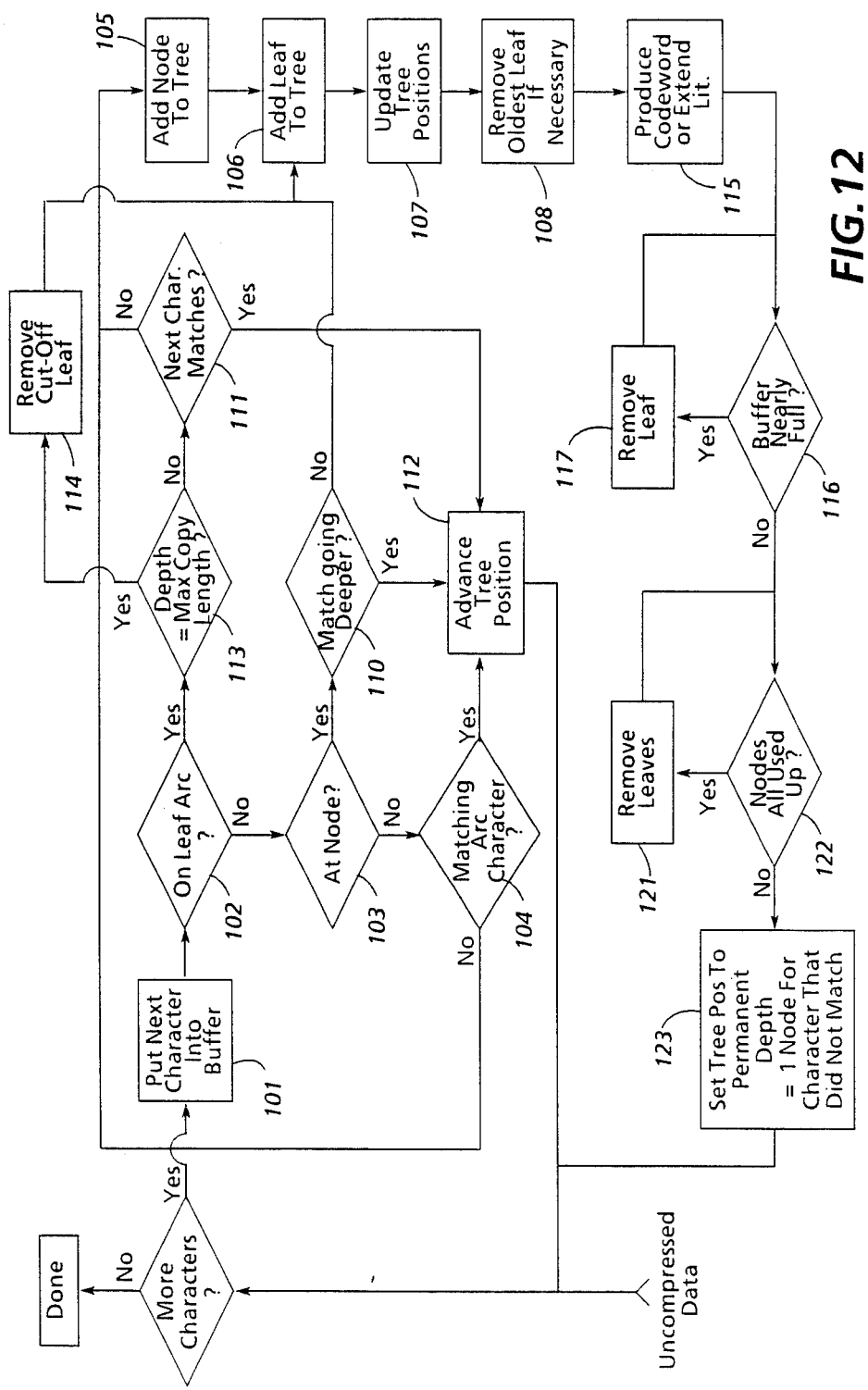
FIG. 12 is a simplified flow diagram for a textual substitution compressor using compressed displacements or having a tree structure encoder.

Referring to FIG. 12, all of the stream compressors utilize essentially the same process for maintaining their search trees 73 (FIG. 3) and for identifying prior occurrences of reoccurring symbol strings. As will be recalled file compressors "pull" source symbols from a file, rather than having the source symbols "pushed" at them, but otherwise they insert symbol strings into their search trees and maintain their search trees in generally the same way as their stream compressor counterparts.

The "stream" implementations of the present invention are designed to satisfy a standard "stream" I/O interface specification, so that they may be layered easily with other stream procedures, such as data encryption and decryption routines and data communication protocols.

Appendix E, which is hereby incorporated by reference, sets forth procedures required to provide the stream compression and expansion functions consistently with the aforementioned I/O specifications (which are beyond the scope of the present invention). When a compression software package is loaded by the operating system, it registers itself with a compression method registry (not shown), so that the procedures provided by the method can be accessed by clients (i. e., data sources and sinks requiring the services of the compression system). To carry out compression, a client first initializes the data structures needed by the compressor by means of a "CreateEncodingStream" procedure; an arugument to CreateEncodingStream is an output stream procedure to which codewords representing the source will be sent. Subsequently, the client submits blocks of characters for compression using a "CSUnsafePutBlock" procedure, or it submits single characters using a "CSPutChar" procedure. During the course of compressing a sequence of source symbols, the compressor accumulates codewords in its output buffer, but it will have other symbols represented in its internal data structures for which it has not yet produced codewords. Thus, if at any time the client wishes to force encoding of all symbols not yet represented by codewords, and to force all of these codewords to be sent to the output stream, then it calls a "CSFlush" procedure. CSUnsafePutBlock, CSPutChar, and CSFlush can be called repeatedly in any order. Finally, when the client has finished using the compressor and has issued a final CSFlush, it can release the storage that was in use by the compressor by calling a "CSClose" procedure.

Analogously, the expander has a "CreateDecodingStream" procedure for which an argument is the input stream from which codewords are to be obtained. It also has an "ESUnsafeGetBlock" procedure which can be called to obtain blocks of uncompressed or decoded source symbols and an "ESGetChar" procedure which can be called to obtain single uncompressed source symbols. Furthermore, the expander has an "ESClose" procedure that releases the storage it has used.

When this stream compression system is used to compress a file, CSFlush is used only once, at the end of the file. CSFlush normally produces either a PadCopy or a PadLiteral codeword, as will be discussed below; these codewords are the principal difference between stream and file compressors. Because these codewords are assigned a very low probability, the encoding used by the stream compressor is almost identical to that which would be used by an equivalent file compressor, and the compression achieved is almost identical. It will be understood that the principal advantage of a stream compressor is that it can be used in other applications besides file compression, as was discussed previously.

Turning now to the compressor's CSUnsafePutBlock procedure, diagrammed in FIG. 12, the search tree initially consists of the permanent depth 1 nodes, an empty window, and an empty input character buffer; and the depth of the current match is 0. As characters are submitted for compression by CSUnsafePutBlock or CSPutChar, the tree grows and the window fills until one of its three resources is exhausted; these resources are defined by size parameters maxCopyDisp (the number of leaves or window positions in the tree), maxNodes (the maximum number of nodes allowed in the tree), and oBufSize (the maximum size of the input character buffer). The values for maxNodes and oBufSize are normally chosen so that most source data will exhaust the maxCopyDisp leaves before exhausting either the nodes or the character buffer. In that event, the compressor will eventually reach a "steady-state" operating conditions in which, on each copy codeword or literal character, one leaf is freed and one leaf is allocated. For text and some other kinds of data, the degree of compression achieved on large sources will increase as maxCopyDisp increases. The exemplary implementation in Appendix E uses a window size of maxCopyDisp=16,384 positions, but it will be understood that this implementation is fully functional for values of maxCopyDisp between about 1000 and 63000.

At initialization of the compressor and after a CSFlush, the longest match depth is 0. However, following the execution of CSUnsafePutBlock or CSPutChar, the depth of the longest match is always greater than or equal to 1. When the next character is sent for compression, as at 101, the compressor first attempts to extend the current longest match to include this character, with the extended symbol string being inserted into the tree as indicated at 102, 103, 104, 111, 113, 110, and 112. The search path followed during the insertion of the extended symbol string is determined by the position of the current match in the tree. Specifically, (1) if the current match is on a leaf arc, the search path for the extended string is defined as at 102, 111, 113, and 112, (2) if the current match is exactly at a node, then the search path is determined as at 102, 103, 110, and 112, or (3) if the current match is on an internal arc of the tree, then the search path is identified as at 102, 103, 104, and 112.

When a match cannot be extended further on an internal arc of the search tree, as at 104, or on a leaf arc of the tree, as at 111, a node is taken from the free list and spliced into the tree at the point at which the match terminated, as at 105. The new leaf is then hung from this new node, as at 106. Or, if a match cannot be extended beyond an existing node, as at 110, then the new leaf is hung from the existing node, as at 106. A match also is terminated whenever it reaches the maximum permissible copy length or depth on a leaf arc, as at 113. Under those circumstances, however, there is no useful difference between the new string and the prior occurrence that resulted in the match, except for a temporal distinction and the resulting difference in their positions relative to the search window. Thus, the old cut-off leaf for the string is removed, as at 114, and the new leaf put in its place, as at 106. In those cases where a node is obtained from the free list, a check is made for the free list being empty, indicating that all nodes are in use. When this occurs, a new node is created and put on the free list, provided that the maximum node allocation determined by the "maxNodes" parameter has not been reached.

Finally, tree positions are updated, as at 107, beginning with the parent node for the new leaf and going upward in the tree until the permanent depth 1 node is reached. In this embodiment, all nodes are updated to the root, but it will be understood that a percolating update, such as described hereinabove, could be employed. Also, some embodiments could update node positions during descent into the tree.

At this point, the tree has been updated and correctly represents the new symbol string. The next steps are associated with encoding the string just represented in the tree and preparing to determine the next match. If the window is full, the oldest leaf is removed from the tree, as at 108, so that its storage can be reused for the leaf that will be created next time (this step is unnecessary if the compressor has not yet filled its window, or if that leaf has already been removed due to reaching cut-off depth as at 114, or if it has already been removed to make space in the buffer as at 117, or if it has already been removed because the number of nodes allocated for the tree was exhausted as at 121). Next, encoding is carried out, as in 115; this is more fully explained below and in FIG. 13.

After encoding, the compressor checks its output buffer, as at 116, to determine whether the buffer has sufficient free space to store a copy of length maximum permissible copy length (a worse case for the next codeword). if not, the oldest leaves are removed from the tree, as at 117, for freeing sufficient storage space in the buffer for such a copy plus an additional amount of storage, "oBufReserve" (see Appendix E). Inasmuch as each leaf represents one or more symbols in the buffer, freeing a leaf also frees buffer space. After checking the output buffer, the compressor checks, as at 122, to determine whether the node free list is empty (which implies that maxNodes nodes are presently being used in the tree). If so, it removes the oldest leaves from the tree by a batch removal process, "ToFree leaves" (which has a parameter value of 100). Deleting a leaf often causes a parent node having only one remaining son, so the abovedescribed node deletion or reclamation process can then be employed to reclaim that parent node and put it on the free list, but is to be noted this step is repeated until the node free list contains one or more free nodes. As will be appreciated, a somewhat simpler variation of the compresor might eliminate steps 121 and 122 of FIG. 12 by allocating a number of nodes greater than or equal to the worst case requirement for maxCopyDisp leaves. Indeed, this alternative is discussed as a comment in Appendix E and is employed in the implementations of Appendices C and D. However, the disadvantage of this alternative approach is that it the storage requirements of the compressor.

Finally, the character just submitted to the compressor, which did not extend the longest match, becomes the first character of a new match, as at 123. The tree position is set to be the permanent depth 1 node for this character, and the compressor then loops to accept another character.

It will be understood that FIG. 12 depicts either the compressor in Appendix E or the one in Appendix D; these two compressors differ in the encoding details concealed in the encoding function 115 which is explained hereinbelow. In addition, the compressor in Appendix D uses the simpler variation discussed hereinabove in which the node management steps 121 and 122 are eliminated by providing a number of nodes sufficient for the worst case requirement of "maxCopyDisp" leaves.

2. A Tree Structure Encoder

Figure 13:
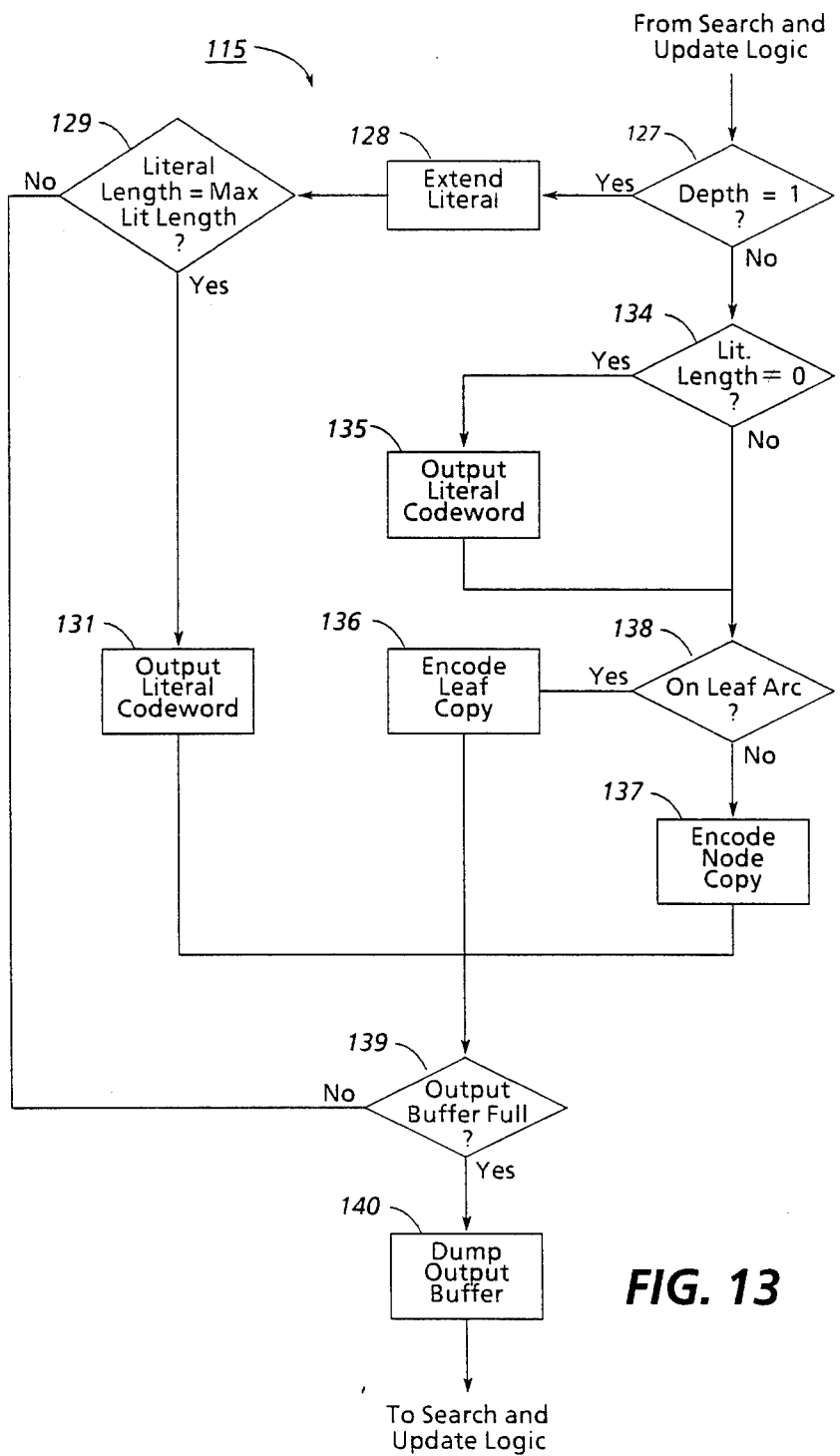
FIG. 13 is a simplified flow diagram of a tree structure encoder of the compressor shown in FIG. 12.

Step 105 in FIG. 12 represents the encoding section of the compressor; the tree-structured encoder of Appendix E is more fully diagrammed in FIG. 13. The job of the encoding section is to represent the source compactly by means of NodeCopy, LeafCopy, Literal, PadLiteral, and PadCopy codewords. The kind of codes used are advantageously prefix codes, which means that no codeword is a prefix of any other, so that the expander can unambiguously decode the stream of codewords.

For the embodiment in Appendix C, the encoding section s entered once per character, regardless of whether or not that character has already been represented by a copy codeword, so a character skip count is employed as in FIG. 3 step 78. This is used to count down through the characters already represented by a copy codeword until it is time to produce another codeword. However, the embodiments in appendices D and E do not require this skip count because the encoder for them is never entered again for characters already encoded.

The encoder first decides when the next character is going to be represented in a literal and when it is going to be represented in a copy. If the longest match is of length 1, then the character must be represented in a literal, but if the longest match is of length 2 or longer, then the policy can choose to represent it either in a literal or in a copy. The embodiments in Appendices C and D do not base this policy decision purely upon the length of the longest match; the reason for this is that the encoding of a Literal of length 1 requires 4 bits (plus the character), while a Literal of length 2 or 3 requires 6 bits (plus the characters); in other words, the "cost" of initiating a literal is 4 bits, while the extension from length 1 to length 2 costs only 2 bits, and the extension from length 2 to 3 costs 0 bits. Because these costs differ, the encoder advantageously is reluctant to initiate a literal, but once it has begun one, it is reluctant to terminate it in favor of a copy; in other words, there advantageously is "hysteresis" in the policy decision. These considerations led to the simple policy described hereinabove in which a copy of length 2 is preferred to a literal, but once the literal has been started, only a copy of length 3 (or reaching maximum literal length) can stop it. One can imagine other policies that achieve slightly higher compression at the cost of slightly greater complexity.

In the case of the tree structure encoder of Appendix E, however, another consideration comes into play; namely, it is desirable for the expander to be able to recreate the tree from the codewords it is decoding without resorting to has tables or other data structures like those of the compressor. To this end, it is advantageous to restrict the policy to always choose a copy when the longest match is of length 2 or longer, and to initiate or extend a literal only when the longest match is shorter; as a result of this restriction, the expander will always be able to hang the leaf for a literal character from the permanent depth 1 node corresponding to that literal character. As a result of this policy restriction, the expander is simpler, runs faster, and requires less storage, though it typically achieves slightly lower compression than would be the case if a more complex policy were followed.

Turning to FIG. 13, it will be evident that the encoding is dependent on the compression algorithm that is employed. However, in keeping with a common characteristic of all of the preferred compression algorithms, it is first determined, as at 127, whether a literal is being encoded or not. For the encoding of a literal, the length of the literal is extended, as at 128, during each interaction of the above-described insertion process, until there is a copy to be encoded or until a literal of maximum permissible literal length is assembled, as at 129. Whenever a literal reaches its maximum permissible length, a literal codeword, as at 131, is loaded into the output buffer immediately ahead of the literal symbols that have been accumulated. Likewise, when there is a copy to be encoded, the accumulated literal length count is checked, as at 134, to determine whether a literal is being accumulated. If so, a literal codeword, as at 135, and the accumulated literal symbols are loaded into the output buffer before the copy codeword (as will be recalled, the literal codeword and its appended literal source symbols may be loaded into the compressor output buffer anytime after the existence of the copy has been confirmed and before the codeword for the copy is loaded). Whenever, a literal is output, the accumulated literal symbol count at 134 is reset to zero so that another literal can be accumulated.

In this instance, copies are encoded using a LeafCopy 136 or a NodeCopy 137 depending on whether the copy terminates on a leaf arc or not, as determined at 138. The output buffer is checked, as at 139, after each literal and copy is loaded into it and is dumped, as at 140, when it is essentially full. The various details of the tree-structured encoding are described by comments in Appendix E; an additional description of the encoding appears in the discussion of the expander hereinbelow.

3. Byte Aligning the Encoder

Figure 14:
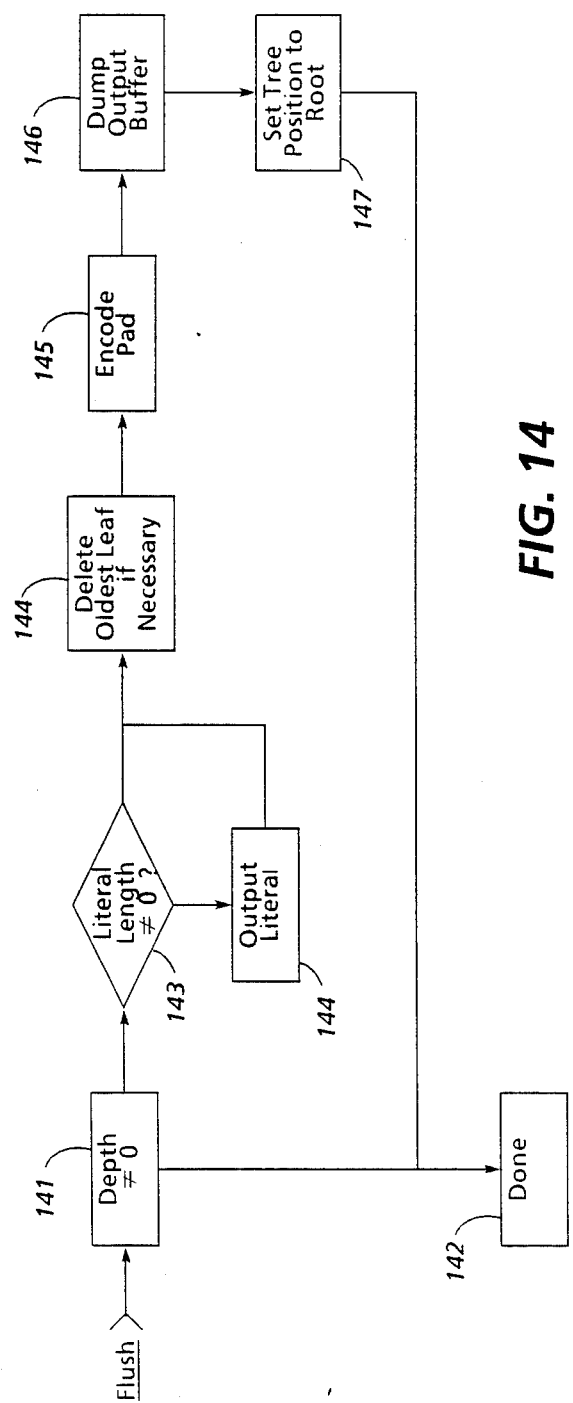
FIG. 14 is a simplified flow diagram of a flush and pad subroutine for word aligning the compressed output of the compressor shown in FIG. 12.

Referring to FIG. 14, a flush process is employed for outputting codewords for any partial literals and or copies remaining in the compressor when a flush command is issued. In a file compressor, such a command is issued only at the end of the file, at which time it usually is necessary to flush the last few symbols of the file out of the compressor, even though the compressor may not be prepared to output an ordinary copy or literal codeword, and where it may be necessary to terminate the preceeding string of bits so that they are no misinterpreted as being a codeword. For a stream compressor, the flush process might also be to used provide some additional compressed data for a receiver while the source data for the compressor is temporarily exhausted. In either type of compressor, flush restores the byte or word alignment of the compressed data (the Appendix E embodiment restores the alignment to a 16-bit boundary.

When a flush is initiated, normal operation of the compression is temporally suspended, and the depth at which its search tree 73 (FIG. 3) is prepared to insert the next symbol or character is checked, as at 141. If the tree is already set to its root, the flush is aborted, as at 142, and the compressor is promptly restored to normal operation. Otherwise, the accumulated literal count is checked, as at 143, and a literal codeword is output, as at 144, to accompany the accumulated symbols of any literal interrupted by the flush. After outputting any accumulated literal, the oldest leaf is removed from the tree, as at 144, if it has not already been deleted. However, the tree is not updated for th symbols encoded by the PD codeword because they do not define an unambiguous search path. Next, the flush is encoded, as at 145, using a PadLiteral codeword to accompany the one source symbol that is still in the compressor search tree if the tree is at a depth 1 node when the flush is initiated, or a PadCopy codeword to identify the search window symbol position and length of the interrupted copy if there are two or more source symbols still in the tree. The PadLiteral or PadCopy codeword is loaded into the compressor output buffer, and additional bits are added to it to align the output of the buffer at a convenient boundary, such as the next 16-bit boundary as in this particular example. Finally, the buffer is dumped, as at 146, and the search tree 73 (FIG. 3) is then reset to its root, as at 147 to prepare the compressor to receive more characters.

4. A Tree Structure Expander

In accordance with the Appendix E embodiment of the invention, a client initializes the expander by calling a "CreateDecodingStream" procedure, which has as an argument an input stream (or data source) from which codewords will be obtained. After initialization, the client makes repeated procedure calls to "ESUnsafeGetBlock", which reads a block of characters, and toe "ESGetChar", which reads single characters, to extract uncompressed or expanded symbols by successively decoding codewords from the input stream as directed by the client. "ESEndOf" can be used to check for the inability of the expansion stream to deliver more symbols. Because the implementation of "ESGetChar" simply calls "ESUnsafeGetBlock" with a symbol count of 1, the description here will be confined to the "ESUnsafeGetBlock" procedure, although it will be understood that a similar description would apply to the "ESGetChar" procedure.

Figure 15A:
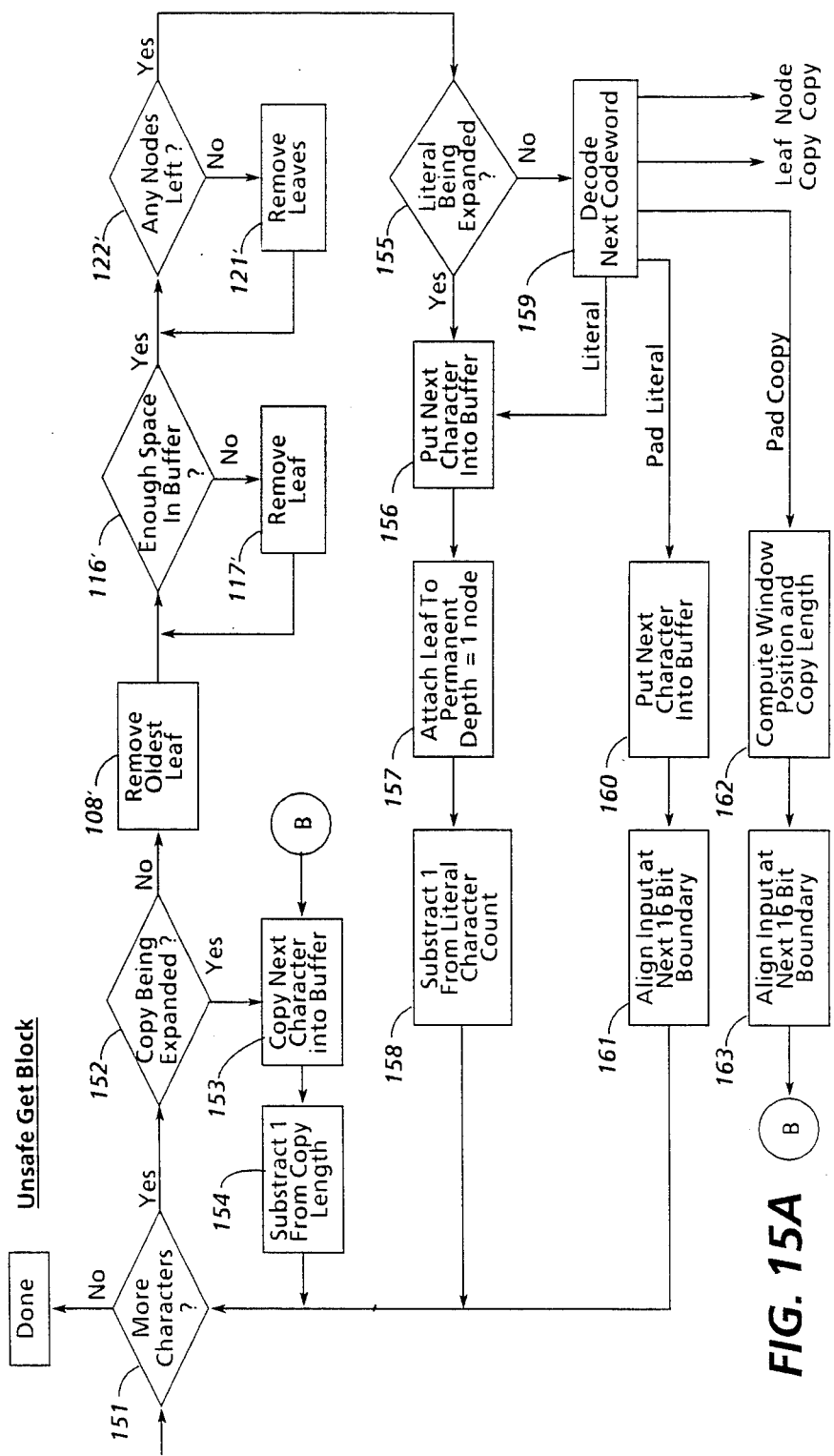
FIGS. 15A-15B combine to form a simplified flow diagram of an expander for the compressor shown in FIGS. 12-14.
Figure 15B:
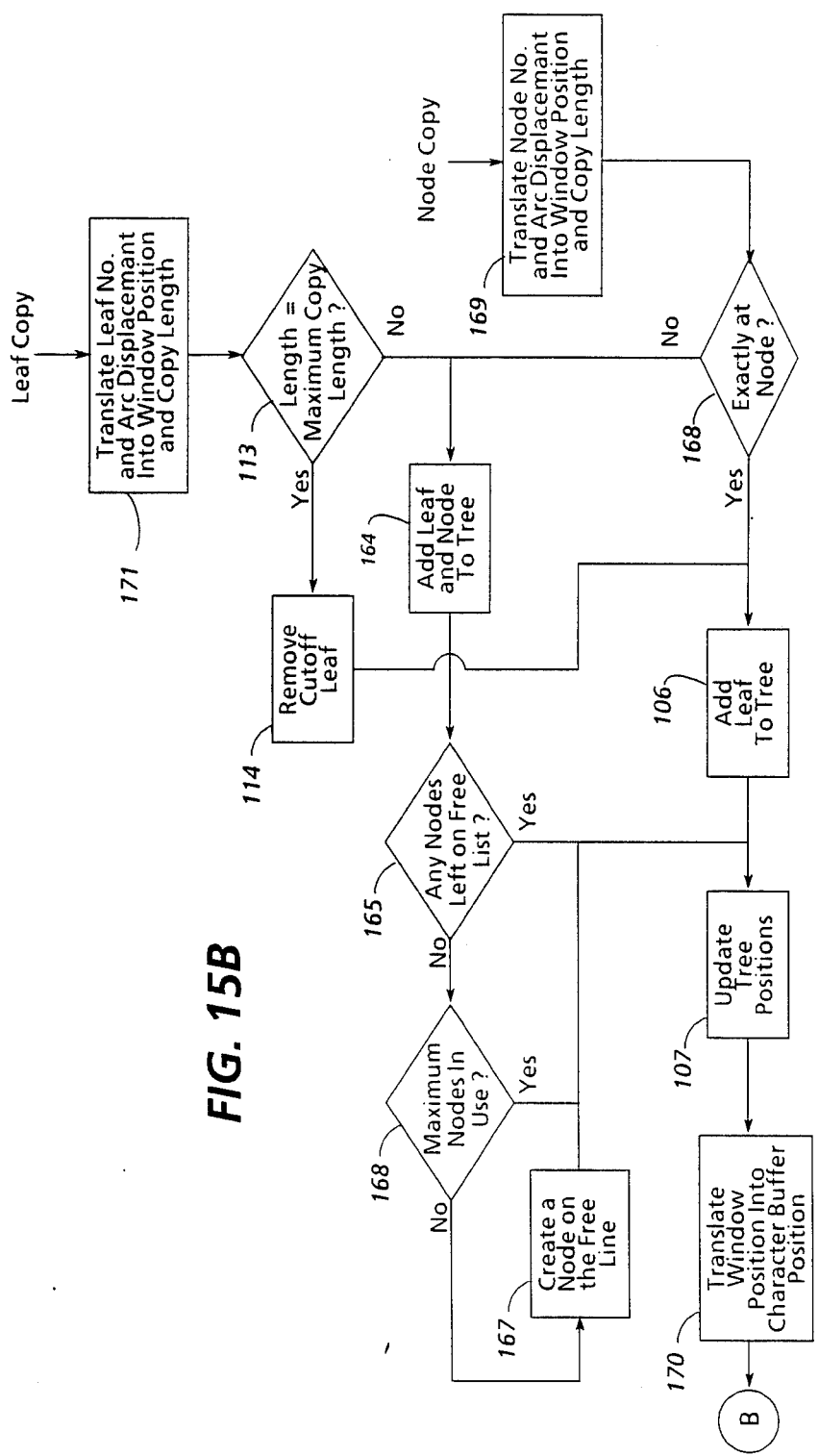

Turning to FIGS. 15A and 15B, it will be seen that the expander complements the compressor to faithfully recover the original source data. To the end, as was pointed out hereinabove, the expander's data structures are initialized exactly like the compressor's. Furthermore, whenever a codeword is decoded, the expander tree and search window are identical to the compressor tree at corresponding steps of the compression process. As will be understood, the steps taken by the expander to decode codewords are dictated completely by the encoding.

The expander of Appendix E has an Input subroutine for obtaining bits from its input stream. Whenever more bits are needed for another codeword or literal character, as at 156, 159, and 160, then this subroutine is called to obtain the bits. When the input stream is completely exhausted, an "EndOfStream" error flag is raised, thereby causing the "ESUnsafeGetBlock" procedure to return to its client with a character count smaller than that requested. That causes the client to terminate the expansion.

The expander has state variables which are the buffer position and residual length of the current copy being expanded, if any; or the residual length of the current literal being expanded, if any. When another character is requested, as at 151, "ESUnsafeGetBlock" first checks these variables to see if it can deliver the next symbol without decoding another codeword. If a Node-Copy, LeafCopy having a non-zero arc displacement), or PadCopy codeword is in the process of being expanded, the expander uses the steps indicated at 152, 153, and 154 to deliver the next character by copying it from another place in the character buffer. On the other hand, if a Literal codeword (i. e., a LeafCopy with a zero arc displacement) is in the process of being expanded, the expander uses the steps indicated at 152, 155, 156, 157, and 158 to expand the next literal character.

As will be seen, that the tree is updated on every literal character and on every copy codeword. Steps 108', 116', 117', 122', and 121' are associated with providing for leaves, nodes, and buffer space in exactly the same way as is described hereinabove in connection with the compressor. Likewise, steps 108', 116', 117', 122', and 121' cause a leaf to be attached, as at 157, to its permanent depth 1 node of the expander tree, exactly as was done by the compressor. Therefore, primed reference numerals corresponding to those that were employed for describing the compressor have been employed to identify the like steps of the expansion process, When the current copy or literal is exhausted, it is appropriate to decode the next codeword, as at 159. This will result in a new leaf being added to the tree, if the codeword is a NodeCopy or LeafCopy. Additionally, a leaf will also be added to the expander tree for the first character of each Literal. To prepare for these possible codewords, steps 108', 116', 117', 122', and 121' are again used to ensure that the resources required for the leaf are available and to ensure that the expander tree has the same configuration during decoding that the compressor tree had during encoding.

The decoder, as at 159, can easily distinguish one codeword from another because the encoding employs a family of codes known as "prefix codes," which means no codeword is a prefix of any other. Thus, there is only one possible interpretation of any sequence of bits. Specifically, in the encoding used by Appendix E, the first bit of the codewords distinguishes NodeCopy codewords from LeafCopy, Literal, PadCopy, and PadLiteral codewords. If this bit signals a NodeCopy, then the maximum node number in use determines the number of bits that will be read and decoded as a node number using the "sparse coding" technique discussed hereinabove. The node number, in turn, is used to reference the tree and to determine the length of the incoming arc to that particular node. Moreover, if the incoming arc to the specified node is longer than one symbol long, its symbol length determines the number of bits decoded as an arc displacement, again based on "sparse code" representation of the arc length. It is to be noted that the decoding of the node number requires the expander to use the same value for the maximum node number as the compressor and to have a tree in which the nodes are numbered and used inexactly the same way as the compressor.

Whenever the first bit processed by the decoder, as at 159, indicates that the codeword being decoded is not a NodeCopy, a $<1,1,12>$ unary code is decoded, except that the largest or stop-size field of the code (i. e., a unary codeword comprising "indicator" of 11 binary 1's (i.e., 11111111111), is reserved for "escaping" from the unary code to output a PadCopy or a PadLiteral codeword. If the decoded value of the $<1, 1, 12>$ unary code is 0, indicating a Literal, the decoder next decodes a $<0, 1, 5>$ unary code as the literal length to determine the number of literal source symbols that are appended to the Literal.

If the decoded value of the $<1, 1, 12>$ unary code is in the range [1 . . . 4094], it is interpreted as an arc displacement down a leaf arc from the node parent of that leaf arc. Thus, the compressed displacement is decoded based in this instance on a $<10-x, 2, 14-x>$ unary code and on the "sparse coding" of its largest or "stop" field, as discussed hereinabove for the encoder.

In the event that the arc displacement signifies a PadCopy or PadLiteral, the PadCopy length field is decoded using a $<1, 1, 12>$ unary code. If the decoded value of this field is zero, it means the codeword is a PadLiteral, which will be followed by a single literal character. Otherwise, after the PadCopy length is decoded, the relative displacement to the search window position of the first or lead symbol of the longest match is decoded using a <10−x, 2, 14−x> unary code with the sparse field improvement for the largest or "stop" field. All of these details conform to the encoding operations performed by the compressor described hereinabove.

When the decoder decodes, as at 159, a LeafCopy or PadCopy, it produces a compressed displacement which is the number of compressed positions (i.e., the number of copy codewords or literal characters) between the current window position and the one at which the longest match was found. The compressed displacement is translated into a compressed window position, or, equivalently, a leaf number, by subtracting the compressed displacement from the current window position modulo the window size. When the decoder decodes a NodeCopy, the compressed window position for the specified node is obtained from the node in the tree. In all of these cases, the compressed window position is translated into a character buffer position by reading the "cWindow" array entry for the compressed window position (see Appendix E); these translations are shown diagrammatically in FIG. 15B at 162 and 170.

No leaf is added to the expander tree in response to the decoding of a PadLiteral or a PadCopy codeword. The reasons a leaf is not added to the tree are specific to this particular embodiment of the compression system and are explained in a long comment preceding the "CSFlush procedure" in Appendix E. They are not, however, sufficiently relevant to the thrust of the invention to warrant further discussion. Indeed, persons skilled in the programming art will recognize that there are a variety of ways for implementing the Pad function. Nevertheless, the function is important so it is noted that the expander places the single symbol from a PadLiteral codeword into the character buffer, as at box 160, and then aligns the input stream at a 16-bit word boundary, as at 161, by skipping bits from the input stream up to the next 16-bit aligned position. Likewise, in response to a PadCopy, the expander translates the PadCopy compressed displacement into a character buffer position (as discussed hereinabove) and saves the PadCopy length, as at 162. It then aligns at a 16-bit boundary, just as for a PadLiteral, before completing the process by copying the symbols represented by the PadCopy into the buffer, as at 153 and 154.

When the decoder has decoded, as at 159, a LeafCopy, it next translates the compressed displacement into a leaf number or window position as discussed hereinabove. Then it follows the parent pointer from the indicated leaf in the tree to the node parent of that leaf (as will be understood, the depth of this node plus the arc displacement is the number of characters that will be copied). if it is determined, as at 113, that computed copy length is equal to the maximum permissible copy length, the cut-off leaf for the reoccurring symbol string is removed from the tree, as at 114' to be replaced by the new leaf, as at 106'. Again it will be seen these actions exactly correspond to equivalent actions within the compressor. If, as is normally the case, the maximum permissible copy length was not reached, then a leaf and node are added to the tree, as at 164. Steps 165, 166, and 167 are associated with gradually increasing the number of nodes in use until the maximum permissible number of nodes, "maxNodes", are in service (they provide a somewhat more detailed account of the function of step 105 in the compressor). After these node free list checks, which ensure that the node free list is not empty unless maxNodes nodes are in use, tree positions are updated, as at 107' exactly like in the compressor at 107, and the window position is translated into a character buffer position, as at 170, by reading the "cWindow" array, as discussed hereinabove. Finally, the first character of the LeafCopy is copied, as at 153 and 154.

When the decoder has decoded a NodeCopy, the depth and window position of the indicated node are obtained from the tree, as at 169. If the arc displacement is zero, as tested in 168, then the longest match terminated exactly at a node; in this case, the new leaf is hung from the indicated node, as at 106'. Otherwise, a new node is obtained from the free list and inserted into the tree at the indicated arc displacement from the parent of the indicated node, and the new leaf is hung from the new node, as at 164. The other actions are the same as for a LeafCopy, as indicated at 165, 166, 167, 107', 170, 153, and 154.

After a character has been delivered, the expander cycles back to step 151 and continues.

Conclusion

In view of the foregoing, it will be understood that the present invention provides encoding of variable length literal and copy codewords, using a variety of coding techniques, for a variety of textual substitution-style data compression systems. It will also be apparent that the encoding of literal codewords of varying length value may be employed in other types of data compression systems, such as to provide a "default" encoding for source symbols which the compression rules cause to remain in their raw, literal form.

APPENDIX A

*Compression Method A1 using a Suffix Tree with Percolated Update*
*This implementation of A1 is written in the Cedar language.*

*The implementation here is written for clarity and conciseness; it is slower and uses much more storage than our operational version. In particular, our operational version saves space by using different data structures for internal nodes and leaves and by placing the leaves in an array; the position, depth, sons, suffix, and update fields are eliminated from leaves. Also, circular collision lists eliminate one hash table link in each node and leaf.*

CompressImpl: CEDAR PROGRAM
= BEGIN

Node: TYPE = LONG POINTER TO NodeRec;
NodeRec: TYPE = RECORD [
    next, prev: Node ← NIL, --*Linkage for the hash table or the free list.*
    *The next 4 fields are for the standard suffix tree:*
    parent: Node ← NIL,
    position, depth: LONG CARDINAL ← 0,
    suffix: Node ← NIL,
    *The next 2 fields are for garbage collection, and percolated update:*
    sons: CARDINAL ← 2, --*for convenience this is always 2 on the free list*
    update: BOOLEAN ← FALSE
];

cutOff: CARDINAL = 16;

Compress: PUBLIC PROC [fromFileName, toFileName: Rope.ROPE] RETURNS [success: BOOLEAN ← TRUE, fromSize, toSize: LONG CARDINAL ← 0, ratio: REAL, errorMsg: Rope.ROPE ← NIL] ~ TRUSTED {
    root, previous, scan, parent, oldParent: Node;
    index, depth: LONG CARDINAL ← 0;

*Variables, Buffers, and Procedures for Input* fromFile: IO.STREAM ← FS.StreamOpen[fileName: fromFileName, streamOptions: options];
    fromBuffer: REF ARRAY [0..8192) OF CARDINAL ← NEW[ARRAY [0..8192) OF CARDINAL];

*The input is maintained in a 8K buffer of 4 quadrants of 2K each. In order to be able to mark the end of the file with 256, the input characters are stored in CARDINALs, so many of the procedures below use CARDINAL input when the reader would expect CHAR.*

QuadrantCheck: PROC [raw: LONG CARDINAL] RETURNS [BOOLEAN]
    *Return TRUE if raw = 0 MOD 2K (i.e. if raw is on a quadrant boundary)*
    *(Code omitted)*

QuadrantLoad: PROC []
    *Load 2K characters from fromFile into the next free quadrant of fromBuffer.*
    *If fromFile is exhausted then mark the end with a special character (256).*
    *(Code omitted)*

*Variables and Procedures for Output*

```
toFile: IO.STREAM ← FS.StreamOpen[toFileName, $create];

currentLiteralSize: CARDINAL ← 0;

OutputLiteral: PROC [position: LONG CARDINAL]
```
*Flush the current literal that starts at "position" in the input.*
```
~ TRUSTED INLINE {
    toSize ← toSize + currentLiteralSize + 1;
    toFile.PutChar[VAL[currentLiteralSize - 1]];  -- encode the length of the literal in the 4 low
        order bits
    FOR i: CARDINAL IN [0..currentLiteralSize) DO  -- copy the literal characters into the output
        toFile.PutChar[VAL[fromBuffer[Mod8K[position + i]]]];
        ENDLOOP;
    currentLiteralSize ← 0;
    };

mark: LONG CARDINAL; doubleCode: CARDINAL;
copy: CARDINAL ← 0;
```

*Hash Table for Arcs, and Procedures for inserting, removing, and finding Arcs*

```
table: REF ARRAY [0..8196) OF Node ← NEW[ARRAY [0..8196) OF Node ← ALL[NIL]];
```

*The following procedures implement a standard hash table with doubly linked collision lists.*
*The lists are linked with the "next" and "prev" fields of the nodes.*

FetchArc: PROCEDURE [p: Node, c: CARDINAL] RETURNS [son: Node]
*Hashing is based on the parent node (p) and the first character (c) on the interconnecting arc.*
*NIL is returned if the son is not found.*
*(Code omitted)*

NewArc: PROC [n: Node]
*Insert n in the hash table. The hash is based on n, using the parent (n.parent) and the character*
*on the arc (fromBuffer[n.position + n.parent.depth]), as above.*
*(Code omitted)*

RemoveArc: PROC [n: Node]
*(Code omitted)*

ReplaceArc: PROC [old, new: Node]
*(Code omitted)*

*Window is used to delete portions of the suffix tree older than 4K positions.*
```
    window: REF ARRAY [0..4096) OF Node ← NEW[ARRAY [0..4096) OF Node ← ALL[NIL]];
```

*Code to maintain a free list of suffix tree nodes*
   *(Initial allocation of virtual memory is omitted)* freeListFront: Node
   freeListRear: Node

NewNode: PROC [index, depth: LONG CARDINAL] RETURNS [new: Node] ~ TRUSTED {
   new ← freeListFront;
   freeListFront ← freeListFront.next;
   new.position ← index; new.depth ← depth;
   };

Clean: PROC [n: Node] ~ TRUSTED INLINE {
*It is important that free nodes are added to the end of the list, since the suffix field of the last freed node is sometimes smashed in the next iteration. (See, for example, figure 3. If leaf kappa is collected, leading to the collection of alpha, then on the following iteration, when we have found delta, we will go back and try to patch the pointer in the collected alpha.) The free list has at least one extra node.*
   freeListRear.next ← n;
   freeListRear ← n;
   };

*Code to insert new nodes in the suffix tree.*

Break: PROC [index, depth: LONG CARDINAL, previous, scan: Node] RETURNS [created: Node]
*Break the arc in the suffix tree from "previous" to "scan," and insert a new node "created" between the two nodes.*
~ TRUSTED INLINE {
   created ← NewNode[index, depth];
   created.parent ← previous;
   ReplaceArc[scan; created];
   scan.parent ← created;
   NewArc[scan];
   };

Patch: PROC [index: LONG CARDINAL, previous: Node]
*Add a new leaf to the suffix tree, hanging it from the "previous" node.*
~ TRUSTED {
   leaf: Node ← NewNode[index, LAST[LONG CARDINAL]];
   replaced: Node ← window[Mod4K[index]]; -- *this is 4K iterations old, it will be replaced.*
   otherSon: Node;

window[Mod4K[index]] ← leaf;
   leaf.parent ← previous;
   NewArc[leaf];

*Now garbage collect "replaced." In case the new leaf and "replaced" share the same parent, we have carefully postponed the garbage collection of "replaced" so that it is after the insertion of the new leaf.*
   IF replaced # NIL THEN
      BEGIN
      RemoveArc[replaced];
      IF replaced.parent.sons = 2 THEN -- *"parent" should also be garbage collected.*
         BEGIN

```
        IF replaced.parent.update THEN PropagateUpdate[replaced.parent.position,
            replaced.parent];
        otherSon ← FetchArc[replaced.parent, fromBuffer[Mod8K[replaced.parent.position
            + replaced.parent.depth]]];
        RemoveArc[otherSon];
        otherSon.parent ← replaced.parent.parent;
        ReplaceArc[replaced.parent, otherSon];
        Clean[replaced.parent];
        END
    ELSE replaced.parent.sons ← replaced.parent.sons - 1;
    Clean[replaced];
    END;
};
```

*This procedure propagates an update toward the root of the suffix tree as far as the "update" flags in the nodes are TRUE. On the average, the propagation distance will be constant, but it can be as bad as O(n).*

```
PropagateUpdate: PROC [index: LONG CARDINAL, scan: Node] ~ TRUSTED INLINE {
    UNTIL (scan.update ← NOT scan.update) DO
        scan ← scan.parent;
        Now pick up the most recent index:
        IF scan.position < index THEN scan.position ← index ELSE index ← scan.position;
    ENDLOOP;
};
```

*Main Program*

IF fromFile.EndOf[] THEN --*No compression is necessary, clean up and quit. (Code omitted)*

*Load as many tree nodes as could ever be needed (8K + epsilon) into the free list*
*(Code omitted)*

*Load 1/4 of the input buffer*
QuadrantLoad[];

*Initialize the Suffix Tree with two nodes: a root, and a leaf for position 0 in the input*
root ← NewNode[0, 0];
root.suffix ← root.parent ← root;
root.sons ← LAST[CARDINAL]/2;    --*Make sure the root never gets garbage collected* previous ← oldParent ← root;
*The main loop is executed until the input is empty:*
WHILE index < fromSize DO
    IF QuadrantCheck[index] THEN QuadrantLoad[];
    *Use the suffix link to move sideways in the tree in preparation for the next insertion:*
    scan ← previous.suffix;
    IF depth > 0 THEN depth ← depth - 1;
    *Rescan (don't bother to check the strings on the interior of arcs):*
    UNTIL scan.depth >= depth DO
        previous ← scan;

```
            scan ← FetchArc[scan, fromBuffer[Mod8K[index + scan.depth]]];
        ENDLOOP;
    IF scan.depth > depth AND (depth # cutOff - 1) THEN -- Scanning is unnecessary.
        {mark ← scan.position;  -- Mark the longest match.
        Fix the suffix link in the previous iteration.
            oldParent ← (oldParent.suffix ← parent ← Break[index, depth, previous, scan]);
        }
    ELSE -- Scan (strings must be checked on the interior of arcs)
        BEGIN
            oldParent.suffix ← scan;  -- Fix the suffix link in the previous iteration.
            DO
                IF depth = scan.depth THEN -- We have finished traversing an arc, get the next arc:
                    BEGIN
                    previous ← scan;
                    mark ← previous.position;
                    IF (scan ← FetchArc[scan, fromBuffer[Mod8K[index + depth]]]) = NIL THEN
                    The match ends precisely at a node. There is no need to break an arc.
                        { parent ← oldParent ← previous; parent.sons ← parent.sons + 1; EXIT };
                    END
                ELSE -- Check the characters on the interior of the current arc:
                IF fromBuffer[Mod8K[index + depth]] # fromBuffer[Mod8K[scan.position + depth]]
                    THEN -- Mismatch on an arc. The arc must be broken:
                    BEGIN
                    mark ← scan.position;  --Mark the longest match.
                    parent ← oldParent ← Break[index, depth, previous, scan];
                    EXIT;
                    END;
                depth ← depth + 1;
                IF depth = cutOff THEN
                    The new leaf arc replaces the one on which depth = cutOff is reached (Removal is
                        necessary to prevent pathological timing on hash table lookup.)
                    BEGIN
                    mark ← scan.position;
                    oldParent ← scan;  --So writing oldParent.suffix next time is a no-op
                    parent ← previous ← scan.parent;
                    RemoveArc[scan]; window[Mod4K[mark]] ← NIL; Clean[scan];
                    EXIT;
                    END;
            ENDLOOP;
        END;
previous.position ← index;
PropagateUpdate[index, previous];
Patch[index, parent];  -- Hang the new leaf from the parent.

Now that the longest match is found, do the encoding.
IF copy > 0 THEN -- A copy is in progress, let it finish.
    copy ← copy - 1
ELSE
IF (currentLiteralSize = 0 AND (depth >= 2)) OR (depth >= 3) THEN
The policy is to accept copies if they are of length 3 or greater, and if a literal is not already in
    progress, to accept copies of length 2.
```

```
BEGIN
    IF currentLiteralSize > 0 THEN
        OutputLiteral[index - currentLiteralSize];  -- Output the interrupted literal.
    toSize ← toSize + 2;
    copy ← LowHalf[MIN[16, depth]];
    doubleCode ← BITOR[  --Encode a copy command with:
        BITSHIFT[copy - 1, 12],   -- length in the 4 high order bits,
        LowHalf[index - mark - 1]  -- pointer in the 12 low order bits.
        ];
    toFile.PutChar[VAL[doubleCode / 400B]];
    toFile.PutChar[VAL[doubleCode MOD 400B]];
    copy ← copy - 1;
    END
ELSE  --Continue the literal.
    BEGIN
    IF currentLiteralSize < 16 THEN currentLiteralSize ← currentLiteralSize + 1;
    IF currentLiteralSize = 16 THEN OutputLiteral[index + 1 - currentLiteralSize];
    END;
index ← index + 1;
ENDLOOP;
IF currentLiteralSize > 0 THEN OutputLiteral[index - currentLiteralSize];
ratio ← toSize * 1.0 / fromSize;
toFile.Close[];
};
```

*Expansion of Compressed Files*

```
Expand: PUBLIC PROC [fromFileName, toFileName: Rope.ROPE] RETURNS [success: BOOLEAN ←
    TRUE, fromSize, toSize: LONG CARDINAL ← 0, ratio: REAL, errorMsg: Rope.ROPE ← NIL] ~ {
    toFile: IO.STREAM ← FS.StreamOpen[toFileName, $create];
    fromFile: IO.STREAM ← FS.StreamOpen[fromFileName];

toBuffer: REF ARRAY [0..4096) OF CHAR ← NEW[ARRAY [0..4096) OF CHAR];
    mark: LONG CARDINAL;
    size, code: CARDINAL;
    c: CHAR;

UNTIL fromFile.EndOf[] DO
        c ← fromFile.GetChar[];
        code ← ORD[c];
        size ← BITSHIFT[code, -4];  -- isolate the 4 high order bits of the code in "size."
        IF size = 0 THEN  -- this is a literal command.
            BEGIN  -- use the 4 low order bits of the code to determine the length of the literal.
            FOR i: CARDINAL IN [1..code+1] DO  -- pass the input directly into the output.
                c ← fromFile.GetChar[];
                toBuffer[Mod4K[toSize]] ← c; toFile.PutChar[c];
                toSize ← toSize + 1;
                ENDLOOP;
            fromSize ← fromSize + code + 2;
            END
```

```
    ELSE -- this is a copy command.
        BEGIN
            c ← fromFile.GetChar[];
            fromSize ← fromSize + 2;
            mark ← toSize - GlueTogether[code, ORD[c]] - 1; -- (GlueTogether produces a 12 bit
            pointer from the 4 low order bits of code and the 8 bits of c)
            FOR i: CARDINAL IN [0..size] DO
                Go back to the position designated by "mark" and copy size+1 characters forward to
                    the current position.
                c ← toBuffer[Mod4K[mark]];
                mark ← mark + 1;
                toBuffer[Mod4K[toSize]] ← c; toFile.PutChar[c];
                toSize ← toSize + 1;
            ENDLOOP;
        END;
    ENDLOOP;

fromFile.Close[]; toFile.Close[];
    ratio ← IF fromSize > 0 THEN toSize * 1.0 / fromSize ELSE -1.0;
    };
END.
```

Appendix B

*Computing a Unary-Based Variable Length Encoding of the Integers*

*In Section 5 we defined a (start, step, stop) unary code of the integers as a string of n ones followed by a zero followed by a field of j bits, where j is in the arithmetic progression defined by (start, step, stop). This can be defined precisely by the following encoder:*

```
EncodeVar: PROC [out: CARDINAL, start, step, last: CARDINAL] ~ {
    UNTIL out < Power2[start] DO
        PutBits[1, 1];
        out ← out - Power2[start];
        start ← start + step;
    ENDLOOP;
    IF start < last THEN PutBits[out, start + 1]  -- 0 followed by field of size "start"
    ELSE IF start > last THEN ERROR
    ELSE PutBits[out, start];  -- save a bit
    };

PutBits: PROC [out: CARD, bits: INTEGER] ~
    Output the binary encoding of "out" in a field of size "bits."
```

*Notice that the encoder is able to save one bit in the last field size of the arithmetic progression.*

Appendix C

*A2Impl.mesa*
   *Copyright © 1985, 1986, 1987, 1988 by Xerox Corporation. All rights reserved.*

*This program implements a stream version of the A2 data compression method developed by Dan Greene and Ed Fiala. It has maxCopyDisp positions; since CARDINALs hold positions, the implementation limit is about maxCopyDisp = 65536 - 2 \* maxCopyLength - 10. To produce the standard compressor at different window sizes, only the maxCopyDisp and methodName parameters are edited together with the two instances of the A2Impl program name. To produce the update-to-root variation, replace the normal first statement in the short update DO loop with the commented-out statement next to it.*

*A compression stream implements CreateEncodeStream and the IO.STREAM functions PutChar, UnsafePutBlock, Flush, and Close: data presented is encoded and written on the output stream. The compressor buffers its output until codewords representing oBufReserve ( = 1024) or more source characters have accumulated: then it dumps the buffer using UnsafePutBlock[outStream]. IO.Flush produces a Pad codeword that represents all characters presented to the compressor and aligns output at a 16-bit boundary: then it dumps the output buffer using UnsafePutBlock[outStream]. IO.Flush must be issued before doing IO.Close or the final characters presented to the compression stream will not be represented by a codeword: IO.Close releases the storage used during compression. IO.Flush on the compression stream does NOT flush outStream: clients must do that operation separately, if it is needed.*

*An expansion stream implements CreateDecodeStream and the IO.STREAM functions EndOf, GetChar, UnsafeGetBlock, and Close. In response to GetChar or UnsafeGetBlock, an expansion stream obtains input using UnsafeGetBlock and delivers the decoded data.*

```
DIRECTORY
    Basics USING [BITAND, BITSHIFT, bitsPerWord, BITOR, BITXOR, bytesPerWord, LongDiv,
            LongNumber, RawBytes, UnsafeBlock],
    CodeControl USING [CreateEncoderProc, CreateDecoderProc, BadCodingMethod,
        RegisterCodingMethod],
    CountedVM USING [Allocate, Free, Handle],
    IO,
    PrincOpsUtils USING [LongCopy],
    Rope USING [ROPE];
```

A2Impl: CEDAR PROGRAM
   IMPORTS Basics, CodeControl, CountedVM, IO, PrincOpsUtils
   = {

```
lpSize: CARDINAL = SIZE[LONG POINTER];
lcSize: CARDINAL = SIZE[CARD32];
LongNumber: TYPE = Basics.LongNumber;
bytesPerWord: CARDINAL = Basics.bytesPerWord;
bitsPerWord: CARDINAL = Basics.bitsPerWord;
BITSHIFT: PROC [value: WORD, count: INTEGER] RETURNS [WORD] = Basics.BITSHIFT;
BITAND: PROC [WORD, WORD] RETURNS [WORD] = Basics.BITAND;
BITOR: PROC [WORD, WORD] RETURNS [WORD] = Basics.BITOR;
BITXOR: PROC [WORD, WORD] RETURNS [WORD] = Basics.BITXOR;
```

LowHalf: PROC [n: CARD32] RETURNS [CARD16] = INLINE { RETURN[LOOPHOLE[n, LongNumber].lo] };

HighHalf: PROC [n: CARD32] RETURNS [CARD16] = INLINE { RETURN[LOOPHOLE[n, LongNumber].hi] };

LowAddr: PROC [raw: LONG POINTER] RETURNS [refined: CARDINAL] ~ INLINE { RETURN[LOOPHOLE[raw, LongNumber].lo] };

BugTrap: SIGNAL = CODE; --*For debugging* indexType: TYPE = CARDINAL;

*The encoding is determined by a progression in which 7/8 of all codewords are Copies and 1/8 are Literals: however, following a literal < maxLitLength long, all codewords are Copies. One important difference between this stream compressor and the similar A2 file compressor is the use of Pad codewords to 16-bit align output when an IO.Flush is issued. (A Pad encodes a one-character Literal or a [2..maxCopyLength] long Copy followed by padding to a 16-bit boundary.)*

*All codewords begin with a len field that is 0 for a Literal or depth - 1 for a Copy; this field is encoded with EncodeVar[h, L - 1, lenStart, lenStep, lenLast]. For literals, length is then encoded with EncodeVar[h, litLen - 1, litStart, litStep, litLast] followed by the literal characters; or copy position is encoded with EncodeSVar[h, relpos, dispStart, dispStep, dispLast, index]. len begins with 0.LL. where LL = 0 is used for literals and LL = [1..3] for copy lengths [2..4]; subsequent fields have 3, 4, 5, ..., 10 bits; maxCopyLength = 2044. Following a literal of length < maxLitLength, neither a depth = 2 copy nor another literal is possible, so the len encoding is changed so that len = 0 denotes a depth = 3 copy, etc; essentially, all codes are moved down by 2.*

*Pad codewords begin with all 1's in the largest indicator field for len: i.e., Pad is encoded by 777B followed by other fields to describe the Pad. In other words, lenLast is chosen 1 larger than required for maxCopyLength so that the largest indicator field for len can be used for Pad. Following the indicator, Pad encodes another len field; if the second len field encodes 0, then a single literal character follows; when len encodes a value in [2..maxCopyLength], then the len field is followed by a relative cposition.* lenStart: CARDINAL = 2;
lenStep: CARDINAL = 1;
lenLast: CARDINAL = 11; --*Implementation limit <= 15*
maxCopyLength: CARDINAL = 4 + 8 + 16 + 32 + 64 + 128 + 256 + 512 + 1024; --*2044*
padLenIndicator: CARDINAL = 777B; --*lenLast - lenStart 1's = Power2[lenLast - lenStart + 1] - 1*

*Literals are represented as len = 0 followed by the literal length progression. The 0-bit field represents literal length 1; subsequent fields have 1, 2, 3, 4, and 5 bits. The sequence is 0000, 00010.L, 000110.LL, 0001110.LLL, 00011110.LLLL, and 000111111.LLLLL.* litStart: CARDINAL = 0;
litStep: CARDINAL = 1;
litLast: CARDINAL = 5; --*Implementation limit <= 16*
maxLitLength: CARDINAL = 1 + 2 + 4 + 8 + 16 + 32; --*63*

*litLenMap[litLen] holds [literal length code, nbits], where the literal length code is 000 binary followed by the unary progression value, and nbits = 3 + size of unary progression representation of the literal length.* litLenMap: REF ARRAY[0..maxLitLength] OF RECORD [CARDINAL, CARDINAL] ←
    NEW[ARRAY[0..maxLitLength] OF RECORD [CARDINAL, CARDINAL] ← TRASH];

sdispStart: CARDINAL = 0;
sdispStep: CARDINAL = 2;
sdispLast: CARDINAL = 4; --*Implementation limit <= 16*
minNVals: CARDINAL = Power2[0] + Power2[2] + Power2[4];

*maxCopyDisp implementation limit is 65536 - 2 \* maxCopyLength - 10.*
maxCopyDisp: CARDINAL = 16384;
--maxCopyDisp: indexType = 1024 + 4096 + 16384;

nLeaves: indexType = maxCopyDisp + maxCopyLength + 9;

*Standard htSize = htMask + 1 is the next power-of-two larger than maxCopyDisp, though it is possible to increase speed at the expense of storage by going to 4 x maxCopyDisp. For htSize = 2\*maxCopyDisp, avg. chain length is ~1.8, successful searches ~1.5: for htSize = maxCopyDisp, avg. chain length is ~2.5, successful searches ~2.0, but 2\*maxCopyDisp bytes of storage are saved.*
htMask: CARDINAL = IF maxCopyDisp >= 16384 THEN 32767 ELSE IF maxCopyDisp >= 8192 THEN 16383 ELSE IF maxCopyDisp >= 4096 THEN 8191 ELSE 4095; --*must be power-of-two minus 1* methodName: Rope.ROPE = "A16KS";
Power2: ARRAY [0..15] OF CARDINAL = [1, 2, 4, 8, 16, 32, 64, 128, 256, 512, 1024, 2048, 4096, 8192, 16384, 32768];

Power2M1: ARRAY [0..16] OF CARDINAL = [0, 1, 3, 7, 15, 31, 63, 127, 255, 511, 1023, 2047, 4095, 8191, 16383, 32767, 65535];

*Determine which of two positions will be reached next, where pos is the current position in [0..nLeaves) and stopA and stopB are in [0..nLeaves]. The result returned is in [1..nLeaves] rather than [0..nLeaves) for the stopPos check. Do the calculations to allow nLeaves to be as large as possible before cardinal overflow screws up the result.*
Soonest: PROC [pos, stopA, stopB: indexType] RETURNS [indexType] ~ {
    adist: CARDINAL ← IF stopA <= pos THEN nLeaves - pos + stopA ELSE stopA - pos;
    bdist: CARDINAL ← IF stopB <= pos THEN nLeaves - pos + stopB ELSE stopB - pos;
    IF bdist < adist THEN adist ← bdist;
    *To prevent overflows, (pos + adist) <= (2 \* nLeaves - 1)).*
    RETURN[IF pos > (nLeaves - adist) THEN pos + adist - nLeaves ELSE pos + adist];
};

*ComputeEncoding is called when h.allLeavesInUse = FALSE with index in [1 .. maxCopyDisp + 1]. On the compressor's call, [0..index - 2] might be used in a copy codeword: on the expander's call, [1..index - 1] might be used: so in both cases, there are index - 1 possible position values, so the same subroutine is used. The progression of displacement field sizes is initially 0, 2, and 4 bits, covering 2↑0 + 2↑2 + 2↑4 positions; when this is insufficient, field sizes increase to 1, 3, and 5 bits: etc. up to the maximum 10, 12, and 14 bit fields; in steady-state maxCopyDisp values must be encoded. Here, recompute the progression phaseIn and the next position at which it will change. The encoding must not depend on anything that occurs during the copy body, which the expander cannot anticipate. Because the literal encoding is invariant, literal encoding parameters do not have to be saved after each codeword: otherwise, literal coding parameters would have to be saved after each codeword, just in case the next codeword is a literal.*
ComputeEncoding: PROC[index: CARDINAL] RETURNS [CARDINAL, indexType, BOOL, CARDINAL]

~{
*If steady-state has been reached, return steady-state parameters and h.allLeavesInUse = TRUE.*
npos: CARDINAL ← MIN[index - 1, maxCopyDisp];
dispStart: CARDINAL ← sdispStart;
nvals: CARD32;
stopPos: CARDINAL;
FOR nvals ← minNVals, nvals + nvals UNTIL npos <= nvals DO
    dispStart ← dispStart + 1;
    ENDLOOP;
*Stop next time when dispStart will change or h.allLeavesInUse become TRUE. nvals - Power2[dispLast] (= no. values in the displacement progression excluding the last field) is needed to compute nv in EncodeSVar and DecodeSVar.*
stopPos ← IF index >= maxCopyDisp + 1 THEN nLeaves ELSE IF nvals < (maxCopyDisp - 1) THEN LowHalf[nvals + 2] ELSE maxCopyDisp + 1;
RETURN[dispStart, stopPos, index >= maxCopyDisp + 1, nvals - Power2M1[dispStart + sdispLast - sdispStart] - 1];
};

Compress

*The compressor's output buffer is dumped with UnsafePutBlock on the next Copy codeword or literal character after oBufReserve source characters have been processed or when a Flush is issued; the worst case is approximately as follows:*

*(1) maxLitLength - 1 lit. characters were pending after the last buffer dump;*
   *(2) oBufReserve - 1 new characters are coded with a bad repeated sequence:*
      *alt. Lit1 & Copy3 = (4 + (1 \* 8) + 19) / (4 \* 8) = .969 bits/bit -or-*
      *alt. Lit2 & Copy3 = (6 + (2 \* 8) + 19) / (5 \* 8) = 1.025 bits/bit -or-*
      *alt. Lit4 & Copy3 = (8 + (4 \* 8) + 19) / (7 \* 8) = 1.054 bits/bit -or-*
      *alt. Lit8 & Copy3 = (10 + (8 \* 8) + 19) / (11 \* 8) = 1.057 bits/bit -or-*
      *alt. Lit16 & Copy3 = (12 + (16 \* 8) + 19) / (19 \* 8) = 1.046 bits/bit -or-*
      *alt. Lit32 & Copy3 = (13 + (32 \* 8) + 19) / (35 \* 8) = 1.029 bits/bit -or-*
      *maxLitLength literal = (13 + (63 \* 8)) / (63 \* 8) = 1.026 bits/bit -or-*
      *Copy2 codewords = (19 / (2 \* 8)) = 1.1875 bits/bit.*
*So the worst sequence is repeated Copy2 codewords, but a conservative multiplier of 1.5 is used to avoid worrying about this value.*
   *(3) a maxCopyLength Pad codeword (only one Pad because the buffer is dumped after Pad).*
oBufReserve: CARDINAL = 1024;
encIOBufSize: CARDINAL = ((oBufReserve / 2) \* 3 + maxLitLength + 7) / bytesPerWord;

compressStreamProcs: REF IO.StreamProcs ← IO.CreateStreamProcs[
    variety: $output,
    class: $Compress,
    putChar: CSPutChar,
    unsafePutBlock: CSUnsafePutBlock,
    flush: CSFlush,
    close: CSClose
    ];

*The "next" field of both NodeRec and LeafRec must be first so that it corresponds with the long pointer in a hash table bucket; and the parent field must be next so that leaves and nodes are*

*equivalent for the hash procedures.*
```
NodeRec: TYPE = RECORD [
    next: Node, --HT chain link or free list chain link
    parent: Node, position: indexType,
    suffix: Node,
    update: BOOLEAN,
    depth: CARDINAL, --No. characters between root and this node
    sons: CARDINAL --No. sons (in [2..256])
    ];
nodeSize: CARDINAL = SIZE[NodeRec];
Node: TYPE = LONG POINTER TO NodeRec;
```

*Leaves do not need "depth" or "sons" fields, and "position" can be computed from the distance between the leaf pointer and the base of the leaf array. The fields in LeafRec must be congruent with the first fields of a NodeRec.*
```
LeafRec: TYPE = RECORD [
    next: Node, --HT chain link or free list chain link
    parent: Node
    ];
leafSize: CARDINAL = SIZE[LeafRec];
Leaf: TYPE = LONG POINTER TO LeafRec;

CompressStreamData: TYPE = LONG POINTER TO CompressStreamRec;
CompressStreamRec: TYPE = RECORD [
    outputStream: IO.STREAM,
    outState: INTEGER ← 0, --No. bits in partial output word
    outRemainder: CARDINAL ← 0, --Unoutput bits in [0..outState).
    outCount: NAT ← 0, depth: CARDINAL ← 0, --No. characters matched previously.
    copySize: CARDINAL ← 0,
    litLen: CARDINAL ← 0,
    onLeafArc: BOOL ← FALSE,
    dispStart: CARDINAL ← TRASH,
    lastNVals: CARDINAL ← TRASH,
    allLeavesInUse: BOOLEAN ← FALSE,
    scan: Node ← TRASH,
    freeList: Node ← TRASH,
    root: Node ← TRASH, Variables holding window positions.
    index: indexType ← 0,
    stopPos: indexType ← 1,
    copyMark: indexType ← 0, outBuf: ARRAY [0..encIOBufSize) OF CARDINAL ← ALL[TRASH]
    ];
```

*The compressor's storage block is a CompressStreamRec followed by the following arrays. Note*

*that the node array includes 257 permanent nodes (a root and 1 for each single character) plus whatever number are in the tree produced for the window of characters. If there were no cut-off depth, the worst case tree would have maxCopyDisp - 1 additional nodes: because of cut-off, the worst case is several nodes smaller. A significant storage reduction could be achieved by allocating only the typical number of nodes needed in the tree (50% x maxCopyDisp) while arranging to remove the oldest leaves if the window overflowed. This approach is used in the C2 and D2 compressors.* nodeArray: TYPE = LONG POINTER TO ARRAY [0..maxCopyDisp + 257) OF NodeRec;
leafArray: TYPE = LONG POINTER TO ARRAY [0..nLeaves) OF LeafRec;
htArray: TYPE = LONG POINTER TO ARRAY [0..htMask] OF Node;
windowArray: TYPE = LONG POINTER TO Basics.RawBytes;

nodesOffset: INT = SIZE[CompressStreamRec];
leavesOffset: INT = nodesOffset + (LONG[maxCopyDisp + 257] * nodeSize);
htOffset: INT = leavesOffset + (LONG[nLeaves] * leafSize);
windowOffset: INT = htOffset + ((LONG[htMask] + 1) * lpSize);
compressorStorageSize: INT = windowOffset + ((nLeaves + bytesPerWord - 1) / bytesPerWord);

*Allocate the data structure using CountedVM so that it can be manually freed when the stream is closed in the normal case avoiding swapout and garbage collection. On any abnormal termination, the structure will later be reclaimed by the Collector. Unfortunate attribute of CountedVM is that the LONG POINTER in its Handle implies all procedures are UNSAFE. The streamData field of the STREAMRecord is a CountedVM.Handle for the CompressStreamRec.*

CreateEncodingStream: CodeControl.CreateEncoderProc = TRUSTED {
    --PROC [output: IO.STREAM, methodState: REF] RETURNS [codeStream: IO.STREAM]
    ch: CountedVM.Handle ← CountedVM.Allocate[compressorStorageSize];
    h: CompressStreamData ← LOOPHOLE[ch.pointer];
    nodes: nodeArray ← LOOPHOLE[h, LONG POINTER] + nodesOffset;
    leaves: leafArray ← LOOPHOLE[h, LONG POINTER] + leavesOffset;
    hashTable: htArray ← LOOPHOLE[h, LONG POINTER] + htOffset;
    window: windowArray ← LOOPHOLE[h, LONG POINTER] + windowOffset;

parent, scan: Node;
    leaf: Leaf;
    hvLast: LONG POINTER ← @hashTable[htMask];

IF methodState # NIL THEN ERROR CodeControl.BadCodingMethod["methodState not NIL"];
    h↑ ← [outputStream: output];

*Initialize htMask+1 HT buckets with self-pointers for circular collision list.*
    FOR hv: LONG POINTER TO LONG POINTER ← @hashTable[0], hv + SIZE[LONG POINTER]
    DO
        hv↑ ← hv; IF hv = hvLast THEN EXIT;
        ENDLOOP;

*The worst case node requirement is 256 permanent nodes at depth 1 + the root +* maxCopyDisp - 1 nodes in the tree body + 1 node on the free list = maxCopyDisp + 257.
Here, initialize the root at depth 0 and a depth 1 node for every possible arc character: these
are put in the HT so that no special code for depth = 0 is needed initially and following a
Flush.

```
h.root ← h.scan ← parent ← @nodes[256];  --The root
parent.next ← parent.suffix ← NIL;  --Cause a trap if root.next or root.suffix is ever used
parent.depth ← parent.position ← 0;
parent.sons ← maxCopyDisp + 4;
parent.parent ← parent;  --Need root.parent = root to stop update propagation
scan ← @nodes[0];
FOR char: CARDINAL IN [0..256) DO
    scan.sons ← maxCopyDisp + 4;  --2 or more extra sons so it won't ever be deleted
    scan.depth ← 1;
    scan.position ← 0;
    scan.update ← FALSE;
    scan.suffix ← parent;
    NewArc[hashTable, scan, parent, char];
    scan ← scan + nodeSize;
    ENDLOOP;
h.freeList ← scan ← parent + nodeSize;  --origin of node free list
leaf ← @leaves[0];
FOR I: CARDINAL IN [0..maxCopyDisp) DO  --Initialize free list nodes
    scan.sons ← 2;
    scan.update ← FALSE;
    scan ← scan.next ← scan + nodeSize;
    ENDLOOP;
FOR I: indexType IN [0..nLeaves) DO  --Initialize leaves
    leaf.next ← leaf and root.sons ← history + 4 so RemoveLeaf is a no-op.
    leaf.parent ← parent;
    leaf.next ← LOOPHOLE[leaf, Node];
    leaf ← leaf + leafSize;
    ENDLOOP;

RETURN[IO.CreateStream[streamProcs: compressStreamProcs, streamData: ch]];
};
```

*Procedures for inserting, removing, and finding hashTable arcs: circular collision lists thread from
the bucket through the .next fields of leaves and nodes and back to the bucket; an empty bucket
is denoted by a self-pointer. Arcs are identified by the parent's node address and the first arc
character. Because each outgoing character results in a different HT bucket, no character
compare is needed to verify that a particular node matches, if the parent's node address matches.*

*Since node sizes may be a power-of-two or four, the least significant one or two node-address bits
may not contribute to the hash; also, low-order character bits are usually more evenly distributed
than high-order bits. All character bits must contribute to the hash bucket so that search
subroutines need not compare the arc character to determine whether or not a match has been
found. The hash function used here is the simplest possible lowbits[parent] xor char.*

```
Hash: PROC [n: Node, char: BYTE] RETURNS [CARDINAL] ~ TRUSTED INLINE {
    RETURN [BITAND[BITXOR[LowAddr[n], char], htMask]];
};
```

```
NewArc: PROC [hashTable: htArray, n, parent: Node, char: BYTE] = TRUSTED INLINE {
    bucket: Node ← LOOPHOLE[@hashTable[Hash[parent, char]], Node];
    n.parent ← parent;
    n.next ← bucket.next;  --Place new arc at the head of the HT list
    bucket.next ← n;
    };
```

*Circumnavigate the circular collision list and splice out a discarded leaf.*
```
RemoveArc: PROC [leaf: Leaf] = TRUSTED INLINE {
    slot: Node;
    FOR slot ← leaf.next, slot.next WHILE slot.next # LOOPHOLE[leaf, Node] DO
        ENDLOOP;
    slot.next ← leaf.next;
    };
```

*Substitute node n for m in a HT collision list; m.parent is their common parent.*
```
ReplaceArc: PROC [n, m: Node] = TRUSTED INLINE {
    slot: Node;
    n.parent ← m.parent;
    slot ← n.next ← m.next;
    UNTIL slot.next = m DO slot ← slot.next; ENDLOOP;
    slot.next ← n;
    };
```

*ReFetchArc is used to retrace the path from the suffix node to the guaranteed match depth.*
```
ReFetchArc: PROC [hashTable: htArray, parent: Node, char: BYTE] RETURNS [slot: Node] =
    TRUSTED INLINE {
    bucket: Node ← LOOPHOLE[@hashTable[Hash[parent, char]], Node];
    FOR slot ← bucket.next, slot.next UNTIL parent = slot.parent DO
        ENDLOOP;
    };
```

*Subroutine to read the character window.*
```
BufR: PROC [window: LONG POINTER TO Basics.RawBytes, w: indexType] RETURNS [BYTE] ~
    TRUSTED INLINE {
    RETURN[window[IF w >= nLeaves THEN w - nLeaves ELSE w]];
    };

CSUnsafePutBlock: PROC [self: IO.STREAM, block: Basics.UnsafeBlock] = TRUSTED { h: CompressStreamData ← LOOPHOLE[NARROW[self.streamData,
            CountedVM.Handle].pointer];
    base: LONG POINTER TO Basics.RawBytes ← LOOPHOLE[block.base];
    startIndex: CARDINAL ← block.startIndex;  --This will bounds-check < 0 and >= 64k
    count: CARDINAL ← block.count;  --This will bounds-check < 0 and >= 64k nodes: nodeArray ← LOOPHOLE[h, LONG POINTER] + nodesOffset;
    leaves: leafArray ← LOOPHOLE[h, LONG POINTER] + leavesOffset;
    hashTable: htArray ← LOOPHOLE[h, LONG POINTER] + htOffset;
    window: windowArray ← LOOPHOLE[h, LONG POINTER] + windowOffset;
```

```
index: indexType ← h.index;
stopPos: indexType ← h.stopPos;
ipd: indexType;

litLen: CARDINAL ← h.litLen;
depth: CARDINAL ← h.depth;
copySize: CARDINAL ← h.copySize;
scan: Node ← h.scan;
copyMark: indexType ← h.copyMark;
onLeafArc: BOOL ← h.onLeafArc;
freeList: Node ← h.freeList;
leaf: Leaf ← @leaves[index];
```
*oldLeaf should be exactly maxCopyDisp positions behind leaf: since removals are carried out after the leaf at index has been inserted, the leaves in use just after removal are [index - maxCopyDisp + 1 .. index].*
```
oldLeaf: Leaf ← @leaves[IF index >= maxCopyDisp THEN index - maxCopyDisp ELSE
    index - maxCopyDisp + nLeaves];

copyLenCode: CARDINAL;
char, achar: BYTE;
previous, parent, oldParent: Node;

FOR i: CARDINAL IN [startIndex .. startIndex + count) DO
{
```
*At the beginning of each iteration, scan is the arc, copyMark is the window position, and depth is the length of the longest match; copySize is the no. characters remaining on the preceding codeword. The next source character will go at window[index + depth]. If this character extends the longest match, then depth ← depth + 1 will happen and the outer loop will repeat until the match is exhausted or depth = maxCopyLength is reached.*

*Otherwise, a leaf is added for window position index and a leaf is removed for window position index + maxCopyLength; then index ← index + 1; then, if copySize = 0, a codeword will be output or the character at window[index - 1] added to a literal; or if copySize ≠ 0, then copySize ← copySize - 1. Finally, depth ← depth - 1, scan ← previous.suffix, copyMark ← position of scan. Then the inner loop is repeated at the suffix position until the match can be extended across the character at window[index]; then the outer loop etc.*

```
    IF (ipd ← index + depth) >= nLeaves THEN ipd ← ipd - nLeaves;
    char ← window[ipd] ← base[i];
```

*This inner loop is repeated at the suffix of the previous position after an iteration in which the previous longest match could not be extended to include the current character until finally that character is included in the match; because of the permanent nodes, a match will for sure occur when depth = 1.*
```
    DO
    {
        IF onLeafArc THEN {
```

IF depth # maxCopyLength THEN GO TO arcExtension:
*Cut-off depth. Replace the arc to the cut-off leaf by an arc to the new leaf. Removal avoids indefinitely long HT collision lists by limiting each node to 256 sons, each beginning with a different character. Attach the removed leaf to the root and point its HT link at itself so that leaf removal will be a no-op.*
ReplaceArc[LOOPHOLE[leaf, Node], scan]:
previous ← leaf.parent:
parent ← freeList: --*So parent.suffix can be smashed after rescan later*
scan.next ← scan:
scan.parent ← h.root:
}
ELSE IF scan.depth = depth THEN { --*At a node*
   previous ← scan:
   parent ← LOOPHOLE[@hashTable[Hash[previous, char]], Node]:
   *It is not ok to do scan.position ← index here: if that were done, and a Flush is issued before the new leaf is put into the tree, then RemoveLeaf could eventually crash due to not finding the expected leaf.*
   FOR scan ← parent.next, scan.next WHILE scan # parent DO
     IF previous = scan.parent THEN {
       *Found an arc scan going deeper in the tree. This address arithmetic is the result of eliminating the position and depth fields in leaves to save storage.*
       leafPos: INT ← LOOPHOLE[scan, INT] - LOOPHOLE[leaves, INT]:
       IF LOOPHOLE[HighHalf[leafPos], INTEGER] >= 0 THEN {
          *scan = leafarc: leafPos / leafSize gives long divide trap here.*
          copyMark ← Basics.LongDiv[LOOPHOLE[leafPos, CARD32], leafSize]:
          onLeafArc ← TRUE:
       }
       ELSE copyMark ← scan.position: --*scan = node arc*
       depth ← depth + 1: GO TO outerLoop:
     }:
   ENDLOOP:
   *Match ends exactly at the node previous.*
   parent ← previous:
   previous.sons ← previous.sons + 1:
   NewArc[hashTable, LOOPHOLE[leaf, Node], previous, char]:
   }
ELSE GO TO arcExtension: --*On a node arc*
EXITS
   arcExtension => {
     IF char = (achar ← BufR[window, copyMark + depth]) THEN {
       depth ← depth + 1: GO TO outerLoop:
     }:
     *Match terminates on the arc scan. Splice a new tree node into the arc: it has parent = previous, position = index, depth = depth. Arcs to scan and to the new leaf hang from this new node.*
     freeList ← (parent ← freeList).next:
     parent.position ← index:

```
    parent.depth ← depth:
```
*node.sons = 2 and node.update = FALSE when node is put on freeList.*
```
    ReplaceArc[parent, scan];
    NewArc[hashTable, scan, parent, achar];
    NewArc[hashTable, LOOPHOLE[leaf, Node], parent, char];
    previous ← parent.parent;
    };
};
```

*Here with depth >= 1 (because of the permanent nodes at depth = 1). The most recent character at window[index + depth] did not extend the longest match, and the tree has been extended. previous.suffix will be followed to reach the suffix for the next iteration; parent.suffix will be updated when the true suffix position has been rescanned. Write index into previous.position and propagate index upward from previous. An average of 1.5 useless but harmless updates occur when the root is reached because root.parent = root, but these are cheaper than checking for the root each time. Note that the update here is cheaper than the update from a deleted leaf's parent because index is known to be more recent than any other tree position, so no position comparison is needed. The new position cannot be written into the tree during descent because, if a Flush occurred, no leaf would correspond to that position.*

```
(scan ← previous).position ← index;
--UNTIL scan.depth = 0 DO Use this instead for update-to-root
UNTIL (scan.update ← NOT scan.update) DO
    scan ← scan.parent;
    scan.position ← index;
    ENDLOOP;
```

*Remove the leaf for the character maxCopyDisp characters behind index; all earlier leaves have already been removed. First, remove oldLeaf from the circular collision list by following around the circular list and splicing it out; then if its parent node had 2 sons, remove its 1 remaining son from the HT and reattach it to parent.parent; otherwise, decrement .sons. Because nLeaves > maxCopyDisp + maxCopyLength + 1, removals are carried out more than maxCopyLength characters ahead of index, so the part of the window filled by new text never overwrites characters referred to in the tree.*

*Leaves are initially all not in the HT and attached to the root; later a leaf may be removed from its parent and attached to the root when another leaf matches it to depth = maxCopyLength; in either situation, oldLeaf.next = oldLeaf (so that RemoveArc will be a no-op) and oldLeaf.parent = root; root.sons ← maxCopyDisp + 4 is done periodically to prevent the root from being deleted here.*

```
oldParent ← oldLeaf.parent;
RemoveArc[oldLeaf];
IF oldParent.sons = 2 THEN {
```
*oldParent must be deleted. Remove its other son's HT arc and insert an arc from oldParent.parent to the other son; then deallocate oldParent, ensuring that oldParent.update = FALSE and oldParent.sons = 2 when the node goes*

*on freeList. This point is typically reached on 50% of steady-state iterations (so new nodes typically are also created on 50% of steady-state iterations).*
position: CARDINAL ← oldParent.position;
char: CARDINAL ← BufR[window, position + oldParent.depth];
xscan: Node ← LOOPHOLE[@hashTable[Hash[oldParent, char]], Node];
otherSon: Node;
FOR otherSon ← xscan.next, otherSon.next UNTIL oldParent =
  otherSon.parent DO
    xscan ← otherSon;
    ENDLOOP;
xscan.next ← otherSon.next;
ReplaceArc[otherSon, oldParent];
IF oldParent.update THEN {
    *The most recent position is index.*
    dBest: CARDINAL ← IF position <= index THEN index - position ELSE
      nLeaves + index - position;
    oldParent.update ← FALSE;
    FOR xscan ← oldParent.parent, xscan.parent DO
        dNew: CARDINAL ← IF xscan.position <= index THEN index -
          xscan.position ELSE nLeaves + index - xscan.position;
        IF dNew < dBest THEN {
            dBest ← dNew; position ← xscan.position;
            }
        ELSE xscan.position ← position;
        IF (xscan.update ← NOT xscan.update) THEN EXIT;
        ENDLOOP;
    };
    oldParent.next ← freeList; *--Finally free oldParent.*
    freeList ← oldParent;
    }
ELSE oldParent.sons ← oldParent.sons - 1;

*Execute a single conditional branch for all unusual events associated with the window position. stopPos holds the earliest position at which something must be done. One thing is that index must be wrapped back to 0 when it counts up to nLeaves, and leaf must be set back to @leaves[0]; oldLeaf must cycle in the same way. In addition, h.allLeavesInUse ← TRUE must happen when index = maxCopyDisp + 1. Finally, the encoding of the window displacement field of copy codewords changes as a function of the number of positions presently in use: the encoding must be recomputed at appropriate times.*

IF (index ← index + 1) = stopPos THEN {
    ioStopPos: indexType;
    IF NOT h.allLeavesInUse THEN [h.dispStart, stopPos, h.allLeavesInUse,
      h.lastNVals] ← ComputeEncoding[index]
    ELSE stopPos ← nLeaves;
    IF index = nLeaves THEN index ← 0;
    h.root.sons ← maxCopyDisp + 4; *--To prevent deletion of the root node*
    leaf ← @leaves[index];
    oldLeaf ← @leaves[IF index >= maxCopyDisp THEN index - maxCopyDisp
      ELSE index - maxCopyDisp + nLeaves];

ioStopPos ← IF index > nLeaves - oBufReserve THEN index + oBufReserve - nLeaves ELSE index + oBufReserve;

*stopPos ← the soonest of position to change encoding, to wrap oldLeaf(= maxCopyDisp), to wrap Leaf(= nLeaves), and to dump output buffer.* stopPos ← Soonest[index, maxCopyDisp, Soonest[index, stopPos, ioStopPos]];

IO.UnsafePutBlock[h.outputStream, [count: h.outCount * bytesPerWord, base: LOOPHOLE[@h.outBuf[1]]]];
h.outCount ← 0;
}
ELSE {
   leaf ← leaf + leafSize; oldLeaf ← oldLeaf + leafSize;
   };

*If copySize = 0 then either increase litLen by 1 character or output the accumulated literal and copy codewords. Then, follow the suffix pointer and rescan to the position of the true suffix. Repeatedly take the inner loop to the suffix position until the match extends over the character at window[index + depth - 1]; then take the outer loop until the match is exhausted. Etc.*

IF copySize > 0 THEN copySize ← copySize - 1
ELSE {
   IF depth >= 3 THEN { --*Long enough for a copy*
      IF litLen # 0 THEN {
         OutputLiteral[h, litLen, index]; litLen ← 0;
         *Both a depth = 2 copy and another literal are impossible after a literal < maxLitLength long, so shift the length encoding down 2.*
         copyLenCode ← depth - 3; GO TO makeCopy;
      };
      copyLenCode ← depth - 1; GO TO makeCopy;
   }
   ELSE IF (depth = 2) AND (litLen = 0) THEN {
      copyLenCode ← 1; GO TO makeCopy;
      }
   ELSE IF (litLen ← litLen + 1) = maxLitLength THEN { --*depth = 1 OR litLen # 0*
      *The character at index - 1 goes in a literal: output a literal codeword if maxLitLength has been reached.*
      OutputLiteral[h, litLen, index + 1]; litLen ← 0;
      };
*Fall through to here if character gets added to a literal.*
EXITS
   makeCopy => {
      relpos: CARDINAL ← (IF index >= copyMark + 2 THEN index - copyMark - 2 ELSE index - copyMark - 2 + nLeaves);
      EncodeVar[h, copyLenCode, lenStart, lenStep, lenLast];
      EncodeSVar[h, relpos, index];
      copySize ← depth - 1;
      };
   };

*Rescan from previous.suffix to the true suffix: then write parent.suffix with the true suffix: finally, setup scan, copyMark, and onLeafArc for the inner loop.*
```
scan ← previous.suffix:
IF scan.depth < (depth ← depth - 1) THEN { --Rescan
    DO
        leafPos: INT:
        scan ← ReFetchArc[hashTable. previous ← scan. BufR[window. index +
            scan.depth]]:
        leafPos ← LOOPHOLE[scan. INT] - LOOPHOLE[leaves. INT]:
        IF LOOPHOLE[HighHalf[leafPos], INTEGER] >= 0 THEN { --scan = leaf
            arc
```
*If the suffix is a leaf arc, then the preceding match must also have been on a leaf arc, so the new copyMark can only be the old value + 1 (except at depth = maxCopyLength - 1; in the cut-off case, copyMark is for a leaf that has been removed from the HT and copyMark + 1 might previously have been removed??).*
```
            copyMark ← Basics.LongDiv[LOOPHOLE[leafPos. CARD32], leafSize]:
            parent.suffix ← freeList:
            GO TO innerLoop:
            }:
        IF scan.depth >= depth THEN EXIT:
    ENDLOOP:
    onLeafArc ← FALSE:
    copyMark ← scan.position:
    IF scan.depth > depth THEN {
```
*Rescan ends on an a node arc between previous and scan. Point this iteration's suffix link at the new node which will be allocated next iteration by arcExtension (= freeList).*
```
        parent.suffix ← freeList: LOOP:
        }:
    EXITS
        innerLoop => { LOOP: }:
    }
ELSE {
    onLeafArc ← FALSE: copyMark ← scan.position:
    }:
parent.suffix ← scan:
ENDLOOP: --End of inner loop EXITS
    outerLoop => {
        Accept another character and continue computing the longest match
        }:
    }:
ENDLOOP:

h.index ← index:
h.stopPos ← stopPos:
h.litLen ← litLen:
h.depth ← depth:
h.copySize ← copySize:
```

```
h.scan ← scan;
h.copyMark ← copyMark;
h.onLeafArc ← onLeafArc;
h.freeList ← freeList;
};

CSPutChar: PROC [self: IO.STREAM, char: CHAR] = TRUSTED {
    buff: PACKED ARRAY [0..1] OF CHAR;
    buff[0] ← char;
    CSUnsafePutBlock[self, [base: LOOPHOLE[LONG[@buff]], startIndex: 0, count: 1]];
};
```

*h.outRemainder holds the accumulated bits [0..h.outState) in the output word being built.*
  *h.outState is the bit position where the next output value will be written*
  *(or, equivalently, the no. valid bits in h.outRemainder).*
  *code is a right-justified value being output.*
  *nbits is the length of the new value, $0 <= n <= 16$.*

```
Output: PROC [h: CompressStreamData, code, nbits: CARDINAL] ~ TRUSTED INLINE {
    outState: INTEGER;
    IF (outState ← nbits + h.outState - bitsPerWord) >= 0 THEN {
        Complete the output word being built in h.outRemainder, write it into h.outBuf, and start a
        new word in h.outRemainder.
        h.outBuf[h.outCount ← h.outCount + 1] ← h.outRemainder + BITSHIFT[code, -
            outState];
        h.outRemainder ← BITSHIFT[code, bitsPerWord - (h.outState ← outState)];
    }
    ELSE { --Add code (shifted left) to the remainder
        h.outRemainder ← h.outRemainder + BITSHIFT[code, - outState];
        h.outState ← outState + bitsPerWord;
    };
};

EncodeVar: PROC [h: CompressStreamData, out, start, step, last: CARDINAL] ~ TRUSTED
INLINE {
    UNTIL out <= Power2M1[start] DO
        Output[h, 1, 1];
        out ← out - Power2[start];
        start ← start + step;
        ENDLOOP;
    IF start < last THEN Output[h, out, start + 1]
    ELSE Output[h, out, start];
};

EncodeSVar: PROC [h: CompressStreamData, out: CARDINAL, index: indexType] ~ TRUSTED
INLINE {
    The text being encoded is at window[index - 1 .. index + depth - 1) and index - 2 is the most
    recent position.
    start: CARDINAL ← h.dispStart;
    last: CARDINAL ← start + sdispLast - sdispStart;
    UNTIL out <= Power2M1[start] DO
```

```
        Output[h, 1, 1];
        out ← out - Power2[start];
        start ← start + sdispStep;
        ENDLOOP;
IF start < last THEN Output[h, out, start + 1]
ELSE {
```
*The start and last parameters are controlled so that the number of values represented by the progression is sufficient but not excessive; however, it is possible for only 1 value to be needed in the largest field, even though last bits are reserved for it in the progression. Unused codes are used to reduce the output size of the largest field. Here, nv is the number of values which must be coded in the largest field, out is the value to be coded, and start is the field size determined by the progression; decrement start until it contains no excess values; then x ← Power2[start] - nv is the number of free values in the field of size start bits; out in [0 .. x) are coded in start - 1 bits, while [x .. nv) are coded in start bits.*

```
    x: CARDINAL;
    nv: CARDINAL ← IF h.allLeavesInUse THEN maxCopyDisp - h.lastNVals ELSE index - 1 -
            h.lastNVals;
    WHILE Power2M1[start - 1] >= nv DO start ← start - 1; ENDLOOP;
    IF out < (x ← Power2M1[start] - nv + 1) THEN Output[h, out, start - 1]
    ELSE Output[h, out + x, start];
    };
};
```

OutputLiteral: PROC [h: CompressStreamData, litLen: CARDINAL, index: indexType] =
        TRUSTED {
```
    litPos: indexType ← IF index < litLen + 1 THEN index - litLen - 1 + nLeaves ELSE index -
            litLen - 1;
    window: windowArray ← LOOPHOLE[h, LONG POINTER] + windowOffset;
    val, bits: CARDINAL;
    [val, bits] ← litLenMap[litLen];
    Output[h, val, bits];

--Output[h, 0, lenStart + 1];   = EncodeVar[h, 0, lenStart, lenStep, lenLast]
    --EncodeVar[h, litLen - 1, litStart, litStep, litLast];
    Output[h, window[litPos], 8];
    FOR I: CARDINAL IN [1..litLen) DO
        IF (litPos ← litPos + 1) = nLeaves THEN litPos ← 0;
        Output[h, window[litPos], 8];
        ENDLOOP;
    };
```

*The purpose of Flush is to render codewords for all characters eaten by the compressor but not encoded and to 16-bit-align the output stream. The particular implementation here must represent 1 or more characters with each Pad codeword to avoid an ambiguous end-of-stream check during expansion. (If regular copy and literal codewords were used followed by a zero-length Pad, then the expander could not use the existence of another code byte in the Output stream as proof that at least 1 more character remains to be decoded; instead it would have to decode the next codeword(s) until a non-zero length is obtained or end-of-stream is reached; consequently, the decoding would have to be done by a subroutine, slowing everything down.)*

*The 16-bit alignment property of Pad codewords also lets the expander know there is another codeword whenever, at the onset of decoding a codeword, input is not aligned at a 16-bit boundary. If there is at least 1 more byte to decode at a 16-bit boundary, then the expander can get 2 more without fear of blocking indefinitely or encountering endOfStream because it knows that the compressor at the other end of a communication stream will not dismiss for a long time without producing a Pad codeword.*

*The function performed by the Pad codeword could be performed in other ways, and this particular implementation is the result of how input and output are buffered. If input and output were quantized in bits rather than bytes, Pad could be eliminated and the pure A2 encoding used. Because the Pad codeword uses only a minute portion of the total encoding space, its effect on file compression is also minute. On compressed files, a single Flush occurs at end-of-file: in applications such as compressed communication between computers, the sender does a Flush whenever it is necessary to ensure that accumulated characters are pushed through the compressor's buffers and delivered to the receiver's expander.*

*After the last PutChar or UnsafePutBlock, a match not yet exhausted is at [index.. index + depth): and depth - copySize >= 1 whenever the outStream is not aligned at a 16-bit boundary (i.e., at all times except initially and after an immediately preceding Flush). This follows from the fact that the encoding section of UnsafePutBlock is reached only when precisely 1 source character is not part of the longest match and has not been assigned to a literal: the suffix following section then loops until that character is added to the longest match: but at least that character remains unencoded.*

*Here, characters [index + copySize .. index + depth) are a partial copy not yet encoded, and, if copySize = 0, characters [index - h.litLen .. index) have a pending literal codeword (h.litLen # 0 implies copySize = 0). A literal codeword must be produced for any pending literal characters; then a Pad codeword for the [1..maxCopyLength] partial copy after that: finally, align the output buffer at a 16-bit boundary with a Pad codeword and dump it. Then increase copySize so no further codewords will be output for these characters. Note that index, depth, and the tree do not change; subsequent codewords will find the longest matches that would have been found without a Flush. Note that the encoding of Pad must be independent of whether or not the preceding codeword was a literal.*

```
CSFlush: PROC [self: IO.STREAM] = TRUSTED {
    h: CompressStreamData ← LOOPHOLE[NARROW[self.streamData.
            CountedVM.Handle].pointer];
    depth: CARDINAL;
    extraCount: CARDINAL ← 0;
    index: indexType ← h.index;
```

*index is the window position of the next character to be encoded: this is 1 smaller than the value of index when encoding is done in UnsafePutBlock. Begin here by outputting a Literal codeword for accumulated literal characters.*

```
    IF h.litLen # 0 THEN {
        OutputLiteral[h, h.litLen, index + 1]; h.litLen ← 0;
        };

IF (depth ← h.depth) # 0 THEN {
        window: windowArray ← LOOPHOLE[h, LONG POINTER] + windowOffset;
```

```
garbStopPos: indexType;
copySize: CARDINAL ← h.copySize;
index ← IF index >= nLeaves - copySize THEN index + copySize - nLeaves ELSE index
   + copySize;
h.copySize ← depth;
```
*Although the encoding has to be computed for the temporary value of index = real index + copySize, the leaf cycling actions have to be left untouched for UnsafePutBlock, so h.stopPos is not recomputed here.*
```
IF NOT h.allLeavesInUse THEN [h.dispStart, garbStopPos, h.allLeavesInUse,
   h.lastNVals] ← ComputeEncoding[index + 1];

IF (depth ← depth - copySize) # 0 THEN {
    Output[h, padLenIndicator, lenLast - lenStart];
    EncodeVar[h, depth - 1, lenStart, lenStep, lenLast];
    IF depth = 1 THEN Output[h, window[index], 8]  --Pad literal 1
    ELSE {  --Pad copy
        copyMark: CARDINAL ← h.copyMark + copySize;
        relpos: CARDINAL ← IF index >= copyMark + 1 THEN index - copyMark - 1
           ELSE index - copyMark - 1 + nLeaves;
        EncodeSVar[h, relpos, index + 1];
        };
```

*Pad to 16-bit boundary: try to code this to work on both 16 and 32-bit machines: the compiler should suppress false arms of the conditionals.*
```
    IF h.outState # 0 THEN h.outBuf[h.outCount ← h.outCount + 1] ←
       h.outRemainder;
    IF bytesPerWord = 4 THEN {
        extraCount ← IF h.outState > 16 THEN 0 ELSE (bytesPerWord - 2);
        }
    ELSE IF bytesPerWord # 2 THEN BugTrap[];
    h.outRemainder ← h.outState ← 0;
    }
    ELSE IF BITAND[h.outState, 17B] # 0 THEN BugTrap[];
    }
ELSE IF BITAND[h.outState, 17B] # 0 THEN BugTrap[];
```

*Dump the output buffer*
```
IO.UnsafePutBlock[h.outputStream, [count: (h.outCount * bytesPerWord) - extraCount,
   base: LOOPHOLE[@h.outBuf[1]]]];
h.outCount ← 0;
};

CSClose: PROC [self: IO.STREAM, abort: BOOL ← FALSE] = TRUSTED {
    ch: CountedVM.Handle ← NARROW[self.streamData];
```
*Explicitly freeing storage avoids swap out: the Collector reclaims only the Handle.*
```
    CountedVM.Free[ch];
    };
```

Expand

```
expandStreamProcs: REF IO.StreamProcs ← IO.CreateStreamProcs[
    variety: $input,
    class: $Expand,
    getChar: ESGetChar,
    unsafeGetBlock: ESUnsafeGetBlock,
    endOf: ESEndOf,
    close: ESClose
    ];

inRefillBytes: CARDINAL = 512; --Must be even

ExpandStreamData: TYPE = LONG POINTER TO ExpandStreamRec;
ExpandStreamRec: TYPE = RECORD [
    inputStream: IO.STREAM,
    inState: INTEGER ← 0,
    inRemainder: CARDINAL ← 0,
    inLast: CARDINAL ← 0,
    inRead: CARDINAL ← 0,
    inBlock: Basics.UnsafeBlock ← [startIndex: 2], dispStart: CARDINAL ← TRASH, --sdispStart - (sdispStart - 1),
    lastNVals: CARDINAL ← TRASH,
    allLeavesInUse: BOOLEAN ← FALSE,
    copyLenOffset: CARDINAL ← 0, length: INTEGER ← 0, --remaining characters in current copy (positive) or literal (negative).

index: indexType ← 0, --current window position.
    stopPos: indexType ← 1,
    copyMark: indexType ← 0, --window pos. of copy currently being expanded inFrom: PACKED ARRAY [0..inRefillBytes / 2] OF CARD16 ← ALL[TRASH]
    ];
ewindowOffset: INT = SIZE[ExpandStreamRec];
expanderStorageSize: INT = ewindowOffset + ((nLeaves + maxCopyLength +
        bytesPerWord - 1) / bytesPerWord);

CreateDecodingStream: CodeControl.CreateDecoderProc = TRUSTED {
    PROC [input: IO.STREAM, methodState: REF] RETURNS [decodeStream: IO.STREAM]
    ch: CountedVM.Handle ← CountedVM.Allocate[expanderStorageSize];
    h: ExpandStreamData ← LOOPHOLE[ch.pointer];
    h↑ ← [inputStream: input];
    h.inBlock.base ← LOOPHOLE[@h.inFrom];
    IF methodState # NIL THEN ERROR CodeControl.BadCodingMethod["methodState not
        NIL"];
    RETURN[IO.CreateStream[streamProcs: expandStreamProcs, streamData: ch]];
    };
```

ESUnsafeGetBlock: PROC [self: IO.STREAM, block: Basics.UnsafeBlock] RETURNS
    [nBytesRead: INT] = TRUSTED {
  base: LONG POINTER TO Basics.RawBytes ← LOOPHOLE[block.base];
  startIndex: CARDINAL ← block.startIndex; --*Will bounds-check*
  count: CARDINAL ← (nBytesRead ← block.count);

h: ExpandStreamData ← LOOPHOLE[NARROW[self.streamData,
      CountedVM.Handle].pointer];
  window: windowArray ← LOOPHOLE[h, LONG POINTER] + ewindowOffset;

length: INTEGER ← h.length;
  index: indexType ← h.index;
  stopPos: indexType ← h.stopPos;
  copyMark: indexType ← h.copyMark;
  copyLenOffset: CARDINAL ← h.copyLenOffset;
  code: CARDINAL;

inputStream: IO.STREAM ← h.inputStream;
  inRemainder: CARDINAL ← h.inRemainder;
  inState: INTEGER ← h.inState;
  inRead: CARDINAL ← h.inRead;
  inLast: CARDINAL ← h.inLast;
  inFrom: LONG POINTER TO PACKED ARRAY [0..256] OF CARD16 ← LOOPHOLE[@h.inFrom];

*A tricky problem here is how to simultaneously get bytes efficiently, raise EndOfStream at the correct time, avoid blocking for bytes that aren't available, and work efficiently on both 16 and 32-bit word size machines. Because the compressor on the other end of a communication stream has done a Flush prior to dismissing for a "long time" and because a Flush is issued immediately before EndOfStream, it is safe to obtain input in 16-bit units. For file streams, it is reasonable to keep asking for large blocks until EOF, but for terminal streams it would be a poor idea to ask for a large block of input which might not become available for an indefinite period. However, on terminal streams, CharsAvail[inputStream] returns a conservative estimate of the no. bytes that can be obtained quickly from the stream, so the code here will not ask for too many (rounding up to an even no. is ok because of the 16-bit alignment restriction).*

FillInputBuffer: PROC [] RETURNS []~ TRUSTED {
    *CharsAvail returns ≠ 0 at EndOfStream; otherwise, it returns a conservative estimate of the no. bytes that can be read without waiting.*
    count: CARDINAL;
    IF (count ← MIN[IO.CharsAvail[inputStream], inRefillBytes]) < 2 THEN count ← 2
    ELSE count ← BITAND[count + 1, LAST[CARDINAL] - 1]; --*round up to an even no.*
    h.inBlock.count ← count;
    count ← LowHalf[IO.UnsafeGetBlock[inputStream, h.inBlock]];
    IF BITAND[count, 1] ≠ 0 THEN IO.Error[SyntaxError, inputStream] --*Odd byte length => missing Pad?*
    ELSE IF count < 2 THEN ERROR IO.EndOfStream[inputStream];
    inLast ← BITSHIFT[count, -1];
    inRead ← 0;
  };

*code ← nBits bits right-justified (0 <= nBits <= 16).*
*inState is the number of left-justified bits left in inRemainder.*
*inRemainder has inState bits left-justified, zeroes in the rest of the word.*
Input: PROC [nBits: NAT] RETURNS [code: CARDINAL] ~ TRUSTED INLINE {
    code ← BITSHIFT[inRemainder, nBits - bitsPerWord];
    IF (inState ← inState - nBits) >= 0 THEN {
        inRemainder ← BITSHIFT[inRemainder, nBits];
        }
    ELSE {
        IF inRead = inLast THEN FillInputBuffer[];
        inRemainder ← inFrom[inRead ← inRead + 1];
        code ← BITSHIFT[inRemainder, - (inState ← inState + 16)] + code;
        inRemainder ← BITSHIFT[inRemainder, bitsPerWord - inState];
        };
    };

DecodeVar: PROC [start, step, last: CARDINAL] RETURNS [in: CARDINAL ← 0] ~ TRUSTED INLINE {
    UNTIL Input[1] = 0 DO
        in ← in + Power2[start];
        IF (start ← start + step) = last THEN EXIT;
        ENDLOOP;
    in ← in + Input[start];
    };

*DecodeLVar[] = DecodeVar[lenStart, lenStep, lenLast] with special treatment for Pad codewords when start reaches lenLast.*
DecodeLVar: PROC [] RETURNS [in: CARDINAL ← 0, padInd: BOOL ← FALSE] ~ TRUSTED INLINE {
    start: CARDINAL ← lenStart;
    UNTIL Input[1] = 0 DO
        in ← in + Power2[start];
        IF (start ← start + lenStep) = lenLast THEN {
            padInd ← TRUE; copyLenOffset ← in ← 0; start ← lenStart; LOOP;
            };
        ENDLOOP;
    in ← in + copyLenOffset + Input[start];
    };

*DecodeSVar = DecodeVar[h.dispStart, sdispStep, h.dispStart + sdispLast - sdispStart] with special treatment to remove unused states from the encoding when start reaches dispLast.*
DecodeSVar: PROC [] RETURNS [in: CARDINAL ← 1] ~ TRUSTED INLINE {
    start: CARDINAL ← h.dispStart;
    last: CARDINAL ← start + sdispLast - sdispStart;
    UNTIL Input[1] = 0 DO
        in ← in + Power2[start];
        IF (start ← start + sdispStep) = last THEN {
            x, y: CARDINAL;
            nv: CARDINAL ← IF h.allLeavesInUse THEN maxCopyDisp - h.lastNVals ELSE
                index - 1 - h.lastNVals;
            WHILE Power2M1[start - 1] >= nv DO start ← start - 1; ENDLOOP;

```
            x ← Input[start - 1];
            in ← in + (IF x >= (y ← Power2M1[start] - nv + 1) THEN x + x - y + Input[1]
                ELSE x);
            RETURN;
            };
        ENDLOOP;
        in ← in + Input[start];
    };

FOR i: CARDINAL IN [startIndex .. startIndex + count) DO
    ENABLE IO.EndOfStream => {
        nBytesRead ← i - startIndex;
        Check for EndOfStream raised when more literal characters are expected.
        IF length # 0 THEN IO.Error[SyntaxError, inputStream];
        EXIT;
        };
    IF length > 0 THEN { --Copy
        length ← length - 1;
        window[index ← index + 1] ← base[i] ← window[copyMark ← copyMark + 1];
        }
    ELSE IF length = 0 THEN { --Expand next codeword
        Determine parameters for the next Literal, Copy, or Pad codeword: length ← copy
        length - 1 on a Copy or Pad copy, - literal length + 1 on a Literal or Pad literal;
        copyMark is the window position for a copy. The Input subroutine raises the
        IO.EndOfStream error if no codewords are left, which is caught above.
        padInd: BOOL;
        IF (index ← index + 1) >= stopPos THEN {
            IF NOT h.allLeavesInUse THEN [h.dispStart, stopPos, h.allLeavesInUse,
                h.lastNVals] ← ComputeEncoding[index]
            ELSE stopPos ← nLeaves;
            IF index >= nLeaves THEN {
                Overflow >= maxCopyLength characters beyond the window size: then
                    duplicate the overflow characters at the beginning of the window so that index
                    and copyMark don't have to be wrapped MOD window size after every
                    character.
                from: LONG POINTER ← LOOPHOLE[window, LONG POINTER] +
                    (maxCopyDisp + bytesPerWord - 1) / bytesPerWord;
                nwords: CARDINAL ← (index ← index - maxCopyDisp) / bytesPerWord;
                PrincOpsUtils.LongCopy[from, nwords, window];
                FOR I: CARDINAL IN [nwords * bytesPerWord..index) DO window[I] ←
                    window[I + maxCopyDisp]; ENDLOOP;
                --FOR I: CARDINAL IN [0..index) DO window[I] ← window[I +
                    maxCopyDisp]; ENDLOOP;
                };
            };
        [length, padInd] ← DecodeLVar[];
        IF length = 0 THEN {
            IF NOT padInd THEN {
                length ← - DecodeVar[litStart, litStep, litLast];
                IF length # - maxLitLength + 1 THEN copyLenOffset ← 2;
```

```
                window[index] ← base[i] ← Input[8]: LOOP:
                }
            ELSE {
                window[index] ← base[i] ← Input[8]:
                };
            }
        ELSE {
            code ← DecodeSVar[]:
            copyMark ← IF index >= code THEN index - code ELSE index - code +
                    maxCopyDisp:
            window[index] ← base[i] ← window[copyMark]:
            IF NOT padInd THEN { copyLenOffset ← 0: LOOP: }:
            };
        16-bit align the input stream
        IF bytesPerWord = 2 THEN IF Input[inState] # 0 THEN IO.Error[SyntaxError,
                inputStream]
        ELSE IF bytesPerWord = 4 THEN IF Input[BITAND[inState, 17B]] # 0 THEN
                IO.Error[SyntaxError, inputStream]
        ELSE BugTrap[]:
        }
    ELSE { --Literal (length < 0)
        length ← length + 1: window[index ← index + 1] ← base[i] ← Input[8]:
        }:
    ENDLOOP:
  h.length ← length:
  h.index ← index:
  h.stopPos ← stopPos:
  h.copyMark ← copyMark:
  h.inState ← inState:
  h.inRemainder ← inRemainder:
  h.inRead ← inRead:
  h.inLast ← inLast:
  h.copyLenOffset ← copyLenOffset:
  RETURN[nBytesRead]:
  }:

ESGetChar: PROC [self: IO.STREAM] RETURNS[echar: CHAR] = TRUSTED {
  buff: PACKED ARRAY [0..1] OF CHAR:
  IF ESUnsafeGetBlock[self, [base: LOOPHOLE[LONG[@buff]], startIndex: 0, count: 1]] = 0
          THEN
      ERROR IO.EndOfStream[self]:
  RETURN[buff[0]]:
  }:
```

*EndOf returns FALSE until the current copy or literal is exhausted and EndOf[h.inputStream] has been reached.*

```
ESEndOf: PROC [self: IO.STREAM] RETURNS [BOOL] = TRUSTED {
  h: ExpandStreamData ← LOOPHOLE[NARROW[self.streamData,
          CountedVM.Handle].pointer]:
  IF (h.length = 0) AND IO.EndOf[h.inputStream] THEN RETURN[TRUE]
```

ELSE RETURN[FALSE];
};

ESClose: PROC [self: IO.STREAM, abort: BOOL ← FALSE] = TRUSTED {
    ch: CountedVM.Handle ← NARROW[self.streamData];
    *Explicitly freeing storage avoids swap out: the Collector reclaims only the Handle.*
    CountedVM.Free[ch];
};

---

*Initialize litLenMap whose entries hold [literal length code, nbits].*
litLenMap[0] ← [0, 99]; --*Never happens*
litLenMap[1] ← [0, 4]; --000.0
litLenMap[2] ← [4B, 6]; --000.100
litLenMap[3] ← [5B, 6]; --000.101
FOR litLen: CARDINAL IN [4..7] DO --000.110xx
    litLenMap[litLen] ← [30B + litLen - 4, 8];
    ENDLOOP;
FOR litLen: CARDINAL IN [8..15] DO --000.1110xxx
    litLenMap[litLen] ← [160B + litLen - 8, 10];
    ENDLOOP;
FOR litLen: CARDINAL IN [16..31] DO --000.11110xxxx
    litLenMap[litLen] ← [740B + litLen - 16, 12];
    ENDLOOP;
FOR litLen: CARDINAL IN [32..63] DO --000.11111xxxxx
    litLenMap[litLen] ← [1740B + litLen - 32, 13];
    ENDLOOP;

*Register A2 with CodeControl's method registry.*
CodeControl.RegisterCodingMethod[methodName, CreateEncodingStream,
    CreateDecodingStream, , NIL, FALSE, FALSE, compressorStorageSize * bytesPerWord,
    expanderStorageSize * bytesPerWord, "General stream", "57265", "409428"];

}.

Appendix D

*B2Impl.mesa*
    *Copyright © 1987, 1988 by Xerox Corporation. All rights reserved.*

*This program is a stream version of the B2 data compression method developed by Dan Greene and Ed Fiala. It has maxCopyDisp leaves (or cpositions) and a character buffer of size oBufSize: since CARDINALs hold cpositions, the implementation limit is maxCopyDisp = 65536 - 259. oBufSize can be very large, but to control storage, it is usually chosen to satisfy most data without being excessively large. To produce the standard compressor at different window sizes, only the maxCopyDisp and methodName parameters are edited together with the two instances of the B2Impl program name.*

*A compression stream implements CreateEncodeStream and the IO.STREAM functions PutChar, UnsafePutBlock, Flush, and Close: data presented is encoded and written on the output stream. The compressor buffers its output until codewords representing oBufReserve (=1024) or more source characters have accumulated: then it dumps the buffer using UnsafePutBlock[outStream]. IO.Flush outputs codewords for all characters presented to the compressor, finishing with a Pad*

*codeword to align output at a 16-bit boundary: finally, it dumps the output buffer using UnsafePutBlock[outStream]: IO.Flush must be issued before doing IO.Close or the final characters presented to the compression stream will not be represented by a codeword: IO.Flush on the compression stream does NOT flush outStream: clients must do that operation separately, if it is needed. IO.Close releases the storage used during compression.*

*An expansion stream implements CreateDecodeStream and the IO.STREAM functions EndOf, GetChar, UnsafeGetBlock, and Close. In response to GetChar or UnsafeGetBlock, an expansion stream obtains coded input using UnsafeGetBlock and delivers the decoded data.*

DIRECTORY
    Basics USING [BITAND, BITSHIFT, bitsPerWord, BITXOR, bytesPerWord, LongDiv,
        LongNumber, RawBytes, UnsafeBlock],
    CodeControl USING [CreateEncoderProc, CreateDecoderProc, BadCodingMethod,
        RegisterCodingMethod],
    CountedVM USING [Allocate, Free, Handle],
    IO,
    Rope USING [ROPE]:

B2Impl: CEDAR PROGRAM
    IMPORTS Basics, CodeControl, CountedVM, IO
    = { lpSize: CARDINAL = SIZE[LONG POINTER];
lcSize: CARDINAL = SIZE[CARD32];
LongNumber: TYPE = Basics.LongNumber;
bytesPerWord: CARDINAL = Basics.bytesPerWord;
bitsPerWord: CARDINAL = Basics.bitsPerWord;
BITSHIFT: PROC [value: WORD, count: INTEGER] RETURNS [WORD] = Basics.BITSHIFT;
BITAND: PROC [WORD, WORD] RETURNS [WORD] = Basics.BITAND;
BITXOR: PROC [WORD, WORD] RETURNS [WORD] = Basics.BITXOR;
LowHalf: PROC [n: CARD32] RETURNS [CARD16] = INLINE { RETURN[LOOPHOLE[n,
    LongNumber].lo] };
HighHalf: PROC [n: CARD32] RETURNS [CARD16] = INLINE { RETURN[LOOPHOLE[n,
    LongNumber].hi] };
LowAddr: PROC [raw: LONG POINTER] RETURNS [refined: CARDINAL] ~ INLINE {
    RETURN[LOOPHOLE[raw, LongNumber].lo] };

BugTrap: SIGNAL = CODE; *--For debugging* oIndexType: TYPE = CARD32;
cIndexType: TYPE = CARDINAL;

*The encoding is determined by a progression in which 7/8 of all codewords are Copies and 1/8 are Literals: however, following a literal < maxLitLength long, all codewords are Copies. One important difference between this stream compressor and the similar B2 file compressor is the use of Pad codewords to 16-bit align output when an IO.Flush is issued. (A Pad encodes a one-character Literal or a [2..maxCopyLength] long Copy followed by padding to a 16-bit boundary).*

*All codewords begin with a len field that is 0 for a Literal or depth - 1 for a Copy: this field is encoded with EncodeVar[h, L - 1, lenStart, lenStep, lenLast]. For literals, length is then encoded with EncodeVar[h, litLen - 1, litStart, litStep, litLast] followed by the literal characters: or copy position is encoded with EncodeSVar[h, relcpos, dispStart, dispStep, dispLast, cIndex]. len begins with*

*0.LL, where LL = 0 is used for literals and LL = [1..3] for copy lengths [2..4]: subsequent fields
have 3, 4, 5, ..., 10 bits: maxCopyLength = 2044. Following a literal of length < maxLitLength,
neither a depth = 2 copy nor another literal is possible, so the len encoding is changed so that len =
0 denotes a depth = 3 copy, etc: essentially, all codes are moved down by 2.*

*Pad codewords begin with all 1's in the largest indicator field for len: i.e., Pad is encoded by 777B
followed by other fields to describe the Pad. In other words, lenLast is chosen 1 larger than required
for maxCopyLength so that the largest indicator field for len can be used for Pad. Following the
indicator, Pad encodes another len field: if the second len field encodes 0, then a single literal
character follows; when len encodes a value in [2..maxCopyLength], then the len field is followed by
a relative cposition.* lenStart: CARDINAL = 2;
lenStep: CARDINAL = 1;
lenLast: CARDINAL = 11; --*Implementation limit <= 16*
*Implementation limit on maxCopyLength is 65535 due to oBufIndexer.*
maxCopyLength: CARDINAL = 4 + 8 + 16 + 32 + 64 + 128 + 256 + 512 + 1024; --*2044*
padLenIndicator: CARDINAL = 777B; --*lenLast - lenStart 1's = Power2[lenLast - lenStart + 1] -
1*

*The 0-bit field represents literal length 1; subsequent fields have 1, 2, 3, 4, and 5 bits. The sequence is
0000, 00010.L, 000110.LL, 0001110.LLL, 00011110.LLLL, 00011111.LLLLL.*
litStart: CARDINAL = 0;
litStep: CARDINAL = 1;
litLast: CARDINAL = 5; --*Implementation limit <= 16*
maxLitLength: CARDINAL = 1+ 2 + 4 + 8 + 16 + 32; --*63*
*litLenMap[litLen] holds [literal length code, nbits], where the literal length code is 000 binary
followed by the unary progression value, and nbits = 3 + size of unary progression representation
of the literal length.*
litLenMap: REF ARRAY[0..maxLitLength] OF RECORD [CARDINAL, CARDINAL] ←
    NEW[ARRAY[0..maxLitLength] OF RECORD [CARDINAL, CARDINAL] ← TRASH];
sdispStart: CARDINAL = 0;
sdispStep: CARDINAL = 2;
sdispLast: CARDINAL = 4; --*Implementation limit <= 16*
minNVals: CARDINAL = Power2[0] + Power2[2] + Power2[4];

*maxCopyDisp implementation limit is about 65536 - 259. The "+1" here is because the number of
cpositions allocated is 1 larger than the maximum displacement in Copy codewords.*
maxCopyDisp: cIndexType = 16384 + 1;
--maxCopyDisp: cIndexType = 1024 + 4096 + 16384 + 1;

*oBufSize should be roughly 8 \* maxCopyDisp to 16 \* maxCopyDisp so that typical files compressing
0.3 to 0.1 times original size have roughly balanced oBuffer and cWindow sizes. Effective size is
reduced to oBufSize - maxCopyLength - oBufReserve during pruning and increases to oBufSize -
maxCopyLength between prunings: so maxCopyLength should not be made astronomically large or
the reduction in oBuffer size will become significant. The oBufIndexer tables have to be enlarged if
oBufSize >= 15 \* 65,536.* oBufSize: oIndexType = IF maxCopyDisp > 32768 THEN 8 \* 65536 ELSE IF maxCopyDisp > 16384
    THEN 4 \* 65536 ELSE IF maxCopyDisp > 8192 THEN 2 \* 65536 ELSE 1 \* 65536; --*Must be multiple
    of 65,536 for oBufIndexer*
oBufHighOvf: CARDINAL = HighHalf[oBufSize];

*Whenever fewer than maxCopyLength bytes in the oBuffer remain unused, the oldest leaves are
pruned until enough are made free. Because pruning involves a procedure call and other overhead,*

*pruning is continued until maxCopyLength + oBufReserve bytes are free; in this way, the pruning procedure is not called more than once every oBufReserve bytes. Note that oBufSize is chosen large enough that pruning does not have to be done on most files.*
oBufReserve: CARDINAL = 1024;

methodName: Rope.ROPE = "B16KS";
Power2: ARRAY [0..15] OF CARDINAL = [1, 2, 4, 8, 16, 32, 64, 128, 256, 512, 1024, 2048, 4096, 8192, 16384, 32768];

*Power2M1 is needed to implement maxCopyDisp > 2k + 8k + 32K because Power2 then has an entry of 65536, too big for a CARDINAL.*
Power2M1: ARRAY [0..16] OF CARDINAL = [0, 1, 3, 7, 15, 31, 63, 127, 255, 511, 1023, 2047, 4095, 8191, 16383, 32767, 65535];

*Subroutines to access the oBuffer array, which exceeds the Cedar compiler's size limit.*
BufR: PROC [oBufIndexer: LONG POINTER TO ARRAY [0..16) OF LONG POINTER TO
  Basics.RawBytes, w: oIndexType] RETURNS [BYTE] ~ TRUSTED INLINE {
    RETURN[oBufIndexer[HighHalf[w]][LowHalf[w]]];
  };

BufW: PROC [oBufIndexer: LONG POINTER TO ARRAY [0..16) OF LONG POINTER TO
  Basics.RawBytes, w: oIndexType, char: BYTE] RETURNS [BYTE] ~ TRUSTED INLINE {
    RETURN[oBufIndexer[HighHalf[w]][LowHalf[w]] ← char];
    oBuffer[w] ← char;
  };

*Determine which of two cpositions will be reached next, where cpos is the current cposition in [0..maxCopyDisp) and stopA and stopB are in [0..maxCopyDisp]. The result returned is in [1..maxCopyDisp] rather than [0..maxCopyDisp) for the cStopPos check. Do the calculations so that maxCopyDisp can be as large as possible before overflow screws up the result.*
Soonest: PROC [cpos, stopA, stopB: cIndexType] RETURNS [cIndexType] ~ {
    adist: CARDINAL ← IF stopA <= cpos THEN maxCopyDisp - cpos + stopA ELSE stopA - cpos;
    bdist: CARDINAL ← IF stopB <= cpos THEN maxCopyDisp - cpos + stopB ELSE stopB - cpos;
    IF bdist < adist THEN adist ← bdist;
    *To prevent overflows, (cpos + adist) <= (2 * maxCopyDisp - 1).*
    RETURN[IF cpos > (maxCopyDisp - adist) THEN cpos + adist - maxCopyDisp ELSE cpos + adist];
  };

*ComputeEncoding is only called when h.allLeavesInUse = FALSE with cIndex in [0..maxCopyDisp). The progression of displacement field sizes is initially 0, 2, and 4 bits, covering $2↑0 + 2↑2 + 2↑4$ cpositions; when this is insufficient, the field sizes increase to 1, 3, and 5 bits; etc.; in steady-state, maxCopyDisp - 1 values must be encoded. Here, recompute the progression sizes and the next cposition at which it will change. Phasing in the cposition field of copy codewords shrank the encoded representation 660 bytes on a large text file which did not do any purging in steady-state.*
ComputeEncoding: PROC[cIndex, cOldPos: cIndexType] RETURNS [CARDINAL, cIndexType, BOOL, CARDINAL] ~ {
    *If steady-state has been reached, return steady-state parameters and h.allLeavesInUse = TRUE. Since maxCopyDisp is 1 larger than the largest number of cpositions ever used, and since the most recent cposition that can be referenced from a codeword is 2 back from cIndex, steady-state is reached when cIndex = cOldPos.*
    cStopPos: cIndexType ← Soonest[cIndex, cOldPos, maxCopyDisp];

*To determine the cposition encoding, first compute ncpos = no. cpositions needed on this codeword [cOldPos .. cIndex - 2]. Then compute nvals, the number of values that can be encoded in a displacement progression for which the smallest field is 0 bits: this value is then doubled until the progression is large enough to enumerate ncpos values.* ncpos: CARDINAL ← IF cIndex >= cOldPos + 1 THEN cIndex - cOldPos - 1 ELSE cIndex - cOldPos - 1 + maxCopyDisp;
dispStart: CARDINAL ← sdispStart;
nvals: CARD32;
FOR nvals ← minNVals, nvals + nvals UNTIL ncpos <= nvals DO
    dispStart ← dispStart + 1;
    ENDLOOP;

*If steady-state has been reached, cIndex = cOldPos, nvals >= maxCopyDisp - 1, and maxCopyDisp is the result of the first Soonest call. Otherwise, prepare to stop at the soonest of cOldPos, maxCopyDisp, when nvals has to be doubled again (i.e., when dispStart will change), or when h.allLeavesInUse becomes TRUE. If the progression covers N values and cOldPos = 0, then at cIndex = N + 2 the progression size must increase because [0..N+1) = N + 1 values will be possible. Be careful about CARDINAL overflows here.*

IF nvals < maxCopyDisp - 1 THEN {
    cStopPhaseIn: cIndexType ← IF (nvals + 2) >= (maxCopyDisp - cOldPos) THEN nvals + cOldPos + 2 - maxCopyDisp ELSE nvals + cOldPos + 2;
    cStopPos ← Soonest[cIndex, cStopPos, cStopPhaseIn];
    };

*nvals - Power2[dispLast] = no. values in the displacement progression excluding the last field: this is needed to compute nv in EncodeSVar and DecodeSVar.*

RETURN[dispStart, cStopPos, cIndex = cOldPos, nvals - Power2M1[dispStart + sdispLast - sdispStart] - 1];
    };

Compress

*The compressor's output buffer is dumped with UnsafePutBlock on the next Copy codeword or literal character after oBufReserve source characters have been processed or when a Flush is issued: the worst case is approximately as follows:*

*(1) maxLitLength - 1 lit. characters were pending after the last buffer dump;*
    *(2) oBufReserve - 1 new characters are coded with a bad repeated sequence:*
        *alt. Lit1 and Copy3 = (4 + (1 * 8) + 19) / (4 * 8) = .969 bits/bit -or-*
        *alt. Lit2 and Copy3 = (6 + (2 * 8) + 19) / (5 * 8) = 1.025 bits/bit -or-*
        *alt. Lit4 and Copy3 = (8 + (4 * 8) + 19) / (7 * 8) = 1.054 bits/bit -or-*
        *alt. Lit8 and Copy3 = (10 + (8 * 8) + 19) / (11 * 8) = 1.057 bits/bit -or-*
        *alt. Lit16 and Copy3 = (12 + (16 * 8) + 19) / (19 * 8) = 1.046 bits/bit -or-*
        *alt. Lit32 and Copy3 = (13 + (32 * 8) + 19) / (35 * 8) = 1.029 bits/bit -or-*
        *maxLitLength literal = (13 + (63 * 8)) / (63 * 8) = 1.026 bits/bit -or-*
        *Copy2 codewords = (19 / (2 * 8)) = 1.1875 bits/bit.*
    *The worst of these is repeated Copy2 codewords, but a conservative multiplier of 1.5 is used to avoid worrying about this value.*
    *(3) a maxCopyLength Pad (only one because the buffer is dumped after Pad).* encIOBufSize: CARDINAL = ((oBufReserve / 2) * 3 + maxLitLength + bytesPerWord - 1) / bytesPerWord;

compressStreamProcs: REF IO.StreamProcs ← IO.CreateStreamProcs[
    variety: $output,
    class: $Compress,
    putChar: CSPutChar;

```
    unsafePutBlock: CSUnsafePutBlock,
    flush: CSFlush,
    close: CSClose
    ];
```

*The "next" field of both NodeRec and LeafRec must be first so that it corresponds with the long pointer in a hash table bucket: and the parent field must be next so that leaves and nodes are equivalent for the hash procedures.*

```
NodeRec: TYPE = RECORD [
    next: Node, --HT chain link or free list chain link
    parent: Node,
    cposition: cIndexType,
    depth: CARDINAL, --No. characters between root and this node
    sons: CARDINAL --No. sons (non-leaves have at least two)
    ];
nodeSize: CARDINAL = SIZE[NodeRec];
Node: TYPE = LONG POINTER TO NodeRec;
```

*Leaves do not need "depth" or "sons" fields, and "cposition" can be computed from the distance between the leaf pointer and the base of the leaf array. The fields in LeafRec must be congruent with the first fields of a NodeRec.*

```
LeafRec: TYPE = RECORD [
    next: Node, --HT link or freeList link
    parent: Node
    ];
leafSize: CARDINAL = SIZE[LeafRec];
Leaf: TYPE = LONG POINTER TO LeafRec;

CompressStreamData: TYPE = LONG POINTER TO CompressStreamRec;
CompressStreamRec: TYPE = RECORD [
    outputStream: IO.STREAM,
    outState: INTEGER ← 0, --No. bits in partial output word.
    outRemainder: CARDINAL ← 0, --Unoutput bits in [0..outState).
    outCount: NAT ← 0, depth: CARDINAL ← 0, --No. characters matched previously.
    litLen: CARDINAL ← 0,
    onLeafArc: BOOL ← FALSE,
    dispStart: CARDINAL ← TRASH,
    lastNVals: CARDINAL ← TRASH,
    allLeavesInUse: BOOLEAN ← FALSE,
    scan: Node ← TRASH,
    freeList: Node ← TRASH,
    root: Node ← TRASH,
```

*Variables holding opositions.*
```
    oIndex: oIndexType ← 0, --oBuffer pos. at which next input char. goes.
    oStopPos: oIndexType ← oBufReserve - 1,
    oPrunePos: oIndexType ← oBufReserve - 1,
```

*Variables holding cpositions.*
```
    cIndex: cIndexType ← 0,
    cCopyMark: cIndexType ← 0,
    cOldPos: cIndexType ← 0,
    cStopPos: cIndexType ← 1,
```

*oBufIndexer is a krock to bypass the compiler implementation limit of 32k array entries on 16-bit Cedar machines. A side effect of the implementation is that array indices [oBufSize..oBufSize + 65536) can be used without masking first, but oBufSize must be a multiple of 65,536.* oBufIndexer: ARRAY [0..16) OF LONG POINTER TO Basics.RawBytes ← ALL[NIL],
outBuf: ARRAY [0..encIOBufSize) OF CARDINAL ← ALL[TRASH]
];

*Standard htSize = htMask + 1 is the next power-of-two larger than maxCopyDisp, though it is possible to increase speed at the expense of storage by doubling this. For htSize = 2\*maxCopyDisp, avg. chain length is ~1.8, successful searches ~1.5; for htSize = maxCopyDisp, avg. chain length is ~2.5, successful searches ~2.0, but 2\*maxCopyDisp bytes of storage are saved.* htMask: CARDINAL = IF maxCopyDisp > 16384 THEN 32767 ELSE IF maxCopyDisp > 8192 THEN 16383 ELSE IF maxCopyDisp > 4096 THEN 8191 ELSE 4095; --*must be power-of-two minus 1*

*The compressor's storage block is a CompressStreamRec followed by the following arrays:*
nodeArray: TYPE = LONG POINTER TO ARRAY [0..maxCopyDisp + 257) OF NodeRec;
leafArray: TYPE = LONG POINTER TO ARRAY [0..maxCopyDisp) OF LeafRec;
htArray: TYPE = LONG POINTER TO ARRAY [0..htMask] OF Node;
cWindowArray: TYPE = LONG POINTER TO ARRAY [0..maxCopyDisp) OF oIndexType;

nodesOffset: INT = SIZE[CompressStreamRec];
rootOffset: INT = nodesOffset + (256 \* nodeSize);
leavesOffset: INT = nodesOffset + (LONG[maxCopyDisp + 257] \* nodeSize);
htOffset: INT = leavesOffset + (LONG[maxCopyDisp] \* leafSize);
oBufferOffset: INT = htOffset + ((LONG[htMask] + 1) \* lpSize);
cWindowOffset: INT = oBufferOffset + (oBufSize / bytesPerWord);
compressorStorageSize: INT = cWindowOffset + maxCopyDisp \* SIZE[oIndexType];

*Allocate the data structure using CountedVM so that it can be manually freed when the stream is closed in the normal case avoiding swapout and garbage collection. On any abnormal termination, the structure will later be reclaimed by the Collector. Unfortunate attribute of CountedVM is that the LONG POINTER in its Handle implies all procedures are UNSAFE. The streamData field of the STREAM Record is a CountedVM.Handle for the CompressStreamRec.*

CreateEncodingStream: CodeControl.CreateEncoderProc = TRUSTED {
    --PROC [output: IO.STREAM, methodState: REF] RETURNS [codeStream: IO.STREAM]
    ch: CountedVM.Handle ← CountedVM.Allocate[compressorStorageSize];
    h: CompressStreamData ← LOOPHOLE[ch.pointer];
    cWindow: cWindowArray ← LOOPHOLE[h, LONG POINTER] + cWindowOffset;
    nodes: nodeArray ← LOOPHOLE[h, LONG POINTER] + nodesOffset;
    leaves: leafArray ← LOOPHOLE[h, LONG POINTER] + leavesOffset;
    hashTable: htArray ← LOOPHOLE[h, LONG POINTER] + htOffset;
    parent, scan: Node;
    leaf: Leaf;
    IF methodState # NIL THEN ERROR CodeControl.BadCodingMethod["methodState not NIL"];
    h↑ ← [outputStream: output];

FOR I: CARDINAL IN [0..oBufHighOvf) DO
        h.oBufIndexer[I] ← LOOPHOLE[h, LONG POINTER] + oBufferOffset + (I \* (65536 /

```
    bytesPerWord));
  ENDLOOP;
h.oBufIndexer[oBufHighOvf] ← LOOPHOLE[h, LONG POINTER] + oBufferOffset;
```

*Initialize htMask+1 HT buckets with self-pointers for circular collision list.*
```
{
  hvLast: LONG POINTER ← @hashTable[htMask];
  FOR hv: LONG POINTER TO LONG POINTER ← @hashTable[0], hv + SIZE[LONG
    POINTER] DO
      hv↑ ← hv; IF hv = hvLast THEN EXIT;
    ENDLOOP;
};
```
*The 256 permanent nodes at depth=1 and the root raise the worst case node requirement to maxCopyDisp+257-1 nodes in the tree plus 1 on the free list. Here initialize the root at depth 0 and a depth 1 node for every possible arc character: these are put in the HT so that no special code for depth = 0 is needed initially and following a Flush.*
```
h.root ← h.scan ← parent ← @nodes[256]; --The root
parent.depth ← parent.cposition ← 0;
parent.sons ← maxCopyDisp + 4;
parent.parent ← parent;
scan ← @nodes[0];
FOR char: BYTE IN [0..256) DO
    scan.sons ← maxCopyDisp + 4; --2 or more extra sons so it won't ever be deleted.
    scan.depth ← 1;
    scan.cposition ← 0;
    NewArc[hashTable, scan, parent, char];
    scan ← scan + nodeSize;
  ENDLOOP;
h.freeList ← scan ← parent + nodeSize; --origin of node free list
```
*Initialize free list nodes. Typically half are never used, so this code is wasteful: but it avoids complications and slowness later. To save storage, use the approach in the C2 compressor.*
```
FOR I: CARDINAL IN [0..maxCopyDisp - 1) DO
    scan.sons ← 2;
    scan ← scan.next ← scan + nodeSize;
  ENDLOOP;
```

*Do leaf.next ← leaf, indicating "not in HT," for maxCopyDisp leaves.*
```
leaf ← @leaves[0];
FOR I: CARDINAL IN [0..maxCopyDisp) DO
    leaf.next ← LOOPHOLE[leaf, Node];
    leaf.parent ← parent; leaf ← leaf + leafSize;
  ENDLOOP;
cWindow[0] ← 0;

RETURN[IO.CreateStream[streamProcs: compressStreamProcs, streamData: ch]];
};
```

*Procedures for inserting, removing, and finding arcs in the hashTable: circular collision lists thread from the bucket through the .next fields of leaves and nodes and back to the bucket; an empty bucket is denoted by a self-pointer. Arcs are identified by the parent's node address and the first arc character. Because each outgoing character results in a different HT bucket, no character compare is needed to verify that a particular node matches, if the parent's node address matches.*

*Since node sizes may be a power-of-two or four, the least significant one or two node address bits may not contribute to the hash: also, low-order character bits are usually more evenly distributed than high-order bits. All character bits must contribute to the hash bucket so that search subroutines need not compare the arc character to determine whether or not a match has been found. The hash function used here is the simplest possible lowbits[parent] xor char. Hash is called by NewArc, RemoveLeaf, and by the arc lookup code in UnsafePutBlock.*

Hash: PROC [n: Node, char: BYTE] RETURNS [CARDINAL] ~ TRUSTED INLINE {
    RETURN [BITAND[BITXOR[LowAddr[n], char], htMask]];
    };

NewArc: PROC [hashTable: htArray, n, parent: Node, char: BYTE] = TRUSTED INLINE {
    bucket: Node ← LOOPHOLE[@ hashTable[Hash[parent, char]], Node];
    n.parent ← parent;
    n.next ← bucket.next; --*Place new arc at the head of the HT list*
    bucket.next ← n;
    };

*Substitute node n for m in a HT collision list; m.parent is their common parent.*
ReplaceArc: PROC [n, m: Node] = TRUSTED INLINE {
    slot: Node;
    n.parent ← m.parent;
    slot ← n.next ← m.next;
    UNTIL slot.next = m DO slot ← slot.next; ENDLOOP;
    slot.next ← n;
    };

*Follow around the circular collision list and splice out a leaf being discarded from the window.*
RemoveArc: PROC [leaf: Leaf] = TRUSTED INLINE {
    slot: Node;
    FOR slot ← leaf.next, slot.next WHILE slot.next # LOOPHOLE[leaf, Node] DO
        ENDLOOP;
    slot.next ← leaf.next;
    };

*Remove leaf from the circular collision list by following around the circular list and splicing it out; then for leaf.parent, if .sons = 2, remove its 1 remaining son from the HT and reattach it to .parent: otherwise, decrement .sons. When a leaf is not in the tree, leaf.next = leaf (so that RemoveArc is a no-op) and leaf.parent = root: root.sons ← maxCopyDisp + 3 periodically to prevent the root from being deleted here. Leaves are initially all not in the HT and attached to the root; later a leaf may be removed if another leaf matches it to depth = maxCopyLength, or if oBuffer overflows because oBufSize is not enough to accommodate the last maxCopyDisp cpositions.*
RemoveLeaf: PROC [h: CompressStreamData, leaf: Leaf] ~ TRUSTED { parent: Node ← leaf.parent;
    RemoveArc[leaf];
    IF parent.sons = 2 THEN {
        *parent must be deleted. Remove its other son's HT arc and insert an arc from parent.parent to the other son; then deallocate parent. This point is typically reached on 50% of steady-state iterations (which implies that new nodes also are typically created on 50% of steady-state iterations).*
        hashTable: htArray ← LOOPHOLE[h, LONG POINTER] + htOffset;
        cWindow: cWindowArray ← LOOPHOLE[h, LONG POINTER] + cWindowOffset;

```
            char: BYTE ← BufR[@ h.oBufIndexer. cWindow[parent.cposition] + parent.depth]:
            scan: Node ← LOOPHOLE[@ hashTable[Hash[parent. char]], Node]:
            otherSon: Node:
            FOR otherSon ← scan.next, otherSon.next UNTIL parent = otherSon.parent DO
                scan ← otherSon:
                ENDLOOP:
            scan.next ← otherSon.next:
            ReplaceArc[otherSon, parent]:
            parent.next ← h.freeList:  --Finally free parent.
            h.freeList ← parent:
            }
        ELSE parent.sons ← parent.sons - 1:
    }:
```

*The oStopPos conditional is checked and PruneCWindow conditionally called immediately after
each literal character and after the first character of each copy codeword. cIndex - 1 is the
newest cposition, just filled: cIndex is the oldest cposition, just purged: if h.allLeavesInUse,
cIndex + 1 is the oldest valid cposition. else h.cOldPos: oIndex is the oposition of the first
character in the next codeword, just written (or about to be written if the call is from Flush). If
any pruning is done here, the encoding will be recomputed as a function of the no. cpositions
before the next codeword is generated.*

*The expander will call the equivalent PruneEWindow procedure just before the first character of
each codeword: it must prune just as the code here prunes.*

*Successively remove oldest leaves while they point into the oBuffer area oIndex +
[0..maxCopyLength + oBufReserve). The worst case between successive oStopPos checks is a
maxCopyLength copy: leaves pointing into oBufReserve additional characters are cleared so
that this code is executed only once per oBufReserve characters. Turn off h.allLeavesInUse and
set h.cOldPos to the oldest valid cposition if any purging is done and RETURN[TRUE]; return
FALSE if no purging was done.*

*Tracking the oldest leaf is tricky. If h.allLeavesInUse, then all cpositions were previously in use,
and that condition has persisted, or else the compressor created enough new cpositions to fill the
gap: in either case, the oldest valid cposition is cIndex + 1 (i.e., the cposition which will be
overwritten on the next iteration). Otherwise, cpositions [cOldPos..cIndex) are in use.*

```
PruneCWindow: PROC [h: CompressStreamData, oIndex: oIndexType, cIndex, cStopPos:
        cIndexType] RETURNS [cIndexType] ~ TRUSTED {

PruneLeaves: PROC [h: CompressStreamData, fromPosLow, fromPosHigh: oIndexType,
            cOldPos: cIndexType] RETURNS [cIndexType] ~ TRUSTED {
        leaves: leafArray ← LOOPHOLE[h, LONG POINTER] + leavesOffset:
        cWindow: cWindowArray ← LOOPHOLE[h, LONG POINTER] + cWindowOffset:
        oldLeaf: Leaf ← @leaves[cOldPos]:
        WHILE cWindow[cOldPos] IN [fromPosLow..fromPosHigh) DO
            RemoveLeaf[h, oldLeaf]:
            oldLeaf.next ← LOOPHOLE[oldLeaf, Node]:
            oldLeaf.parent ← h.root:
            IF cOldPos = maxCopyDisp - 1 THEN { cOldPos ← 0: oldLeaf ← @leaves[0]: }
            ELSE { cOldPos ←cOldPos + 1: oldLeaf ← oldLeaf + leafSize: }:
            ENDLOOP:
        RETURN[cOldPos]:
        }:

fromPosLow, fromPosHigh: oIndexType:
``` cOldPos, origcOldPos: cIndexType:

*During the first pass, every leaf causes h.root.sons to be decremented once anyway, and for leaves pruned here, h.root.sons is decremented a second time. Here, increase h.root.sons to prevent the root from being destroyed: this is much cheaper than incrementing h.root.sons every time a purged leaf is hung from the root.* h.root.sons ← maxCopyDisp + 4;
cOldPos ← origcOldPos ← IF h.allLeavesInUse THEN (IF cIndex = maxCopyDisp - 1 THEN 0 ELSE cIndex + 1) ELSE h.cOldPos;
fromPosLow ← oIndex;
IF (fromPosHigh ← fromPosLow + maxCopyLength + oBufReserve) > oBufSize THEN {
    cOldPos ← PruneLeaves[h, fromPosLow, oBufSize, cOldPos];
    fromPosLow ← 0;
    fromPosHigh ← fromPosHigh - oBufSize;
    };
h.oPrunePos ← oIndex + oBufReserve;

*If any leaves are purged, cause the cStopPos conditional to be executed before the next codeword to recompute the encoding.*

IF (h.cOldPos ← PruneLeaves[h, fromPosLow, fromPosHigh, cOldPos]) # origcOldPos
    THEN {
    h.allLeavesInUse ← FALSE; cStopPos ← cIndex + 1;
    };
RETURN[cStopPos];
};

CSUnsafePutBlock: PROC [self: IO.STREAM, block: Basics.UnsafeBlock] = TRUSTED {
    h: CompressStreamData ← LOOPHOLE[NARROW[self.streamData,
        CountedVM.Handle].pointer];
    base: LONG POINTER TO Basics.RawBytes ← LOOPHOLE[block.base];
    startIndex: CARDINAL ← block.startIndex; --*This will bounds-check < 0 and >= 64k*
    count: CARDINAL ← block.count; --*This will bounds-check < 0 and >= 64k* nodes: nodeArray ← LOOPHOLE[h, LONG POINTER] + nodesOffset;
    leaves: leafArray ← LOOPHOLE[h, LONG POINTER] + leavesOffset;
    hashTable: htArray ← LOOPHOLE[h, LONG POINTER] + htOffset;
    cWindow: cWindowArray ← LOOPHOLE[h, LONG POINTER] + cWindowOffset;
    oBufIndexer: LONG POINTER TO ARRAY [0..16) OF LONG POINTER TO Basics.RawBytes ←
        @h.oBufIndexer;

cIndex: cIndexType ← h.cIndex;
    cCopyMark: cIndexType ← h.cCopyMark;
    cStopPos: cIndexType ← h.cStopPos;

oIndex: oIndexType ← h.oIndex;
    oStopPos: oIndexType ← h.oStopPos;
    litLen: CARDINAL ← h.litLen;
    onLeafArc: BOOL ← h.onLeafArc;
    depth: CARDINAL ← h.depth;
    scan: Node ← h.scan;

leaf: Leaf ← @leaves[cIndex];

char, achar: BYTE;
previous, parent: Node;

PurgeAndWrap: PROC [] ~ TRUSTED INLINE {
    prune: BOOL ← oIndex >= h.oPrunePos;
    IF oIndex >= oBufSize THEN {
        cWindow[cIndex] ← oIndex ← oIndex - oBufSize;
        h.oPrunePos ← h.oPrunePos - oBufSize;
    };
    IF prune THEN {
        IO.UnsafePutBlock[h.outputStream, [count: h.outCount * bytesPerWord, base:
            LOOPHOLE[@h.outBuf[1]]]];
        h.outCount ← 0;
        *If any leaves are purged, cause the cStopPos conditional to be executed before the next
        codeword is generated to recompute the encoding.*
        cStopPos ← PruneCWindow[h, oIndex, cIndex, cStopPos];
    };
    oStopPos ← MIN[h.oPrunePos, oBufSize];
};

FOR i: CARDINAL IN [startIndex .. startIndex + count) DO
    char ← BufW[oBufIndexer, oIndex + depth, base[i]];
    {
        *This inner loop is repeated if a literal is continued after a depth = 2 Copy. In this
        situation, the second character of the copy has to be reprocessed before going on to a
        new character.*
        DO
        {
            *Note that checking for oIndex >= oBufSize isn't required on every character
            because oBufIndexer automatically wraps the value back to 0 unless it is more
            than 64k characters too large. A separate onLeafArc BOOLEAN is needed
            here because scan.depth doesn't exist in leaves.*
            IF onLeafArc THEN {
                IF depth = maxCopyLength THEN { --*Cut-off*
                    *If a match exists to the cut-off depth, replace the arc to the cut-off leaf
                    by an arc to the new leaf. Removal avoids indefinitely long HT collision
                    lists by limiting each node to 256 sons, each beginning with a different
                    character. Attach the removed leaf to the root.*
                    ReplaceArc[LOOPHOLE[leaf, Node], scan];
                    previous ← leaf.parent;
                    scan.next ← scan;
                    scan.parent ← h.root;
                }
                ELSE GO TO arcExtension;
            }
            ELSE IF scan.depth = depth THEN { --*At a node*
                previous ← scan;
                parent ← LOOPHOLE[@hashTable[Hash[previous, char]], Node];
                *It is not ok to do scan.cposition ← cIndex here: if that were done, and a
                Flush is issued before the new leaf is put into the tree, then RemoveLeaf*

*could eventually crash due to not finding the expected leaf.*
FOR scan ← parent.next, scan.next WHILE scan # parent DO
    IF previous = scan.parent THEN {
        *Found an arc scan going deeper in the tree. This address arithmetic is the result of eliminating the cposition and depth fields in leaves to save storage.*
        leafPos: INT ← LOOPHOLE[scan, INT] - LOOPHOLE[leaves, INT]:
        IF LOOPHOLE[HighHalf[leafPos], INTEGER] >= 0 THEN {
            *scan = leafarc: leafPos / leafSize gives long divide trap here.*
            cCopyMark ← Basics.LongDiv[LOOPHOLE[leafPos, CARD32], leafSize]:
            onLeafArc ← TRUE:
            }
        ELSE cCopyMark ← scan.cposition:
        depth ← depth + 1: GO TO outerLoop:
        }:
    ENDLOOP:
    *Match ends exactly at the node previous.*
    previous.sons ← previous.sons + 1:
    NewArc[hashTable, LOOPHOLE[leaf, Node], previous, char]:
    }
ELSE GO TO arcExtension: --*On a node arc*
EXITS
    arcExtension => {
        *Note that checking for oIndex >= oBufSize isn't required on every character because oBufIndexer automatically wraps the value back to 0 unless it is more than 64k characters too large.*
        IF char = (achar ← BufR[oBufIndexer, cWindow[cCopyMark] + depth]) THEN {
            depth ← depth + 1: GO TO outerLoop:
            }:
        *Arc termination. Allocate a new tree node and substitute it in the HT for the arc to the leaf scan: it has parent=previous, cposition=cIndex, depth=depth. Then hang the leaf scan from this new node.*
        h.freeList ← (previous ← h.freeList).next:
        previous.depth ← depth:
        *node.sons is always 2 when node is put on the free list.*
        ReplaceArc[previous, scan]:
        NewArc[hashTable, scan, previous, achar]:
        NewArc[hashTable, LOOPHOLE[leaf, Node], previous, char]:
        }:
}:

*cposition update was not done during the descent because, if a Flush had occurred, there would be no leaf at that cposition: so cposition update is postponed until here, when a leaf has been put in the tree.*
DO --*Update cpositions starting with the longest match*
    previous.cposition ← cIndex:
    previous ← previous.parent:
    IF previous.depth <= 1 THEN EXIT:
ENDLOOP:

*Execute a single conditional branch for all unusual events associated with cposition. cStopPos holds the earliest cposition at which something must be done. One thing is that cIndex must be wrapped back to 0 when it counts up to maxCopyDisp. and leaf must be set back to @leaves[0]. In addition, h.allLeavesInUse ← TRUE must happen when cIndex = h.cOldPos + 1 (h.cOldPos holds the oldest in-use cposition: the oStopPos conditional code below purges any cpositions which point into the oBuffer area about to be overwritten with new text: after purging, the oldest in-use cposition is in cOldPos and h.allLeavesInUse = FALSE.). Finally, the encoding of the cWindow displacement field of copy codewords changes as a function of the number of cpositions presently in use: the encoding must be recomputed at appropriate times.*

```
IF (cIndex ← cIndex + 1) = cStopPos THEN {
    IF cIndex = maxCopyDisp THEN cIndex ← 0;
    leaf ← @leaves[cIndex];
    IF NOT h.allLeavesInUse THEN [h.dispStart, cStopPos, h.allLeavesInUse,
        h.lastNVals] ← ComputeEncoding[cIndex, h.cOldPos]
    ELSE cStopPos ← maxCopyDisp;
    }
ELSE leaf ← leaf + leafSize;
```

*Remove the oldest leaf, if the window is full: otherwise, this is a no-op that removes an unused leaf from the root. PruneCWindow periodically sets the root's .sons field to a large value so that the root won't be deleted.*

```
--RemoveLeaf[h, leaf];
RemoveArc[leaf];
IF (parent ← leaf.parent).sons = 2 THEN {
    oldchar: BYTE ← BufR[oBufIndexer, cWindow[parent.cposition] +
        parent.depth];
    otherSon: Node;
    scan ← LOOPHOLE[@hashTable[Hash[parent, oldchar]], Node];
    FOR otherSon ← scan.next, otherSon.next UNTIL parent = otherSon.parent
        DO
        scan ← otherSon;
        ENDLOOP;
    scan.next ← otherSon.next;
    ReplaceArc[otherSon, parent];
    parent.next ← h.freeList; --Finally free parent.
    h.freeList ← parent;
    }
ELSE parent.sons ← parent.sons - 1;
```

*Advance the window pointer. Store the cposition for the next codeword or literal character. oIndex is fixed up below if oIndex >= oBufSize.*
oIndex ← cWindow[cIndex] ← oIndex + depth;

*No match: either increase literal by 1 character or output the accumulated literal and copy codewords. The most recent character (which didn't match) is at oIndex.*

*Buffer purging and encoding changes must occur only between Copy codewords, so the expander can do the same thing when decoding. The encoding is recomputed as necessary in the cStopPos conditional above as a function of the number of cpositions in use at the onset of the copy: the recomputation must not depend on anything that occurs during the copy body, which the expander cannot anticipate. Since the number of cpositions is reduced only when PurgeAndWrap is called in the oStopPos conditional below, after codeword generation, the expander can duplicate this action by pruning and recomputing the codeword configuration immediately before decoding a codeword. Because the literal encoding does not vary, PurgeAndWrap can be called during literal construction. If the literal encoding were also subject to change, it would be necessary to preserve coding parameters after each codeword so that, if the next codeword is a literal, it can be coded correctly.*

```
IF depth >= 3 THEN {   --Long enough for a copy
    IF litLen # 0 THEN {
        OutputLiteral[h, litLen, litLen + depth, oIndex]; litLen ← 0;
        Both a depth = 2 copy and another literal are impossible after a literal <
            maxLitLength long, so shift the length encoding down 2.
        depth ← depth - 2;
        };
    Fall through to make a copy codeword.
    }
ELSE IF (depth # 2) OR (litLen # 0) THEN {   --Continue or start a literal
    IF (litLen ← litLen + 1) = maxLitLength THEN {   --depth = 1 or 2
        The character at oIndex - depth goes in a literal; output a literal codeword if
            maxLitLength has been reached.
        OutputLiteral[h, litLen, litLen + depth - 1, oIndex]; litLen ← 0;
        };
    IF depth = 2 THEN {
        The depth = 2 match began at oIndex-2; the character at oIndex - 2 is now
            added to the literal; rescan the character at oIndex - 1.
        IF (oIndex ← cWindow[cIndex] ← oIndex - 1) >= oStopPos THEN
            PurgeAndWrap[];
        scan ← @nodes[BufR[oBufIndexer, oIndex]];
        depth ← 1;
        onLeafArc ← FALSE;
        LOOP;   --Repeat main loop with the same character
        };
    EXIT;
    };
EncodeVar[h, depth - 1, lenStart, lenStep, lenLast];
EncodeSVar[h, cCopyMark, cIndex];
EXIT;
ENDLOOP;
scan ← @nodes[char];   --for the next iteration
depth ← 1;
onLeafArc ← FALSE;
IF oIndex >= oStopPos THEN PurgeAndWrap[];
EXITS
    outerLoop => {};
```

```
        };
    ENDLOOP;

h.cIndex ← cIndex;
    h.cCopyMark ← cCopyMark;
    h.cStopPos ← cStopPos;
    h.oIndex ← oIndex;
    h.oStopPos ← oStopPos;
    h.scan ← scan;
    h.depth ← depth;
    h.litLen ← litLen;
    h.onLeafArc ← onLeafArc;
    };

CSPutChar: PROC [self: IO.STREAM, char: CHAR] = TRUSTED {
    buff: PACKED ARRAY [0..1] OF CHAR;
    buff[0] ← char;
    CSUnsafePutBlock[self, [base: LOOPHOLE[LONG[@buff]], startIndex: 0, count: 1]];
    };
```

*h.outRemainder holds the accumulated bits [0..h.outState) in the output word being built.*
*h.outState is the bit position where the next output value will be written*
*(or, equivalently, the no. valid bits in h.outRemainder).*
*code is a right-justified value being output.*
*nbits is the length of the new value. $0 <= n <= 16$.*

```
Output: PROC [h: CompressStreamData, code, nbits: CARDINAL] ~ TRUSTED INLINE {
    outState: INTEGER;
    IF (outState ← nbits + h.outState - bitsPerWord) >= 0 THEN {
        Complete the output word being built in h.outRemainder, write it into h.outBuf, and start a
        new word in h.outRemainder.
        h.outBuf[h.outCount ← h.outCount + 1] ← h.outRemainder + BITSHIFT[code, -
            outState];
        h.outRemainder ← BITSHIFT[code, bitsPerWord - (h.outState ← outState)];
        }
    ELSE { --Add code (shifted left) to the remainder
        h.outRemainder ← h.outRemainder + BITSHIFT[code, -outState];
        h.outState ← outState + bitsPerWord;
        };
    };

EncodeVar: PROC [h: CompressStreamData, out, start, step, last: CARDINAL] ~ TRUSTED
INLINE {
    UNTIL out <= Power2M1[start] DO
        Output[h, 1, 1];
        out ← out - Power2[start];
        start ← start + step;
        ENDLOOP;
    IF start < last THEN Output[h, out, start + 1]
    ELSE Output[h, out, start];
    };
```

EncodeSVar: PROC [h: CompressStreamData, cCopyMark, cIndex: cIndexType] ~ TRUSTED
INLINE {
  *out = relative cposition for the codeword.*
  out: CARDINAL ← (IF cIndex >= cCopyMark + 2 THEN cIndex - cCopyMark - 2 ELSE
    cIndex - cCopyMark - 2 + maxCopyDisp);
  start: CARDINAL ← h.dispStart;
  last: CARDINAL ← start + sdispLast - sdispStart;
  UNTIL out <= Power2M1[start] DO
    Output[h, 1, 1];
    out ← out - Power2[start];
    start ← start + sdispStep;
    ENDLOOP;
  IF start < last THEN Output[h, out, start + 1]
  ELSE {
    *The start and last parameters are controlled so that the number of values represented by
    the progression is sufficient but not excessive; however, it is possible for only 1 value to be
    needed in the largest field, even though last bits are reserved for it in the progression.
    Unused codes are used to reduce the output size of the largest field. Here, nv is the
    number of values which must be coded in the largest field, out is the value to be coded,
    and start is the field size determined by the progression; decrement start until it contains
    no excess values; then x ← Power2[start] - nv is the number of free values in the field of
    size start bits; out in [0 .. x) are coded in start - 1 bits, while [x .. nv) are coded in start
    bits.*
    x: CARDINAL;
    nv: CARDINAL ← IF h.allLeavesInUse THEN maxCopyDisp - 1 - h.lastNVals ELSE ((IF
        cIndex >= h.cOldPos + 1 THEN cIndex - 1 ELSE cIndex - 1 + maxCopyDisp)
        - h.cOldPos - h.lastNVals);
    WHILE Power2M1[start - 1] >= nv DO start ← start - 1; ENDLOOP;
    IF out < (x ← Power2M1[start] - nv + 1) THEN Output[h, out, start - 1]
    ELSE Output[h, out + x, start];
    };
  };

OutputLiteral: PROC [h: CompressStreamData, litLen, litDisp: CARDINAL, oIndex:
      oIndexType] = TRUSTED {
  litPos: oIndexType ← IF oIndex < litDisp THEN oIndex + oBufSize - litDisp ELSE oIndex -
      litDisp;
  val, bits: CARDINAL;
  [val, bits] ← litLenMap[litLen];
  Output[h, val, bits];
  --Output[h, 0, lenStart + 1]; = *EncodeVar[h, 0, lenStart, lenStep, lenLast]*
  --EncodeVar[h, litLen - 1, litStart, litStep, litLast];
  Output[h, BufR[@h.oBufIndexer, litPos], 8];
  FOR I: CARDINAL IN [1..litLen) DO
    ****Wrap check not needed with oBufIndexer*
    --litPos ← IF litPos = oBufSize - 1 THEN 0 ELSE litPos + 1;
    litPos ← litPos + 1;
    Output[h, BufR[@h.oBufIndexer, litPos], 8];
    ENDLOOP;
  };

*The purpose of Flush is to render codewords for all characters eaten by the compressor but not encoded and to 16-bit-align the output stream. The particular implementation must represent 1 or more characters with each Pad codeword to avoid an ambiguous end-of-stream check during expansion. (If regular copy and literal codewords were used followed by a zero-length Pad, then the expander could not use the existence of another code byte in the Output stream as proof that at least 1 more character remains to be decoded: instead it would have to decode the next codeword(s) until a non-zero length is obtained or end-of-stream is reached: consequently, the decoding would have to be done by a subroutine, slowing everything down.)*

*The 16-bit alignment property of Pad codewords also lets the expander know there is another codeword whenever, at the onset of decoding a codeword, input is not aligned at a 16-bit boundary. If there is at least 1 more byte to decode at a 16-bit boundary, then the expander can get 2 more without fear of blocking indefinitely or encountering endOfStream because it knows that the compressor at the other end of a communication stream will not dismiss for a long time without producing a Pad codeword.*

*At the end of the last PutChar or UnsafePutBlock, depth was $>= 1$; depth $= 0$ only occurs at initialization or after a Flush, when h.litLen $= 0$ and output is already 16-bit aligned. So codewords are produced here only when depth $>= 1$. First, produce a literal codeword for h.litLen characters swallowed by the compressor but not yet represented in the output. Then align the output file at a 16-bit boundary with a Pad codeword. Finally, dump the output buffer and prepare to compress more characters.*

*Note that the codeword preceding a Pad has put a leaf in the tree that begins with the first character covered by the Pad, so that character must appear in the buffer. The cposition consumed by the Pad codeword is an ugly wart on the encoding because no subsequent codeword will ever use it. In addition, it requires code here to remove the leaf for that cposition from the tree. This cposition was wasted so that the expander's decoding job is easier and so that the expander won't have to handle the situation of an indefinitely long sequence of Pads overwriting the entire window.*

CSFlush: PROC [self: IO.STREAM] = TRUSTED {
   h: CompressStreamData ← LOOPHOLE[NARROW[self.streamData,
       CountedVM.Handle].pointer];
   depth: CARDINAL;
   extraCount: CARDINAL ← 0;

IF (depth ← h.depth) # 0 THEN {
      *The compressor has consumed but not produced codewords for h.litLen literal characters followed by a partial copy of length 1 or more. The tree has been updated for the literal characters and cWindow[cIndex] was updated for the partial copy. No leaf is created for the partial copy, but a cposition is allocated and the old leaf removed, just as for a regular copy codeword.*
      litLen: CARDINAL;
      cIndex: cIndexType;
      oIndex: oIndexType;
      cWindow: cWindowArray ← LOOPHOLE[h, LONG POINTER] + cWindowOffset;
      leaves: leafArray ← LOOPHOLE[h, LONG POINTER] + leavesOffset;
      *Finish removing the leaf for the current value of h.cIndex because no leaf will be in the tree for the partial match represented by the Flush. Waste this leaf so that the expander can duplicate this case easily. Also, if a cposition was not consumed here, then a sequence of <partial copy, flush> repeated over and over could result in a full oBuffer and*

*an empty cWindow: the purging code would fail. Changes would be needed to deal with this problem.*
leaf: Leaf ← @leaves[h.cIndex];
leaf.next ← LOOPHOLE[leaf, Node];
leaf.parent ← h.root;

IF (h.cIndex ← cIndex ← h.cIndex + 1) = h.cStopPos THEN {
    IF cIndex = maxCopyDisp THEN h.cIndex ← cIndex ← 0;
    IF NOT h.allLeavesInUse THEN [h.dispStart, h.cStopPos, h.allLeavesInUse,
      h.lastNVals] ← ComputeEncoding[cIndex, h.cOldPos]
    ELSE h.cStopPos ← maxCopyDisp;
    };
RemoveLeaf[h, @leaves[cIndex]];
cWindow[cIndex] ← h.oIndex ← oIndex ← h.oIndex + depth;

*Output a Literal codeword for accumulated literal characters followed by a Pad codeword for the partial copy of length [1..maxCopyLength].*
IF (litLen ← h.litLen) # 0 THEN {
    OutputLiteral[h, litLen, litLen + depth, oIndex]; h.litLen ← 0;
    };
*Pad is coded as all 1's in the largest indicator field for the len field. The len field of the Pad codeword signifies 1 or [2..maxCopyLength] characters. In both cases, no leaf is put in the tree and, even though a cposition is consumed, it does not appear in the tree.*
Output[h, padLenIndicator, lenLast - lenStart];
EncodeVar[h, depth - 1, lenStart, lenStep, lenLast];
IF depth = 1 THEN { --*Pad literal*
    litPos: oIndexType ← oIndex - 1;
    char: BYTE ← BufR[@h.oBufIndexer, litPos];
    Output[h, char, 8];
    }
ELSE EncodeSVar[h, h.cCopyMark, cIndex]; --*Pad copy*

*Pad to 16-bit boundary; try to code this to work on both 16 and 32-bit machines; the compiler should suppress false arms of the conditionals.*
IF h.outState # 0 THEN h.outBuf[h.outCount ← h.outCount + 1] ← h.outRemainder;
IF bytesPerWord = 4 THEN {
    extraCount ← IF h.outState > 16 THEN 0 ELSE (bytesPerWord - 2);
    }
ELSE IF bytesPerWord # 2 THEN BugTrap[];

*The oStopPos activities postponed for a partial copy have to be checked here because the previous call to PruneCWindow allowed for only one copy codeword in the worst case and because the expander will do a Purge.*
IF oIndex >= h.oStopPos THEN {
    prune: BOOL ← oIndex >= h.oPrunePos;
    IF oIndex >= oBufSize THEN {
      cWindow[cIndex] ← oIndex ← h.oIndex ← oIndex - oBufSize;
      h.oPrunePos ← h.oPrunePos - oBufSize;
      };
    IF prune THEN h.cStopPos ← PruneCWindow[h, oIndex, cIndex, h.cStopPos];

```
            h.oStopPos ← MIN[h.oPrunePos, oBufSize];
        };
```

*Begin scanning next time at the root with depth = 0 and litLen = 0.*
```
        h.depth ← 0;
        h.scan ← LOOPHOLE[h, LONG POINTER] + rootOffset;
        h.onLeafArc ← FALSE;
        }
    ELSE IF h.litLen # 0 THEN BugTrap[]
    ELSE IF (h.outState # 0) AND (h.outState # 16) THEN BugTrap[];
```

*Dump the output buffer*
```
    IO.UnsafePutBlock[h.outputStream, [count: (h.outCount * bytesPerWord) - extraCount,
        base: LOOPHOLE[@h.outBuf[1]]]];
    h.outCount ← h.outRemainder ← h.outState ← 0;
    };
```

```
CSClose: PROC [self: IO.STREAM, abort: BOOL ← FALSE] = TRUSTED {
    ch: CountedVM.Handle ← NARROW[self.streamData];
```
*Explicitly freeing storage avoids swap out: the Collector reclaims only the Handle.*
```
    CountedVM.Free[ch];
    };
```

Expand

```
expandStreamProcs: REF IO.StreamProcs ← IO.CreateStreamProcs[
    variety: $input,
    class: $Expand,
    getChar: ESGetChar,
    unsafeGetBlock: ESUnsafeGetBlock,
    endOf: ESEndOf,
    close: ESClose
    ];
```

*The [lo, hi] order is important here because oIndexType is LOOPHOLE'd into a CARD32 for comparison in PruneLeaves. Because our peculiar D-machines reverse the low and high halves of 32-bit quantities, this won't work correctly on 32-bit machines.*
```
eoIndexType: TYPE = RECORD [lo, hi: CARD16];

inRefillBytes: CARDINAL = 512;

ExpandStreamData: TYPE = LONG POINTER TO ExpandStreamRec;
ExpandStreamRec: TYPE = RECORD [
    inputStream: IO.STREAM,
    inState: INTEGER ← 0,
    inRemainder: CARDINAL ← 0,
    inLast: CARDINAL ← 0,
    inRead: CARDINAL ← 0,
    inBlock: Basics.UnsafeBlock ← [startIndex: 2],
```

```
dispStart: CARDINAL ← TRASH,
lastNVals: CARDINAL ← TRASH,
allLeavesInUse: BOOLEAN ← FALSE,
copyLenOffset: CARDINAL ← 0, length: INTEGER ← 0, --remaining characters in current copy (positive) or literal (negative).

cIndex: cIndexType ← 0, --current cWindow position.
cOldPos: cIndexType ← 0,
cStopPos: cIndexType ← 1, oIndex: eoIndexType ← [lo: LAST[CARD16], hi: 0], --oBuffer pos. at which next input char.
        goes.
oCopyMark: eoIndexType ← [lo: 0, hi: 0], --oBuffer pos. of copy currently being expanded oStopPos: CARDINAL ← oBufReserve - 1,
oPrunePos: CARDINAL ← oBufReserve - 1, The oBufIndexer krock bypasses the compiler's 32,768 or 65,536 implementation limit.
oBufIndexer: ARRAY [0..32) OF LONG POINTER TO Basics.RawBytes ← ALL[NIL],
inFrom: PACKED ARRAY [0..inRefillBytes / 2] OF CARD16 ← ALL[TRASH]
];
ecWindowArray: TYPE = LONG POINTER TO ARRAY [0..maxCopyDisp) OF eoIndexType;

eoBufferOffset: INT = SIZE[ExpandStreamRec];
ecWindowOffset: INT = eoBufferOffset + ((oBufSize + maxCopyLength) / bytesPerWord);
expanderStorageSize: INT = ecWindowOffset + LONG[maxCopyDisp] * SIZE[eoIndexType];

CreateDecodingStream: CodeControl.CreateDecoderProc = TRUSTED {
    PROC [input: IO.STREAM, methodState: REF] RETURNS [decodeStream: IO.STREAM]
    ch: CountedVM.Handle ← CountedVM.Allocate[expanderStorageSize];
    h: ExpandStreamData ← LOOPHOLE[ch.pointer];
    cWindow: ecWindowArray ← LOOPHOLE[h, LONG POINTER] + ecWindowOffset;
    IF methodState # NIL THEN ERROR CodeControl.BadCodingMethod["methodState not
        NIL"];
    h↑ ← [inputStream: input];
    h.inBlock.base ← LOOPHOLE[@h.inFrom];
    FOR I: CARDINAL IN [0..oBufHighOvf + oBufHighOvf] DO
        h.oBufIndexer[I] ← LOOPHOLE[h, LONG POINTER] + eoBufferOffset + (I *
        LONG[(32768 / bytesPerWord)]);
        ENDLOOP;
    RETURN[IO.CreateStream[streamProcs: expandStreamProcs, streamData: ch]];
};

ESUnsafeGetBlock: PROC [self: IO.STREAM, block: Basics.UnsafeBlock] RETURNS
        [nBytesRead: INT] = TRUSTED { base: LONG POINTER TO Basics.RawBytes ← LOOPHOLE[block.base];
    startIndex: CARDINAL ← block.startIndex; --Will bounds-check
``` count: CARDINAL ← (nBytesRead ← block.count);

h: ExpandStreamData ← LOOPHOLE[NARROW[self.streamData.
        CountedVM.Handle].pointer];
cWindow: ecWindowArray ← LOOPHOLE[h, LONG POINTER] + ecWindowOffset;
oBufIndexer: LONG POINTER TO ARRAY [0..32) OF LONG POINTER TO Basics.RawBytes ←
        @h.oBufIndexer;

length: INTEGER ← h.length;
copyLenOffset: CARDINAL ← h.copyLenOffset;
cIndex: cIndexType ← h.cIndex;
cStopPos: cIndexType ← h.cStopPos;

oIndex: eoIndexType ← h.oIndex;
oIndexPtr: LONG POINTER TO Basics.RawBytes ← oBufIndexer[oIndex.hi];
oCopyMark: eoIndexType ← h.oCopyMark;
oCopyPtr: LONG POINTER TO Basics.RawBytes ← oBufIndexer[oCopyMark.hi];
oStopPos: CARDINAL ← h.oStopPos;

code: CARDINAL;

inputStream: IO.STREAM ← h.inputStream;
inRemainder: CARDINAL ← h.inRemainder;
inState: INTEGER ← h.inState;
inRead: CARDINAL ← h.inRead;
inLast: CARDINAL ← h.inLast;
inFrom: LONG POINTER TO PACKED ARRAY [0..256] OF CARD16 ← LOOPHOLE[@h.inFrom];

*PruneEWindow, analogous to the compressor's PruneCWindow, is conditionally called in the
oStopPos conditional to prune tree leaves just enough that during the next oBufReserve
characters, no characters needed by the tree will be overwritten. Since Literal and Pad literal
coding does not vary, it is not harmful for the compressor to prune cpositions before coding a
literal, while the expander prunes cpositions after decoding. However, both the compressor
and expander must have pruned cpositions identically at the time of encoding/decoding a
Copy or Pad copy. cIndex and oIndex are the cposition and oposition of the next codeword
or literal character.*
PruneEWindow: PROC [h: ExpandStreamData, oIndex: eoIndexType, cIndex, cStopPos:
        cIndexType] RETURNS [cIndexType] ~ TRUSTED {

PruneLeaves: PROC [h: ExpandStreamData, toPosLow, toPosHigh: eoIndexType,
            cOldPos: cIndexType] RETURNS [cIndexType] ~ TRUSTED {
        cWindow: ecWindowArray ← LOOPHOLE[h, LONG POINTER] + ecWindowOffset;
        WHILE LOOPHOLE[cWindow[cOldPos], CARD32] IN [LOOPHOLE[toPosLow,
          CARD32]..LOOPHOLE[toPosHigh, CARD32]) DO
            cOldPos ← IF cOldPos = maxCopyDisp - 1 THEN 0 ELSE (cOldPos + 1);
            ENDLOOP;
        RETURN[cOldPos];
        };

toPosLow, toPosHigh: eoIndexType;

```
cOldPos, origcOldPos: cIndexType;
cOldPos ← origcOldPos ← IF h.allLeavesInUse THEN (IF cIndex = maxCopyDisp - 1
   THEN 0 ELSE (cIndex + 1)) ELSE h.cOldPos;
toPosLow ← oIndex;
IF (toPosHigh.lo ← toPosLow.lo + maxCopyLength + oBufReserve) >= 100000B
   THEN {
      toPosHigh.hi ← toPosLow.hi + 1;
      toPosHigh.lo ← toPosHigh.lo - 100000B;
      }
ELSE toPosHigh.hi ← toPosLow.hi;
IF toPosHigh.hi >= (oBufHighOvf + oBufHighOvf) THEN {
   cOldPos ← PruneLeaves[h, toPosLow, [lo: 0, hi: oBufHighOvf + oBufHighOvf],
      cOldPos];
   toPosLow ← [lo: 0, hi: 0];
   toPosHigh.hi ← 0;
   };
h.oPrunePos ← oIndex.lo + oBufReserve;
IF (h.cOldPos ← PruneLeaves[h, toPosLow, toPosHigh, cOldPos]) # origcOldPos THEN
      {
      h.allLeavesInUse ← FALSE; cStopPos ← cIndex + 1;
      };
RETURN[cStopPos];
};
```

*A tricky problem here is how to simultaneously get bytes efficiently, raise EndOfStream at the correct time, avoid blocking for bytes that aren't available, and work efficiently on both 16 and 32-bit word size machines. Because the compressor on the other end of a communication stream has done a Flush prior to dismissing for a "long time" and because a Flush is issued immediately before EndOfStream, it is safe to obtain input in 16-bit units. For file streams, it is reasonable to keep asking for large blocks until EOF, but for terminal streams it would be a poor idea to ask for a large block of input which might not become available for an indefinite period. However, on terminal streams, CharsAvail[inputStream] returns a conservative estimate of the no. bytes that can be obtained quickly from the stream, so the code here will not ask for too many (rounding up to an even no. is ok because of the 16-bit alignment restriction).*

```
FillInputBuffer: PROC [] RETURNS [] ~ TRUSTED {
   CharsAvail returns # 0 at EndOfStream; otherwise, it returns a conservative estimate of
   the no. bytes that can be obtained quickly without waiting.
   count: CARDINAL;
   IF (count ← MIN[IO.CharsAvail[inputStream], inRefillBytes]) < 2 THEN count ← 2
   ELSE count ← BITAND[count + 1, LAST[CARDINAL] - 1]; --round up to an even no.
   h.inBlock.count ← count;
   count ← LowHalf[IO.UnsafeGetBlock[inputStream, h.inBlock]];
   IF BITAND[count, 1] # 0 THEN IO.Error[SyntaxError, inputStream] --Odd byte length
      => missing Pad?
   ELSE IF count < 2 THEN ERROR IO.EndOfStream[inputStream];
   inLast ← BITSHIFT[count, -1];
   inRead ← 0;
   };
```

*code ← nBits bits right-justified (0 <= nBits <= 16).*
*inState is the number of left-justified bits left in inRemainder.*
*inRemainder has inState bits left-justified, zeroes in the rest of the word.*
Input: PROC [nBits: NAT] RETURNS [code: CARDINAL] ~ TRUSTED INLINE {
   code ← BITSHIFT[inRemainder, nBits - bitsPerWord];
   IF (inState ← inState - nBits) >= 0 THEN {
     inRemainder ← BITSHIFT[inRemainder, nBits];
     }
   ELSE {
     IF inRead = inLast THEN FillInputBuffer[];
     inRemainder ← inFrom[inRead ← inRead + 1];
     code ← BITSHIFT[inRemainder, -(inState ← inState + 16)] + code;
     inRemainder ← BITSHIFT[inRemainder, bitsPerWord - inState];
     };
   };

DecodeVar: PROC [start, step, last: CARDINAL] RETURNS [in: CARDINAL ← 0] ~ TRUSTED
INLINE {
   UNTIL Input[1] = 0 DO
     in ← in + Power2[start];
     IF (start ← start + step) = last THEN EXIT;
     ENDLOOP;
   in ← in + Input[start];
   };

*DecodeLVar[] = DecodeVar[lenStart, lenStep, lenLast] + copyLenOffset with special*
*treatment for Pad codewords when start reaches lenLast.*
DecodeLVar: PROC [] RETURNS [in: CARDINAL ← copyLenOffset, padInd: BOOL ← FALSE] ~
TRUSTED INLINE {
   start: CARDINAL ← lenStart;
   UNTIL Input[1] = 0 DO
     in ← in + Power2[start];
     IF (start ← start + lenStep) = lenLast THEN {
       padInd ← TRUE; start ← lenStart; copyLenOffset ← in ← 0; LOOP;
       };
     ENDLOOP;
   in ← Input[start] + in;
   };

*DecodeSVar = DecodeVar[h.dispStart, sdispStep, h.dispLast] + 2 with special treatment to*
*remove excess bits from the encoding of the largest field.*
DecodeSVar: PROC [] RETURNS [in: CARDINAL ← 2] ~ TRUSTED INLINE {
   start: CARDINAL ← h.dispStart;
   last: CARDINAL ← start + sdispLast - sdispStart;
   UNTIL Input[1] = 0 DO
     in ← in + Power2[start];
     IF (start ← start + sdispStep) = last THEN {
       *This is the tricky case. As the progression phases in, ComputeEncoding will be*
       *called to increment h.dispStart at precisely the correct time: for example,*
       *immediately before a transition suppose that a <3, 2, 7> unary code was used with*
       $2\uparrow3 + 2\uparrow5 + 2\uparrow7 = 168$ *values. Immediately after the step to the next larger*

*size, 169 values must be coded in a <4, 2, 8> progression with 2↑4 + 2↑6 + 2↑8 = 336 values: but only 89 values are needed in the largest 8-bit field. This code first determines nv, the number of values coded in the largest field: then it shrinks the field to the smallest size that covers the values (in this case, to 7 bits) and computes y, the no. free values in the reduced field. Finally, it decodes a field of size start - 1 for the smallest y values or of size start for the others.*

```
        x, y: CARDINAL;
        nv: CARDINAL ← IF h.allLeavesInUse THEN maxCopyDisp - 1 - h.lastNVals ELSE
                ((IF cIndex >= h.cOldPos + 1 THEN cIndex - 1 ELSE cIndex - 1 +
                maxCopyDisp) - h.cOldPos - h.lastNVals);
        WHILE Power2[start - 1] > nv DO start ← start - 1; ENDLOOP;
        x ← Input[start - 1];
        in ← in + (IF x >= (y ← Power2M1[start] - nv + 1) THEN x + x - y + Input[1]
                ELSE x);
        RETURN;
        };
    ENDLOOP;
    in ← in + Input[start];
    };

FOR i: CARDINAL IN [startIndex .. startIndex + count) DO
    ENABLE IO.EndOfStream => {
        nBytesRead ← i - startIndex;
```
*Check for EndOfStream raised when more literal characters are expected.*
```
        IF (length # 0) THEN IO.Error[SyntaxError, inputStream];
        EXIT;
        };
    IF length > 0 THEN { --Copy
```
*Note that either oIndex or oCopyMark may overflow beyond oBufSize during a copy, so no overflow checks are needed here: if oIndex overflows, the excess bytes will be copied back to the beginning before the next codeword; if oCopyMark overflows, then enough bytes were copied to the overflow area before starting the copy.*
```
        length ← length - 1;
        base[i] ← oIndexPtr[oIndex.lo - LOOPHOLE[length, CARDINAL]] ←
                oCopyPtr[oCopyMark.lo - LOOPHOLE[length, CARDINAL]];
        }
    ELSE {
        IF (oIndex.lo ← LOOPHOLE[oIndex.lo + 1]) >= oStopPos THEN {
            prune: BOOL ← oIndex.lo >= h.oPrunePos;
            IF oIndex.lo >= 100000B THEN {
                oIndex.lo ← oIndex.lo - 100000B;
                h.oPrunePos ← h.oPrunePos - 100000B;
                IF (oIndex.hi ← oIndex.hi + 1) >= (oBufHighOvf + oBufHighOvf) THEN {
```
*Copy overflow bytes back to the beginning of oBuffer.*
```
                    oBuffer: LONG POINTER TO Basics.RawBytes ← oBufIndexer[0];
                    oBufferHi: LONG POINTER TO Basics.RawBytes ←
                            oBufIndexer[oBufHighOvf + oBufHighOvf];
                    oIndex.hi ← 0;
                    FOR I: CARDINAL IN [0..oIndex.lo) DO oBuffer[I] ← oBufferHi[I];
                        ENDLOOP;
```

```
      };
   oIndexPtr ← oBufIndexer[oIndex.hi];
      };
   IF prune THEN cStopPos ← PruneEWindow[h, oIndex, cIndex, cStopPos];
   oStopPos ← MIN[h.oPrunePos, 100000B];
      };
```
*It's ok to smash cWindow[cIndex] (after calling PruneEWindow) because the compressor removed the oldest cWindow position from its tree before looking for the longest match, so the smashed value will not be used.*
```
cWindow[cIndex] ← oIndex;
IF (cIndex ← cIndex + 1) = cStopPos THEN {
   IF cIndex = maxCopyDisp THEN cIndex ← 0;
   IF NOT h.allLeavesInUse THEN [h.dispStart, cStopPos, h.allLeavesInUse,
      h.lastNVals] ← ComputeEncoding[cIndex, h.cOldPos]
   ELSE cStopPos ← maxCopyDisp;
      };
IF length = 0 THEN {  --Expand next codeword
```
*Determine parameters for the next Literal, Copy, or Pad codeword: length ← copy length - 1 on a Copy or Pad copy, - literal length + 1 on a Literal or Pad literal: oCopyPtr[oCopyMark.lo] is the absolute window position for a copy. Give IO.EndOfStream error (via the Input subroutine) if no codewords are left.*
```
padInd: BOOL;
[length, padInd] ← DecodeLVar[];

IF length = 0 THEN {
   IF NOT padInd THEN {
      length ← - DecodeVar[litStart, litStep, litLast];
      IF length # - maxLitLength + 1 THEN copyLenOffset ← 2;
      oIndexPtr[oIndex.lo] ← base[i] ← Input[8];
      LOOP;
      }
   ELSE oIndexPtr[oIndex.lo] ← base[i] ← Input[8]; --Pad literal 1
   }
ELSE {
```
   *A copy or Pad Copy*
```
   code ← DecodeSVar[];
   oCopyMark ← cWindow[IF cIndex >= code THEN cIndex - code ELSE cIndex
      - code + maxCopyDisp];
   oCopyPtr ← oBufIndexer[oCopyMark.hi];
   base[i] ← oIndexPtr[oIndex.lo] ← oCopyPtr[oCopyMark.lo];
   oIndex.lo ← oIndex.lo + LOOPHOLE[length, CARDINAL];
```
   *An overflow check here avoids a check on every byte of the copy.*
```
   IF (oCopyMark.lo ← oCopyMark.lo + LOOPHOLE[length, CARDINAL]) >=
         100000B THEN {
      IF oCopyMark.hi = (oBufHighOvf + oBufHighOvf - 1) THEN {
```
         *Copy enough bytes from the beginning of oBuffer into the overflow area to satisfy the copy operation, so that the performance-critical copy loop doesn't have to check for buffer wrap-around on every byte. The copied bytes may be overwritten (before being read) if oIndex.lo also overflows during the copy. However, when oIndex has already recently*

*overflowed and been set back to 0, the copied bytes ahead of oIndex will be ancient garbage; then garbage bytes in the overflow area will not be updated ahead of the pointer. To fix this, first copy all valid bytes from the beginning of the buffer: then go back to the beginning of the copy and copy the rest that are needed. Since the first character has been copied without overflowing (because both oCopyMark and oIndex initially point inside [0..oBufSize)), the copied sequence begins with the first character after that.*

```
        count: CARDINAL ← oCopyMark.lo - 100000B + 1; --No. overflow
                bytes needed.
        oBuffer: LONG POINTER TO Basics.RawBytes ← oBufIndexer[0];
        oBufferHi: LONG POINTER TO Basics.RawBytes ←
                oBufIndexer[oBufHighOvf + oBufHighOvf];
        firstOld: CARDINAL ← oIndex.lo - length + 1;
        IF (oIndex.hi = 0) AND (firstOld < count) THEN {
            FOR I: CARDINAL IN [0..firstOld) DO
                oBufferHi[I] ← oBuffer[I];
                ENDLOOP;
            FOR I: CARDINAL IN [firstOld..count) DO
                oBufferHi[I] ← oCopyPtr[oCopyMark.lo - length + 1 - firstOld
                        + I];
                ENDLOOP;
            }
        ELSE FOR I: CARDINAL IN [0..count) DO
            oBufferHi[I] ← oBuffer[I]; ENDLOOP;
        };
        };
      IF NOT padInd THEN { copyLenOffset ← 0; LOOP; };
      };
```
*16-bit align the input stream for a Pad codeword.*
```
      IF bytesPerWord = 2 THEN IF Input[inState] # 0 THEN IO.Error[SyntaxError,
            inputStream]
        ELSE IF bytesPerWord = 4 THEN IF Input[BITAND[inState, 17B]] # 0 THEN
            IO.Error[SyntaxError, inputStream]
        ELSE BugTrap[];
        }
    ELSE { --Literal (length < 0)
        length ← length + 1;
        base[i] ← oIndexPtr[oIndex.lo] ← Input[8]; LOOP;
        };
    };
ENDLOOP;
h.length ← length;
h.cIndex ← cIndex;
h.cStopPos ← cStopPos;
h.oIndex ← oIndex;
h.oCopyMark ← oCopyMark;
h.oStopPos ← oStopPos;
h.inState ← inState;
h.inRemainder ← inRemainder;
h.inRead ← inRead;
h.inLast ← inLast;
h.copyLenOffset ← copyLenOffset;
```

```
        RETURN[nBytesRead];
    };

ESGetChar: PROC [self: IO.STREAM] RETURNS[echar: CHAR] = TRUSTED {
    buff: PACKED ARRAY [0..1] OF CHAR;
    IF ESUnsafeGetBlock[self, [base: LOOPHOLE[LONG[@buff]], startIndex: 0, count: 1]] = 0
        THEN
        ERROR IO.EndOfStream[self];
    RETURN[buff[0]];
    };
```

*EndOf returns FALSE until the current copy or literal is exhausted and EndOf[h.inputStream] has been reached.*
```
ESEndOf: PROC [self: IO.STREAM] RETURNS [BOOL] = TRUSTED {
    h: ExpandStreamData ← LOOPHOLE[NARROW[self.streamData,
            CountedVM.Handle].pointer];
    RETURN[(h.length = 0) AND (h.inRead = h.inLast) AND IO.EndOf[h.inputStream]];
    };

ESClose: PROC [self: IO.STREAM, abort: BOOL ← FALSE] = TRUSTED {
    ch: CountedVM.Handle ← NARROW[self.streamData];
```
*Explicitly freeing storage avoids swap out: the Collector reclaims only the Handle.*
```
    CountedVM.Free[ch];
    };
```

*Initialize litLenMap whose entries hold [literal length code, nbits].*
```
litLenMap[0] ← [0, 99]; --Never happens
litLenMap[1] ← [0, 4]; --000.0
litLenMap[2] ← [4B, 6]; --000.100
litLenMap[3] ← [5B, 6]; --000.101
FOR litLen: CARDINAL IN [4..7] DO --000.110xx
    litLenMap[litLen] ← [30B + litLen - 4, 8];
    ENDLOOP;
FOR litLen: CARDINAL IN [8..15] DO --000.1110xxx
    litLenMap[litLen] ← [160B + litLen - 8, 10];
    ENDLOOP;
FOR litLen: CARDINAL IN [16..31] DO --000.11110xxxx
    litLenMap[litLen] ← [740B + litLen - 16, 12];
    ENDLOOP;
FOR litLen: CARDINAL IN [32..63] DO --000.11111xxxxx
    litLenMap[litLen] ← [1740B + litLen - 32, 13];
    ENDLOOP;

IF oBufHighOvf >= 15 THEN BugTrap[]; --Must enlarge h.oBufIndexer table.
IF LowHalf[oBufSize] # 0 THEN BugTrap[];
```

*Register B2 with CodeControl's registry.*
```
CodeControl.RegisterCodingMethod[methodName, CreateEncodingStream,
    CreateDecodingStream, ... NIL, FALSE, FALSE, compressorStorageSize * bytesPerWord,
    expanderStorageSize * bytesPerWord, "General stream", "155219", "344695"];
```

Appendix E

*C2Impl.mesa*
*Copyright © 1987, 1988 by Xerox Corporation. All rights reserved.*

*This program is a stream version of the C2 data compression method developed by Dan Greene and Ed Fiala. It has maxCopyDisp leaves (or cpositions) and at most maxNodes nodes in its tree, and a character buffer of size oBufSize: since 16-bit CARDINALs hold cpositions, the implementation limit is maxCopyDisp = 65536 - 259. oBufSize can be very large and maxNodes can be chosen for the worst case, but to control storage, these parameters are usually chosen to satisfy most data without being excessively large. To produce the standard compressor at different window sizes, only the maxCopyDisp and methodName parameters are edited together with the two instances of the C2Impl program name: other parameters are defined as functions of maxCopyDisp.*

*A compression stream implements CreateEncodeStream and the IO.STREAM functions PutChar, UnsafePutBlock, Flush, and Close: data presented is encoded and written on the output stream. The compressor buffers its output until codewords representing oBufReserve (= 1024) or more source characters have accumulated: then it dumps the buffer using UnsafePutBlock[outStream]. IO.Flush outputs codewords for all characters presented to the compressor, finishing with a Pad codeword to align output at a 16-bit boundary: finally, it dumps the output buffer using UnsafePutBlock[outStream]: IO.Flush must be issued before doing IO.Close or the final characters presented to the compression stream will not be represented by a codeword: IO.Close releases the storage used during compression. IO.Flush on the compression stream does NOT flush outStream: clients must do that operation separately, if it is needed.*

*An expansion stream implements CreateDecodeStream and the IO.STREAM functions EndOf, GetChar, UnsafeGetBlock, and Close. In response to GetChar or UnsafeGetBlock, an expansion stream obtains input using UnsafeGetBlock and delivers the decoded data.*

```
DIRECTORY
    Basics USING [BITAND, BITSHIFT, bitsPerWord, BITXOR, bytesPerWord, LongDiv,
        LongNumber, RawBytes, UnsafeBlock],
    CodeControl USING [CreateEncoderProc, CreateDecoderProc, BadCodingMethod,
        RegisterCodingMethod],
    CountedVM USING [Allocate, Free, Handle],
    IO,
    PrincOpsUtils USING [LongZero],
    Rope USING [ROPE];

C2Impl: CEDAR PROGRAM
    IMPORTS Basics, CodeControl, CountedVM, IO, PrincOpsUtils
    = {

LongNumber: TYPE = Basics.LongNumber;
bytesPerWord: CARDINAL = Basics.bytesPerWord;
bitsPerWord: CARDINAL = Basics.bitsPerWord;
BITSHIFT: PROC [value: WORD, count: INTEGER] RETURNS [WORD] = Basics.BITSHIFT;
BITAND: PROC [WORD, WORD] RETURNS [WORD] = Basics.BITAND;
BITXOR: PROC [WORD, WORD] RETURNS [WORD] = Basics.BITXOR;
LowHalf: PROC [n: CARD32] RETURNS [CARD16] = INLINE { RETURN[LOOPHOLE[n,
    LongNumber].lo] };
```

HighHalf: PROC [n: CARD32] RETURNS [CARD16] = INLINE { RETURN[LOOPHOLE[n, LongNumber].hi] };

LowAddr: PROC [raw: LONG POINTER] RETURNS [refined: CARDINAL] ~ INLINE { RETURN[LOOPHOLE[raw, LongNumber].lo] };

BugTrap: SIGNAL = CODE;  --*For debugging* oIndexType: TYPE = CARD32;
cIndexType: TYPE = CARDINAL;

*The encoding is determined by a progression in which 1/2 of all codewords are NodeCopies, 3/8 are LeafCopies, and 1/8 are Literals: however, following a literal < maxLitLength long, 1/2 are LeafCopies and none are Literals. One important difference between this stream compressor and the similar C2 file compressor is the use of Pad codewords to 16-bit align output when an IO.Flush is issued. (A Pad encodes a one-character Literal or a [2..maxCopyLength] long Copy followed by zero fill to a 16-bit boundary).*

*Codewords begin with single bit = 0 for NodeCopy, 1 for anything else. LeafCopy, Literal and Pad then encode a field len that is 0 for a Literal or arcDisp for a LeafCopy. Following a literal of length < maxLitLength, another literal is impossible, so the len coding is changed to encode arcDisp - 1 for a LeafCopy. On LeafCopy codewords, len is followed by relative cposition: on literals, by litLen and then literal characters. len and litLen are coded using the EncodeVar procedure, which implements a simple progression driven by one of the three-parameter sets below: relative cposition of a Copy is encoded using EncodeSVar, a variation of EncodeVar.*

*The lenLast parameter is 1 larger than the value needed for maxCopyLength, and the largest value in the 11 bit indicator field (7777B) indicates a Pad. Then the Pad length is encoded with another len field: if the second len field encodes 0, then a single literal character follows: when len encodes a value in [2..maxCopyLength], then the len field is followed by a relative cposition as in the simpler B2 compressor rather than the C2 node and leaf code. In other words, the length is relative to the beginning of the string rather than to the parent node.* lenStart: CARDINAL = 1;
lenStep: CARDINAL = 1;
lenLast: CARDINAL = 12;  --*Implementation limit <= 16*

*The <1, 1, 11> code has 2 + 4 + ... + 2048 = 4094 values, 1 of which indicates a literal, so arc displacements of [1 ..4093] are possible: the parent node has depth >= 1. Implementation limit on maxCopyLength is roughly 32768 - oBufReserve due to oBufIndexer.* maxCopyLength: CARDINAL = 2 + 4 + 8 + 16 + 32 + 64 + 128 + 256 + 512 + 1024 + 2048; --*4094* padLenIndicator: CARDINAL = 7777B;  --*lenLast - lenStart + 1 1's*

*The 0-bit field represents literal length 1: subsequent fields have 1, 2, 3, 4, and 5 bits. The unary code is 1000, 10010.L, 100110.LL, 1001110.LLL, 10011110.LLLL, 100111111.LLLLL.* litStart: CARDINAL = 0;
litStep: CARDINAL = 1;
litLast: CARDINAL = 5;  --*Implementation limit <= 16*
maxLitLength: CARDINAL = 1 + 2 + 4 + 8 + 16 + 32; --*63*

*litLenMap[litLen] holds [literal length code, nbits], where the literal length code is 100 binary followed by the unary progression value, and nbits = 3 + size of unary progression representation of the literal length.* litLenMap: REF ARRAY[0..maxLitLength] OF RECORD [CARDINAL, CARDINAL] ←

NEW[ARRAY[0..maxLitLength] OF RECORD [CARDINAL, CARDINAL] ← TRASH];

*LeafCopy arc displacement is phased-in from these initial values to whatever dispStart value is required to make the progression hold maxCopyDisp - 1 values.*
sdispStart: CARDINAL = 0;
sdispStep: CARDINAL = 2;
sdispLast: CARDINAL = sdispStart + sdispStep + sdispStep;
minNVals: CARDINAL = Power2[sdispStart] + Power2[sdispStart + sdispStep] + Power2[sdispLast];

*maxCopyDisp implementation limit is about 65536 - 259. The "+1" here is because the number of cpositions allocated is 1 larger than the maximum displacement in LeafCopy codewords.*
maxCopyDisp: cIndexType = 16384 + 1;

*oBufSize should be roughly 8 * maxCopyDisp to 16 * maxCopyDisp so that typical files compressing 0.3 to 0.1 times original size have roughly balanced oBuffer and cWindow sizes. Effective size is reduced to oBufSize - maxCopyLength - oBufReserve by pruning and increases to oBufSize - maxCopyLength between prunings: so maxCopyLength should not be made astronomically large or the reduction in oBuffer size will become significant. The oBufIndexer tables have to be enlarged if oBufSize >= 15 * 65,536.* oBufSize: oIndexType = IF maxCopyDisp > 32768 THEN 8 * 65536 ELSE IF maxCopyDisp > 16384 THEN 4 * 65536 ELSE IF maxCopyDisp > 8192 THEN 2 * 65536 ELSE 1 * 65536; --*Must be multiple of 65,536 for oBufIndexer*
oBufHighOvf: CARDINAL = HighHalf[oBufSize];

*Whenever fewer than maxCopyLength bytes in the oBuffer remain unused, the oldest leaves are pruned until enough are made free. Because pruning involves a procedure call and other overhead, pruning is continued until maxCopyLength + oBufReserve bytes are free: in this way, the pruning procedure is not called more than once every oBufReserve bytes. Note that oBufSize is chosen large enough that pruning does not have to be done on most files.*
oBufReserve: CARDINAL = 1024;

*An upper bound on the node requirement (excluding the root, 256 permanent depth 1 nodes, and 2 others) is the largest tree for maxCopyDisp - 1 leaves, which is composed of subtrees each with N nodes at depths 2, 3, 4, .... and 2 + N - 1. Each node in the subtree has 1 leaf son and 1 node son except for the deepest, which has 2 leaf sons: altogether each subtree has N nodes, N + 1 leaves, and represents C = [2 + 3 + 4 + ... + (2 + N - 1)] + (2 + N - 1) = (N + 2)(N + 1)/2 + N bytes. maxNodes is then approx. (oBufSize bytes * N nodes / C bytes), where N is the sol'n to (oBufSize bytes) / (maxCopyDisp - 1 leaves) = C bytes / (N + 1 leaves). If oBufSize = 8 * maxCopyDisp, N = 12.15 and maxNodes = roughly 2 + .924 * (maxCopyDisp - 1); if oBufSize = 16 * maxCopyDisp, then N = 28.07 and max. nodes = 2 + .966 *(maxCopyDisp - 1). However, most data can be satisfied with 50% x maxCopyDisp nodes, so we choose a value more conservative of storage and purge old leaves, when the allocated number is insufficient.*
maxNodes: CARDINAL = (maxCopyDisp - 1) / 2;
*When maxNodes is insufficient, free leavesToFree old nodes (batched to reduce loop overhead).*
leavesToFree: CARDINAL = 100;

methodName: Rope.ROPE = "C16KS";
Power2: ARRAY [0..15] OF CARDINAL = [1, 2, 4, 8, 16, 32, 64, 128, 256, 512, 1024, 2048, 4096, 8192, 16384. 32768]:

Power2M1: ARRAY [0..16] OF CARDINAL = [0. 1. 3. 7. 15. 31. 63. 127. 255. 511. 1023. 2047. 4095. 8191. 16383. 32767. 65535]:

*lengthFieldMap[arcLength] holds [lengthFieldSize, nv], where nv = BITSHIFT[1, lengthFieldSize] - arcLength; these are parameters for coding arc displacement in NodeCopy codewords.*
lengthFieldMap: REF ARRAY[0..maxCopyLength] OF RECORD [NAT, NAT] ←
    NEW[ARRAY[0..maxCopyLength] OF RECORD [NAT, NAT] ← TRASH]:

*Subroutines to access the oBuffer array, which exceeds the Cedar compiler's size limit.*
BufR: PROC [oBufIndexer: LONG POINTER TO ARRAY [0..16) OF LONG POINTER TO
    Basics.RawBytes, w: oIndexType] RETURNS [BYTE] ~ TRUSTED INLINE {
    RETURN[oBufIndexer[HighHalf[w]][LowHalf[w]]]:
    --RETURN[IF w >= oBufSize THEN oBuffer[w - oBufSize] ELSE oBuffer[w]]:
    }:

BufW: PROC [oBufIndexer: LONG POINTER TO ARRAY [0..16) OF LONG POINTER TO
    Basics.RawBytes, w: oIndexType, char: BYTE] RETURNS [BYTE] ~ TRUSTED INLINE {
    RETURN [oBufIndexer[HighHalf[w]][LowHalf[w]] ← char]:
    --oBuffer[w] ← char:
    }:

*Determine which of two cpositions will be reached next, where cpos is the current cposition in [0..maxCopyDisp) and stopA and stopB are in [0..maxCopyDisp]. The result returned is in [1..maxCopyDisp] rather than [0..maxCopyDisp) for the cStopPos check. Do the calculations so that maxCopyDisp can be as large as possible before overflow screws up the result.*
Soonest: PROC [cpos, stopA, stopB: cIndexType] RETURNS [cIndexType] ~ {
    adist: CARDINAL ← IF stopA <= cpos THEN maxCopyDisp - cpos + stopA ELSE stopA - cpos:
    bdist: CARDINAL ← IF stopB <= cpos THEN maxCopyDisp - cpos + stopB ELSE stopB - cpos:
    IF bdist < adist THEN adist ← bdist:
    *To prevent overflows, (cpos + adist) <= (2 * maxCopyDisp - 1)).*
    --IF (adist = 0) OR (adist > maxCopyDisp) THEN BugTrap[]:
    RETURN[IF cpos > (maxCopyDisp - adist) THEN cpos + adist - maxCopyDisp ELSE cpos + adist]:
    }:

*ComputeEncoding is only called when h.allLeavesInUse = FALSE with cIndex in [0..maxCopyDisp). The progression of displacement field sizes is initially 0, 2, and 4 bits, covering 2↑0 + 2↑2 + 2↑4 cpositions: when this is insufficient, the field sizes increase to 1, 3, and 5 bits; etc.: in steady-state, maxCopyDisp - 1 values must be encoded. Here, recompute the progression sizes and the next cposition at which it will change.*
ComputeEncoding: PROC[cIndex, cOldPos: cIndexType] RETURNS [CARDINAL, cIndexType, BOOL, CARDINAL] ~ {
    *If steady-state has been reached, return steady-state parameters and h.allLeavesInUse = TRUE. Since maxCopyDisp is 1 larger than the largest number of cpositions ever used, and since the most recent cposition that can be referenced from a codeword is 2 back from cIndex, steady-state is reached when cIndex = cOldPos.*
    cStopPos: cIndexType ← Soonest[cIndex, cOldPos, maxCopyDisp]:

*To determine the cposition encoding, first compute ncpos = no. cpositions needed on this*

*codeword [cOldPos .. cIndex - 2]. Then compute nvals, the number of values that can be encoded in a displacement progression for which the smallest field is 0 bits: this value is then doubled until the progression is large enough to enumerate ncpos values.* ncpos: CARDINAL ← IF cIndex >= cOldPos + 1 THEN cIndex - cOldPos - 1 ELSE cIndex - cOldPos - 1 + maxCopyDisp;
dispStart: CARDINAL ← sdispStart;
nvals: CARD32;
FOR nvals ← minNVals, nvals + nvals UNTIL ncpos <= nvals DO
    dispStart ← dispStart + 1;
    ENDLOOP;

*If steady-state has been reached, cIndex = cOldPos, nvals >= maxCopyDisp - 1, and maxCopyDisp is the result of the first Soonest call. Otherwise, prepare to stop at the soonest of cOldPos, maxCopyDisp, when nvals has to be doubled again (i.e., when dispStart will change), or when h.allLeavesInUse becomes TRUE. If the progression covers N values and cOldPos = 0, then at cIndex = N + 2 the progression size must increase because [0..N+1] = N + 1 values will be possible. Be careful about CARDINAL overflows here.*

IF nvals < maxCopyDisp - 1 THEN {
    cStopPhaseIn: cIndexType ← IF (nvals + 2) >= (maxCopyDisp - cOldPos) THEN nvals + cOldPos + 2 - maxCopyDisp ELSE nvals + cOldPos + 2;
    cStopPos ← Soonest[cIndex, cStopPos, cStopPhaseIn];
    };

*nvals - Power2[dispLast] = no. values in the displacement progression excluding the last field: this is needed to compute nv in EncodeSVar and DecodeSVar.*

RETURN[dispStart, cStopPos, cIndex = cOldPos, nvals - Power2M1[dispStart + sdispLast - sdispStart] - 1];
};

Compress

*The compressor's output buffer is dumped with UnsafePutBlock on the next NodeCopy or LeafCopy codeword or literal character after oBufReserve characters have been processed from the source or when a Flush is issued; the worst case is approximately as follows:*
    *(1) maxLitLength - 1 literal characters were pending after the last buffer dump;*
    *(2) oBufReserve - 1 new characters are coded with a bad repeated sequence:*
        *alt. Lit1 and LeafCopy1 = (12 + 19) / (3 * 8) = 1.29 bits/bit -or-*
        *alt. Lit2 and LeafCopy1 = (22 + 19) / (4 * 8) = 1.28 bits/bit -or-*
        *alt. Lit4 and LeafCopy1 = (40 + 19) / (6 * 8) = 1.23 bits/bit -or-*
        *alt. Lit8 and LeafCopy1 = (74 + 19) / (10 * 8) = 1.16 bits/bit -or-*
        *alt. Lit16 and LeafCopy1 = (140 + 19) / (18 * 8) = 1.10 bits/bit -or-*
        *alt. Lit32 and LeafCopy1 = (266 + 19) / (34 * 8) = 1.05 bits/bit -or-*
        *maxLitLength literal = (13 + (8 * 63)) / (8 * 63) = 1.03 bits/bit -or-*
        *LeafCopy1 codewords = (19 / (2 * 8)) = 1.19 bits/bit.*
    *The worst of these is alt. Lit1 and LeafCopy1 codewords.*
    *(3) a maxCopyLength Pad (only one because the buffer is dumped after Pad).*
*A conservative multiplier of 1.5 is used here.* encIOBufSize: CARDINAL = ((oBufReserve / 2) * 3 + maxLitLength + bytesPerWord - 1) / bytesPerWord;

compressStreamProcs: REF IO.StreamProcs ← IO.CreateStreamProcs[
    variety: $output,

```
class: $Compress,
putChar: CSPutChar,
unsafePutBlock: CSUnsafePutBlock,
flush: CSFlush,
close: CSClose
];
```

*The "next" field of both NodeRec and LeafRec must be first so that it corresponds with the long pointer in a hash table bucket: and the parent field must be next so that leaves and nodes are equivalent for the hash procedures. The nodeNumber could be eliminated from the record and computed from the node address (but that would be slower).*

```
NodeRec: TYPE = RECORD [
    next: Node, --HT chain link or free list chain link
    parent: Node,
    cposition: cIndexType,
    depth: CARDINAL, --No. characters between root and this node
    sons: CARDINAL, --No. sons (non-leaves have at least two)
    nodeNumber: CARDINAL
    ];
nodeSize: CARDINAL = SIZE[NodeRec];
Node: TYPE = LONG POINTER TO NodeRec;
```

*Leaves do not need "depth" or "sons" fields, and "cposition" can be computed from the distance between the leaf pointer and the base of the leaf array. The fields in LeafRec must be congruent with the first fields of a NodeRec.*

```
LeafRec: TYPE = RECORD [
    next: Node, --HT link or freeList link
    parent: Node
    ];
leafSize: CARDINAL = SIZE[LeafRec];
Leaf: TYPE = LONG POINTER TO LeafRec;

CompressStreamData: TYPE = LONG POINTER TO CompressStreamRec;
CompressStreamRec: TYPE = RECORD [
    outputStream: IO.STREAM,
    outState: INTEGER ← 0, --No. bits in partial output word.
    outRemainder: CARDINAL ← 0, --Unoutput bits in [0..outState).
    outCount: NAT ← 0, depth: CARDINAL ← 0, --No. characters matched previously.
    litLen: NAT ← 0,
    onLeafArc: BOOL ← FALSE,
    dispStart: CARDINAL ← TRASH,
    lastNVals: CARDINAL ← TRASH,
    allLeavesInUse: BOOLEAN ← FALSE,
    scan: Node ← TRASH,
    freeList: Node ← TRASH,
    root: Node ← TRASH,
```

*Variables holding opositions.* oIndex: oIndexType ← 0. --oBuffer pos. at which next input char. goes.
oStopPos: oIndexType ← oBufReserve - 1.
oPrunePos: oIndexType ← oBufReserve - 1.

*Variables holding cpositions.*
cIndex: cIndexType ← 0.
cCopyMark: cIndexType ← 0.
cOldPos: cIndexType ← 0.
cStopPos: cIndexType ← 1.

*At the end of the iteration in which maxNodeNumber becomes > nodeAtBoundary, node numbers [0..nodeAtBoundary] will be possible on the following codeword: then nodeNoBits is increased by 1.*
nodeNoBits: CARDINAL ← 1.
maxNodeNumber: cIndexType ← 0.
nodeAtBoundary: cIndexType ← 2B.

*oBufIndexer is a krock to bypass the compiler implementation limit of 32k or 64k array entries on 16-bit Cedar machines. A side effect of the implementation is that array indices [oBufSize..oBufSize + 65536) can be used without masking first, but oBufSize must be a multiple of 65,536.*
oBufIndexer: ARRAY [0..16) OF LONG POINTER TO Basics.RawBytes ← ALL[NIL].
outBuf: ARRAY [0..encIOBufSize) OF CARDINAL ← ALL[TRASH]
];

*Standard htSize = htMask + 1 is the next power-of-two larger than maxCopyDisp, though it is possible to increase speed at the expense of storage by doubling this. For htSize = 2\*maxCopyDisp, avg. chain length is ~1.8, successful searches ~1.5; for htSize = maxCopyDisp, avg. chain length is ~2.5, successful searches ~2.0, but 2\*maxCopyDisp bytes of storage are saved.*
htMask: CARDINAL = IF maxCopyDisp > 16384 THEN 32767 ELSE IF maxCopyDisp > 8192
 THEN 16383 ELSE IF maxCopyDisp > 4096 THEN 8191 ELSE 4095: --*must be power-of-two minus 1*

*The compressor's storage block is a CompressStreamRec followed by the following arrays:*
nodeArray: TYPE = LONG POINTER TO ARRAY [0..maxNodes + 257) OF NodeRec:
leafArray: TYPE = LONG POINTER TO ARRAY [0..maxCopyDisp) OF LeafRec:
htArray: TYPE = LONG POINTER TO ARRAY [0..htMask] OF Node:
--oBuffer: TYPE = LONG POINTER TO PACKED ARRAY[0..oBufSize) OF BYTE:
cWindowArray: TYPE = LONG POINTER TO ARRAY [0..maxCopyDisp) OF oIndexType;

nodesOffset: INT = SIZE[CompressStreamRec]:
leavesOffset: INT = nodesOffset + (LONG[maxNodes + 257] * nodeSize):
htOffset: INT = leavesOffset + (LONG[maxCopyDisp] * leafSize):
oBufferOffset: INT = htOffset + ((LONG[htMask] + 1) * SIZE[LONG POINTER]):
cWindowOffset: INT = oBufferOffset + (oBufSize / bytesPerWord):
compressorStorageSize: INT = cWindowOffset + maxCopyDisp * SIZE[oIndexType]:

*Allocate the data structure using CountedVM so that it can be manually freed when the stream is closed in the normal case, avoiding swapout and garbage collection. On any abnormal*

*termination, the structure will later be reclaimed by the Collector. Unfortunate attribute of CountedVM is that the LONG POINTER in its Handle implies all procedures are UNSAFE. The streamData field of the STREAMRecord is a CountedVM.Handle for the CompressStreamRec.*

CreateEncodingStream: CodeControl.CreateEncoderProc = TRUSTED {
 --PROC [output: IO.STREAM, methodState: REF] RETURNS [codeStream: IO.STREAM]
 ch: CountedVM.Handle ← CountedVM.Allocate[compressorStorageSize];
 h: CompressStreamData ← LOOPHOLE[ch.pointer];
 cWindow: cWindowArray ← LOOPHOLE[h, LONG POINTER] + cWindowOffset;
 nodes: nodeArray ← LOOPHOLE[h, LONG POINTER] + nodesOffset;
 leaves: leafArray ← LOOPHOLE[h, LONG POINTER] + leavesOffset;
 hashTable: htArray ← LOOPHOLE[h, LONG POINTER] + htOffset;
 parent, scan: Node;
 leaf: Leaf;
 IF methodState # NIL THEN ERROR CodeControl.BadCodingMethod["methodState not
   NIL"];
 h↑ ← [outputStream: output];

FOR I: CARDINAL IN [0..oBufHighOvf) DO
   h.oBufIndexer[I] ← LOOPHOLE[h, LONG POINTER] + oBufferOffset + (I * (65536 /
     bytesPerWord));
   ENDLOOP;
 h.oBufIndexer[oBufHighOvf] ← LOOPHOLE[h, LONG POINTER] + oBufferOffset;

*Initialize htMask+1 HT buckets with self-pointers for circular collision list.*
 {
   hvLast: LONG POINTER ← @hashTable[htMask];
   FOR hv: LONG POINTER TO LONG POINTER ← @hashTable[0], hv + SIZE[LONG
     POINTER] DO
     hv↑ ← hv; IF hv = hvLast THEN EXIT;
     ENDLOOP;
   };

*The 256 permanent nodes at depth=1 and the root raise the worst case node requirement to maxCopyDisp+257-1 nodes in the tree plus 1 on the free list. Here initialize the root at depth 0 and a depth 1 node for every possible arc character: these are put in the HT so that no special code for depth = 0 is needed initially and following a Flush.*
 h.root ← h.scan ← parent ← @nodes[256]; --*The root*
 parent.depth ← parent.cposition ← 0;
 parent.sons ← maxCopyDisp + 4;
 parent.parent ← parent;
 scan ← @nodes[0];
 FOR char: BYTE IN [0..256) DO
   scan.sons ← maxCopyDisp + 4; --*2 or more extra sons so it won't ever be deleted.*
   scan.depth ← 1;
   scan.cposition ← 0;
   NewArc[hashTable, scan, parent, char];
   scan ← scan + nodeSize;
   ENDLOOP;
 h.freeList ← scan ← parent + nodeSize; --*origin of node free list*

*Initialize the first free list node: others will be initialized as needed.*
scan.sons ← 2;
scan.nodeNumber ← 0;
scan.next ← NIL;

*Do leaf.next ← NIL, indicating "not in HT," for maxCopyDisp leaves.*
leaf ← @leaves[0];
FOR I: cIndexType IN [0..maxCopyDisp) DO
    leaf.next ← NIL; leaf ← leaf + leafSize;
    ENDLOOP;
cWindow[0] ← 0;

RETURN[IO.CreateStream[streamProcs: compressStreamProcs, streamData: ch]];
};

*Procedures for inserting, removing, and finding arcs in the hashTable: circular collision lists thread from the bucket through the .next fields of leaves and nodes and back to the bucket: an empty bucket is denoted by a self-pointer. Arcs are identified by the parent's node address and the first arc character. Because each outgoing character results in a different HT bucket, no character compare is needed to verify that a particular node matches, if the parent's node address matches.*

*Since node sizes may be a power-of-two or four, the least significant one or two node address bits may not contribute to the hash: also, low-order character bits are usually more evenly distributed than high-order bits. All character bits must contribute to the hash bucket so that search subroutines need not compare the arc character to determine whether or not a match has been found. The hash function used here is the simplest possible lowbits[parent] xor char. Hash is called by NewArc, RemoveLeaf, and by the arc lookup code in UnsafePutBlock.*

Hash: PROC [n: Node, char: BYTE] RETURNS [CARDINAL] ~ TRUSTED INLINE {
    RETURN [BITAND[BITXOR[LowAddr[n], char], htMask]];
};

NewArc: PROC [hashTable: htArray, n, parent: Node, char: BYTE] = TRUSTED INLINE {
    bucket: Node ← LOOPHOLE[@hashTable[Hash[parent, char]], Node];
    n.parent ← parent;
    n.next ← bucket.next; *--Place new arc at the head of the HT list*
    bucket.next ← n;
};

*Substitute node n for m in a HT collision list: m.parent is their common parent.*
ReplaceArc: PROC [n, m: Node] = TRUSTED INLINE {
    slot: Node;
    n.parent ← m.parent;
    slot ← n.next ← m.next;
    UNTIL slot.next = m DO slot ← slot.next; ENDLOOP;
    slot.next ← n;
};

*Follow around the circular collision list and splice out a leaf being discarded from the window.*
RemoveArc: PROC [leaf: Leaf] = TRUSTED INLINE {

```
slot: Node;
FOR slot ← leaf.next, slot.next WHILE slot.next # LOOPHOLE[leaf, Node] DO
    ENDLOOP;
slot.next ← leaf.next;
};
```

*Delete parent. Remove its other son's HT arc and insert an arc from parent.parent to the other son; then deallocate parent. This point is typically reached on 50% of steady-state iterations (which implies that new nodes also are typically created on 50% of steady-state iterations).*

```
RemoveParent: PROC [parent: Node, freeList: Node, hashTable: htArray, cWindow:
        cWindowArray, oBufIndexer: LONG POINTER TO ARRAY [0..16) OF LONG POINTER
        TO Basics.RawBytes] RETURNS [Node] ~ TRUSTED INLINE {
    char: BYTE ← BufR[oBufIndexer, cWindow[parent.cposition] + parent.depth];
    scan: Node ← LOOPHOLE[@hashTable[Hash[parent, char]], Node];
    otherSon: Node;
    FOR otherSon ← scan.next, otherSon.next UNTIL parent = otherSon.parent DO
        scan ← otherSon;
        ENDLOOP;
    scan.next ← otherSon.next;
    ReplaceArc[otherSon, parent];
    parent.next ← freeList;
    RETURN[parent]; --Finally free parent.
};
```

*The oStopPos conditional is checked and PruneCWindow conditionally called immediately after each literal character and after the first character of each copy codeword. cIndex - 1 is the newest cposition, just filled; cIndex is the oldest cposition, just purged; if h.allLeavesInUse, cIndex + 1 is the oldest valid cposition, else h.cOldPos; oIndex is the oposition of the first character in the next codeword, just written (or about to be written if the call is from Flush). If any pruning is done here, the encoding will be recomputed as a function of the no. cpositions before the next codeword is generated.*

*The expander will call the equivalent PruneEWindow procedure just before the first character of each codeword: it must prune just as the code here prunes.*

*Successively remove oldest leaves while they point into the oBuffer area oIndex + [0..maxCopyLength + oBufReserve). The worst case between successive oStopPos checks is a maxCopyLength copy; leaves pointing into oBufReserve additional characters are cleared so that this code is executed only once per oBufReserve characters. Turn off h.allLeavesInUse and set h.cOldPos to the oldest valid cposition if any purging is done and RETURN[TRUE]; return FALSE if no purging was done.*

*Tracking the oldest leaf is tricky. If h.allLeavesInUse, then all cpositions were previously in use, and that condition has persisted, or else the compressor created enough new cpositions to fill the gap; in either case, the oldest valid cposition is cIndex + 1 (i.e., the cposition which will be overwritten on the next iteration). Otherwise, cpositions [cOldPos..cIndex) are in use.*

```
PruneCWindow: PROC [h: CompressStreamData, oIndex: oIndexType, cIndex, cStopPos:
        cIndexType, freeList: Node] RETURNS [cIndexType, Node] ~ TRUSTED {

PruneLeaves: PROC [h: CompressStreamData, fromPosLow, fromPosHigh: oIndexType,
            cOldPos: cIndexType, freeList: Node] RETURNS [cIndexType, Node] ~ TRUSTED
```

```
    {
    leaves: leafArray ← LOOPHOLE[h, LONG POINTER] + leavesOffset;
    cWindow: cWindowArray ← LOOPHOLE[h, LONG POINTER] + cWindowOffset;
    hashTable: htArray ← LOOPHOLE[h, LONG POINTER] + htOffset;
    oldLeaf: Leaf ← @leaves[cOldPos];
    WHILE cWindow[cOldPos] IN [fromPosLow..fromPosHigh) DO
        IF oldLeaf.next # NIL THEN {
            Remove the oldest leaf and, if necessary, its parent.
            parent: Node;
            RemoveArc[oldLeaf];
            IF (parent ← oldLeaf.parent).sons = 2 THEN {
                freeList ← RemoveParent[parent, freeList, hashTable, cWindow,
                        @h.oBufIndexer];
                }
            ELSE parent.sons ← parent.sons - 1;
            oldLeaf.next ← NIL;
            };
        IF cOldPos = maxCopyDisp - 1 THEN { cOldPos ← 0; oldLeaf ← @leaves[0]; }
        ELSE { cOldPos ← cOldPos + 1; oldLeaf ← oldLeaf + leafSize; };
        ENDLOOP;
    RETURN[cOldPos, freeList];
    };

fromPosLow, fromPosHigh: oIndexType;
cOldPos, origcOldPos: cIndexType;
cOldPos ← origcOldPos ← IF h.allLeavesInUse THEN (IF cIndex = maxCopyDisp - 1 THEN
    0 ELSE cIndex + 1) ELSE h.cOldPos;
fromPosLow ← oIndex;
IF (fromPosHigh ← fromPosLow + maxCopyLength + oBufReserve) > oBufSize THEN {
    [cOldPos, freeList] ← PruneLeaves[h, fromPosLow, oBufSize, cOldPos, freeList];
    fromPosLow ← 0;
    fromPosHigh ← fromPosHigh - oBufSize;
    };
[cOldPos, freeList] ← PruneLeaves[h, fromPosLow, fromPosHigh, cOldPos, freeList];
h.oPrunePos ← oIndex + oBufReserve;
If any leaves are purged, cause the cStopPos conditional to be executed before the next
    codeword to recompute the encoding.
IF (h.cOldPos ← cOldPos) # origcOldPos THEN {
    h.allLeavesInUse ← FALSE; cStopPos ← cIndex + 1;
    };
RETURN[cStopPos, freeList];
};

CSUnsafePutBlock: PROC [self: IO.STREAM, block: Basics.UnsafeBlock] = TRUSTED {
    h: CompressStreamData ← LOOPHOLE[NARROW[self.streamData,
            CountedVM.Handle].pointer];
    base: LONG POINTER TO Basics.RawBytes ← LOOPHOLE[block.base];

nodes: nodeArray ← LOOPHOLE[h, LONG POINTER] + nodesOffset;
    leaves: leafArray ← LOOPHOLE[h, LONG POINTER] + leavesOffset;
```

```
hashTable: htArray ← LOOPHOLE[h, LONG POINTER] + htOffset;
cWindow: cWindowArray ← LOOPHOLE[h, LONG POINTER] + cWindowOffset;
oBufIndexer: LONG POINTER TO ARRAY [0..16) OF LONG POINTER TO Basics.RawBytes ←
    @h.oBufIndexer;

cIndex: cIndexType ← h.cIndex;
cCopyMark: cIndexType ← h.cCopyMark;
cStopPos: cIndexType ← h.cStopPos;

oIndex: oIndexType ← h.oIndex;
oStopPos: oIndexType ← h.oStopPos;
oCopyMark: oIndexType ← cWindow[cCopyMark];
litLen: NAT ← h.litLen;
onLeafArc: BOOL ← h.onLeafArc;
depth: CARDINAL ← h.depth;
scan: Node ← h.scan;
freeList: Node ← h.freeList;

maxNodeNumber: CARDINAL ← h.maxNodeNumber;
nFreeNodeValues: CARDINAL ← h.nodeAtBoundary - maxNodeNumber;
nodeNoBits: CARDINAL ← h.nodeNoBits;
nodeNumber: CARDINAL;
arcDisp, arcLength: CARDINAL;

leaf: Leaf ← @leaves[cIndex];
char, achar: BYTE;
previous, parent: Node;

startIndex: CARDINAL ← block.startIndex; --This will bounds-check < 0 and >= 64k
count: CARDINAL ← block.count; --This will bounds-check < 0 and >= 64k
FOR i: CARDINAL IN [startIndex .. startIndex + count) DO
    char ← BufW[oBufIndexer, oIndex + depth, base[i]];
    {
        IF onLeafArc THEN {
            IF depth = maxCopyLength THEN { --Cut-off
                If a match exists to the cut-off depth, replace the arc to the cut-off leaf by an arc
                    to the new leaf. Removal avoids indefinitely long HT collision lists by limiting
                    each node to 256 sons, each beginning with a different character.
                ReplaceArc[LOOPHOLE[leaf, Node], scan];
                previous ← leaf.parent;
                scan.next ← NIL;
                arcDisp ← depth - previous.depth;
            }
            ELSE {
                Note that checking for oIndex >= oBufSize isn't required on every character
                    because oBufIndexer automatically wraps the value back to 0 unless it is more
                    than 64k characters too large.
                IF char = (achar ← BufR[oBufIndexer, oCopyMark + depth]) THEN GO TO
                    continueMatch;
                GO TO arcTerm;
```

```
        };
    }
ELSE IF scan.depth = depth THEN { --At a node
    previous ← scan;
    parent ← LOOPHOLE[@hashTable[Hash[previous, char]], Node];
    It is not ok to do scan.cposition ← cIndex here: if that were done, and a Flush
    occurred before the new leaf is put into the tree, then RemoveParent could
    eventually crash due to not finding the expected leaf. It is also not OK to flip this
    loop inside out (i.e., to check for previous = scan.parent before checking for scan
    ≠ parent) because at the moment scan points at the HT bucket, bucket.parent
    might happen to = previous, even though HT buckets don't have any parent field
    in them.
    FOR scan ← parent.next, scan.next WHILE scan ≠ parent DO
        IF previous = scan.parent THEN {
            Found an arc scan going deeper in the tree.
            leafPos: INT ← LOOPHOLE[scan, INT] - LOOPHOLE[leaves, INT];
            IF LOOPHOLE[HighHalf[leafPos], INTEGER] >= 0 THEN {
                scan = leafarc: leafPos / leafSize gives long divide trap here.
                cCopyMark ← Basics.LongDiv[LOOPHOLE[leafPos, CARD32], leafSize];
                onLeafArc ← TRUE;
                }
            ELSE cCopyMark ← scan.cposition;
            oCopyMark ← cWindow[cCopyMark];
            GO TO continueMatch;
            };
        ENDLOOP;
    Match ends exactly at the node previous.
    arcLength ← depth - previous.parent.depth;
    arcDisp ← 0;
    nodeNumber ← previous.nodeNumber;
    previous.sons ← previous.sons + 1;
    NewArc[hashTable, LOOPHOLE[leaf, Node], previous, char];
    }
ELSE { --On a node arc
    Note that checking for oIndex >= oBufSize isn't required on every character
    because oBufIndexer automatically wraps the value back to 0 unless it is more
    than 64k characters too large.
    IF char = (achar ← BufR[oBufIndexer, oCopyMark + depth]) THEN GO TO
        continueMatch;
    arcLength ← scan.depth - scan.parent.depth;
    nodeNumber ← scan.nodeNumber;
    GO TO arcTerm;
    };
EXITS
    continueMatch => { depth ← depth + 1; LOOP; };
    arcTerm => {
        Arc termination. Allocate a new tree node and substitute it in the HT for the arc
        to scan: it has parent = previous, cposition = cIndex, depth = depth. Then
        hang scan and leaf from this new node.
        IF (freeList ← (previous ← freeList).next) = NIL THEN {
```

```
IF maxNodeNumber < (maxNodes - 1) THEN {
    Initialize another node.
    freeList ← previous + nodeSize: freeList.sons ← 2:
    freeList.next ← NIL:
    maxNodeNumber ← freeList.nodeNumber ← maxNodeNumber + 1:
    }
ELSE maxNodeNumber ← maxNodes: --maxNodes is enough on most
    files.
In the oStopPos conditional, AFTER this iteration's codeword, compute
    new values for nFreeNodeValues and nodeNoBits and free leaves until
    freeList ≠ NIL.
oStopPos ← oIndex:
};
arcDisp ← (previous.depth ← depth) - scan.parent.depth:
node.sons is always 2 when node is put on the free list.
Substitute the new node previous for scan in the HT: scan.parent is their
    common parent.
ReplaceArc[previous, scan]:
NewArc[hashTable, scan, previous, achar]:
NewArc[hashTable, LOOPHOLE[leaf, Node], previous, char]:
};
};
```

*Tree match exhausted: either increase literal by 1 character or output the accumulated literal and copy codewords. The most recent character (which didn't match) is at oIndex + depth.*

*cposition update was not done during the descent because, if a Flush had occurred, there would be no leaf at that cposition: so cposition update is postponed until here, when a leaf has been put in the tree.*

```
DO --Update cpositions starting with the longest match
    previous.cposition ← cIndex:
    previous ← previous.parent:
    IF previous.depth <= 1 THEN EXIT:
ENDLOOP:
```

*At this point, execute a single conditional branch for all unusual events associated with cposition. cStopPos holds the earliest cposition at which something must be done. One thing is that cIndex must be wrapped back to 0 when it counts up to maxCopyDisp, and leaf must be set back to @leaves[0]. In addition, h.allLeavesInUse ← TRUE must happen when cIndex = h.cOldPos + 1 (h.cOldPos holds the oldest in-use cposition: the oStopPos conditional code below purges any cpositions which point into the oBuffer area which might be overwritten with new text: after purging, the oldest in-use cposition is in cOldPos and h.allLeavesInUse = FALSE.). Finally, the encoding of the cWindow displacement field of copy codewords changes as a function of the number of cpositions presently in use: the encoding must be recomputed at appropriate times. (The encoding must not depend on anything that occurs during the copy body, which the expander cannot anticipate. Because the literal encoding is invariant, literal encoding parameters do not have to be saved after each codeword: otherwise, literal coding parameters would have to be saved after each codeword, just in case the next codeword is a literal.)*

```
IF (cIndex ← cIndex + 1) = cStopPos THEN {
    IF cIndex = maxCopyDisp THEN cIndex ← 0;
    leaf ← @leaves[cIndex];
    IF NOT h.allLeavesInUse THEN [h.dispStart, cStopPos, h.allLeavesInUse,
        h.lastNVals] ← ComputeEncoding[cIndex, h.cOldPos]
    ELSE cStopPos ← maxCopyDisp;
    }
ELSE leaf ← leaf + leafSize;
```

*No match: either increase literal by 1 character or output the accumulated literal and copy codewords. The most recent character (which didn't match) is at oIndex + depth. Unfortunately, the superior heuristic used by B2 to choose between Literal and Copy codewords cannot be used here because the expander would be unable to readily reconstruct the tree if a depth = 3 copy sometimes deferred to a literal.*

```
IF depth < 2 THEN { --Start or extend literal
```
*The character at oIndex - 1 goes in a literal: output a literal codeword if maxLitLength has been reached.*
```
    IF (litLen ← litLen + 1) = maxLitLength THEN {
        OutputLiteral[h, litLen, oIndex + 1]; litLen ← 0;
        };
```
*Character is added to the literal in progress.*
```
    }
ELSE IF onLeafArc THEN { --LeafCopy codeword
    IF litLen # 0 THEN {
        OutputLiteral[h, litLen, oIndex]; litLen ← 0;
```
*Since another literal cannot follow, use the unused codewords for LeafCopy.*
```
        arcDisp ← arcDisp - 1;
        };
```
*arcDisp is in [1..maxCopyLength]; arcDisp = 0 indicates a literal.*
```
    Output[h, 1, 1];
    EncodeVar[h, arcDisp, lenStart, lenStep, lenLast];
    EncodeSVar[h, cCopyMark, cIndex];
    onLeafArc ← FALSE;
    }
ELSE { --NodeCopy codeword
    IF litLen # 0 THEN { OutputLiteral[h, litLen, oIndex]; litLen ← 0; };
```
*Encode[h, nodeNumber, nFreeNodeValues, nodeNoBits + 1] is faster here but doesn't work when nodeNoBits = 16.*
```
    Output[h, 0, 1];
    Encode[h, nodeNumber, nFreeNodeValues, nodeNoBits];
    IF arcLength >= 2 THEN {
        lengthFieldSize, nal: CARDINAL;
        [lengthFieldSize, nal] ← lengthFieldMap[arcLength];
        Encode[h, arcDisp, nal, lengthFieldSize];
        };
    };
```

*Remove the oldest leaf if cWindow is full.*
```
IF leaf.next # NIL THEN {
    RemoveArc[leaf];
```

```
IF (parent ← leaf.parent).sons = 2 THEN {
    freeList ← RemoveParent[parent, freeList, hashTable, cWindow, oBufIndexer];
    }
ELSE parent.sons ← parent.sons - 1;
};
```

*Advance the buffer pointer. Buffer purging and encoding changes must occur only between Copy codewords, so the expander can do the same thing when decoding. The encoding is recomputed as necessary in the cStopPos conditional above as a function of the number of cpositions in use at the onset of the copy: the recomputation must not depend on anything that occurs during the copy body, which the expander cannot anticipate. Since the number of cpositions is reduced only by the code in the oStopPos conditional below, after codeword generation, the expander can duplicate this action by pruning and recomputing the codeword configuration immediately before decoding a codeword. Because the literal encoding does not vary, pruning can also occur during literal construction. (If the literal encoding also varied, it would be necessary to preserve literal coding parameters after each codeword so that, if the next codeword is a literal, it can be coded correctly.)*

```
IF (oIndex ← cWindow[cIndex] ← oIndex + depth) >= oStopPos THEN {
```
*Get here once per oBufReserve characters; once per node; and once each time node storage is exhausted (never happens on most files).*
```
    prune: BOOL ← oIndex >= h.oPrunePos;
    IF oIndex >= oBufSize THEN {
```
*An out-of-range value was stored in cWindow[cIndex] earlier if oIndex wrapped past oBufSize, so fix it here. PruneCWindow requires cWindow[cIndex] values in [0..oBufSize).*
```
        cWindow[cIndex] ← oIndex ← oIndex - oBufSize;
        h.oPrunePos ← h.oPrunePos - oBufSize;
        };
    IF prune THEN {
        IO.UnsafePutBlock[h.outputStream, [count: h.outCount * bytesPerWord, base:
            LOOPHOLE[@h.outBuf[1]]]];
        h.outCount ← 0;
        [cStopPos, freeList] ← PruneCWindow[h, oIndex, cIndex, cStopPos, freeList];
        };
    oStopPos ← MIN[h.oPrunePos, oBufSize];
    UNTIL freeList # NIL DO --Node storage exhausted.
        cOldPos: cIndexType ← IF h.allLeavesInUse THEN (IF cIndex = maxCopyDisp -
            1 THEN 0 ELSE cIndex + 1) ELSE h.cOldPos;
        h.allLeavesInUse ← FALSE;
        FOR I: CARDINAL IN [0..leavesToFree) DO --Remove leaves
            oldLeaf: Leaf ← @leaves[cOldPos];
            IF oldLeaf.next # NIL THEN {
```
*Remove the oldest leaf and, if necessary, its parent.*
```
                RemoveArc[oldLeaf];
                IF (parent ← oldLeaf.parent).sons = 2 THEN {
                    freeList ← RemoveParent[parent, freeList, hashTable, cWindow,
                        oBufIndexer];
                    }
                ELSE parent.sons ← parent.sons - 1;
                oldLeaf.next ← NIL;
```

```
            };
            cOldPos ← IF cOldPos = maxCopyDisp - 1 THEN 0 ELSE cOldPos + 1;
            ENDLOOP;
        h.cOldPos ← cOldPos;
        cStopPos ← cIndex + 1;
        ENDLOOP;
    IF maxNodeNumber = (h.nodeAtBoundary + 1) THEN {
        h.nodeNoBits ← nodeNoBits ← nodeNoBits + 1;
        h.nodeAtBoundary ← h.nodeAtBoundary + h.nodeAtBoundary;
        };
    nFreeNodeValues ← h.nodeAtBoundary - maxNodeNumber;
    };
  scan ← @nodes[char]; --for the next iteration
  depth ← 1;
  ENDLOOP;

h.cIndex ← cIndex;
h.cCopyMark ← cCopyMark;
h.cStopPos ← cStopPos;
h.oIndex ← oIndex;
h.oStopPos ← oStopPos;
h.litLen ← litLen;
h.onLeafArc ← onLeafArc;
h.depth ← depth;
h.scan ← scan;
h.freeList ← freeList;
h.maxNodeNumber ← maxNodeNumber;
};

CSPutChar: PROC [self: IO.STREAM, char: CHAR] = TRUSTED {
  buff: PACKED ARRAY [0..1] OF CHAR;
  buff[0] ← char;
  CSUnsafePutBlock[self, [base: LOOPHOLE[LONG[@buff]], startIndex: 0, count: 1]];
  };
```

*h.outRemainder holds the accumulated bits [0..h.outState) in the output word being built.*
*h.outState is the bit position where the next output value will be written*
*(or, equivalently, the no. valid bits in h.outRemainder).*
*code is a right-justified value being output.*
*nbits is the length of the new value. $0 <= n <= 16$.*

```
Output: PROC [h: CompressStreamData, code, nbits: CARDINAL] ~ TRUSTED INLINE {
  outState: INTEGER;
  IF (outState ← nbits + h.outState - bitsPerWord) >= 0 THEN {
      Complete the output word being built in h.outRemainder, write it into h.outBuf, and start a
      new word in h.outRemainder.
      h.outBuf[h.outCount ← h.outCount + 1] ← h.outRemainder + BITSHIFT[code, -
          outState];
      h.outRemainder ← BITSHIFT[code, bitsPerWord - (h.outState - outState)];
      }
  ELSE { --Add code (shifted left) to the remainder
      h.outRemainder ← h.outRemainder + BITSHIFT[code, -outState];
```

```
        h.outState ← outState + bitsPerWord:
        };
};
```

*Procedure for encoding node number, arc displacement, or cposition.*
Encode: PROC [h: CompressStreamData, value, nFreeValues, nBits: CARDINAL] ~ TRUSTED
    INLINE {
    IF value < nFreeValues THEN Output[h, value, nBits - 1]
    ELSE Output[h, value + nFreeValues, nBits];
    };

EncodeVar: PROC [h: CompressStreamData, out, start, step, last: CARDINAL] ~ TRUSTED
INLINE {
    UNTIL out <= Power2M1[start] DO
        Output[h, 1, 1];
        out ← out - Power2[start];
        start ← start + step:
        ENDLOOP;
    IF start < last THEN Output[h, out, start + 1]
    ELSE Output[h, out, start];
    };

EncodeSVar: PROC [h: CompressStreamData, cCopyMark, cIndex: cIndexType] ~ TRUSTED
INLINE {
    *out is the relative cposition to be encoded for a LeafCopy codeword.*
    out: CARDINAL ← (IF cIndex >= cCopyMark + 2 THEN cIndex - cCopyMark - 2 ELSE
      cIndex - cCopyMark - 2 + maxCopyDisp);
    start: CARDINAL ← h.dispStart;
    last: CARDINAL ← start + sdispLast - sdispStart;
    UNTIL out <= Power2M1[start] DO
        Output[h, 1, 1];
        out ← out - Power2[start];
        start ← start + sdispStep;
        ENDLOOP;
    IF start < last THEN Output[h, out, start + 1]
    ELSE {
        *The start and last parameters are controlled so that the number of values represented by*
        *the progression is sufficient but not excessive: however, it is possible for only 1 value to be*
        *needed in the largest field, even though last bits are reserved for it in the progression.*
        *Unused codes are used to reduce the output size of the largest field. Here, nv is the*
        *number of values which must be coded in the largest field, out is the value to be coded,*
        *and start is the field size determined by the progression: decrement start until it contains*
        *no excess values: then x ← Power2[start] - nv is the number of free values in the field of*
        *size start bits: out in [0 .. x) are coded in start - 1 bits, while [x .. nv) are coded in start*
        *bits.*
        nv: CARDINAL ← IF h.allLeavesInUse THEN maxCopyDisp - 1 - h.lastNVals ELSE ((IF
                cIndex >= h.cOldPos + 1 THEN cIndex - 1 ELSE cIndex - 1 + maxCopyDisp)
                - h.cOldPos - h.lastNVals);
        WHILE Power2M1[start - 1] >= nv DO start ← start - 1; ENDLOOP;
        Encode[h, out, Power2M1[start] - nv + 1, start];
        };

```
};

OutputLiteral: PROC [h: CompressStreamData, litLen: CARDINAL, oIndex: oIndexType] =
    TRUSTED {
    litPos: oIndexType ← IF oIndex < litLen THEN oIndex + oBufSize - litLen ELSE oIndex -
        litLen;
    val, bits: CARDINAL;
    [val, bits] ← litLenMap[litLen];
    Output[h, val, bits];
    --Output[h, 1, 1];
    -- = EncodeVar[h, 0, lenStart, lenStep, lenLast];
    --Output[h, 0, lenStart + 1];
    --EncodeVar[h, litLen - 1, litStart, litStep, litLast];
    Output[h, BufR[@h.oBufIndexer, litPos], 8];
    FOR I: NAT IN [1..litLen) DO
        ***Wrap check not needed with oBufIndexer krock.
        --litPos ← IF litPos = oBufSize - 1 THEN 0 ELSE litPos + 1;
        litPos ← litPos + 1;
        Output[h, BufR[@h.oBufIndexer, litPos], 8];
        ENDLOOP;
    };
```

*The purpose of Flush is to render codewords for all characters eaten by the compressor but not encoded and to 16-bit-align the output stream. The particular implementation must represent 1 or more characters with each Pad codeword to avoid an ambiguous end-of-stream check during expansion. (If regular copy and literal codewords were used followed by a zero-length Pad, then the expander could not use the existence of another code byte in the Output stream as proof that at least 1 more character remains to be decoded: instead it would have to decode the next codeword(s) until a non-zero length is obtained or end-of-stream is reached: consequently, the decoding would have to be done by a subroutine, slowing everything down.)*

*The 16-bit alignment property of Pad codewords also lets the expander know there is another codeword whenever, at the onset of decoding a codeword, input is not aligned at a 16-bit boundary. If there is at least 1 more byte to decode at a 16-bit boundary, then the expander can get 2 more without fear of blocking indefinitely or encountering endOfStream (because it knows that the compressor at the other end of a communication stream will not dismiss for a long time without producing a Pad codeword).*

*The function performed by the Pad codeword could be performed in other ways, and this particular implementation is the result of how input and output are buffered. If input and output were quantized in bits rather than bytes, Pad could be eliminated and the pure A2 encoding used. Because the Pad codeword uses only a minute portion of the total encoding space, its effect on file compression is also minute. On compressed files, a single Flush occurs at end-of-file: in applications such as compressed communication between computers, the sender does a Flush whenever it is necessary to ensure that accumulated characters are pushed through the compressor's buffers and delivered to the receiver's expander.*

*At the end of the last PutChar or UnsafePutBlock, depth was >= 1: depth = 0 only occurs at initialization or after a Flush, when h.litLen = 0 and output is already 16-bit aligned. So codewords are produced here only when depth >= 1. First, produce a literal codeword for h.litLen characters swallowed by the compressor but not yet represented in the output. Then align the output file at a 16-bit boundary by issuing a Pad codeword. Finally, dump the output buffer and prepare to compress more characters.*

*Note that the codeword preceding a Pad has put a leaf in the tree that begins with the first character covered by the Pad, so that character must appear in the buffer. The cposition consumed by the Pad codeword is an ugly wart on the encoding because no subsequent codeword will ever use it. In addition, it requires code here to remove the leaf for that cposition from the tree. This cposition was wasted so that the expander's decoding job is easier and so that the expander won't have to handle the situation of an indefinitely long sequence of Pads overwriting the entire window.*

CSFlush: PROC [self: IO.STREAM] = TRUSTED {
   h: CompressStreamData ← LOOPHOLE[NARROW[self.streamData,
        CountedVM.Handle].pointer];
   depth: CARDINAL;
   extraCount: CARDINAL ← 0;

IF (depth ← h.depth) # 0 THEN {
      *The compressor has consumed but not produced codewords for h.litLen literal characters followed by a partial copy of length 1 or more. The tree has been updated for the literal characters and cWindow[cIndex] was updated for the partial copy. No leaf is created for the partial copy, but a cposition is allocated and the old leaf removed, just as for a regular copy codeword.*
      litLen: CARDINAL;
      cIndex: cIndexType;
      oIndex: oIndexType ← h.oIndex;
      parent: Node;
      cWindow: cWindowArray ← LOOPHOLE[h, LONG POINTER] + cWindowOffset;
      leaves: leafArray ← LOOPHOLE[h, LONG POINTER] + leavesOffset;
      *Finish removing the leaf for the current value of h.cIndex because no leaf will be in the tree for the partial match represented by the Flush. Waste this leaf so that the expander can duplicate this case easily. Also, if a cposition was not consumed here, then a sequence of <partial copy, flush> repeated over and over could result in a full oBuffer and an empty cWindow: the purging code would fail. Changes would be needed to deal with this problem.*
      leaf: Leaf ← @leaves[h.cIndex];
      leaf.next ← NIL;

IF (h.cIndex ← cIndex ← h.cIndex + 1) = h.cStopPos THEN {
         IF cIndex = maxCopyDisp THEN h.cIndex ← cIndex ← 0;
         IF NOT h.allLeavesInUse THEN [h.dispStart, h.cStopPos, h.allLeavesInUse,
           h.lastNVals] ← ComputeEncoding[cIndex, h.cOldPos]
         ELSE h.cStopPos ← maxCopyDisp;
      };
      *Remove the oldest leaf (if cWindow is full, else NOOP):*
      leaf ← @leaves[cIndex];

*Output a Literal codeword for accumulated literal characters followed by a Pad codeword for the partial copy of length [1..maxCopyLength].*
      IF (litLen ← h.litLen) # 0 THEN { OutputLiteral[h, litLen, oIndex]; h.litLen ← 0; };
      IF leaf.next # NIL THEN {
         RemoveArc[leaf];
         IF (parent ← leaf.parent).sons = 2 THEN {
           hashTable: htArray ← LOOPHOLE[h, LONG POINTER] + htOffset;
           h.freeList ← RemoveParent[parent, h.freeList, hashTable, cWindow,
              @h.oBufIndexer];
         }
         ELSE parent.sons ← parent.sons - 1;

};

cWindow[cIndex] ← h.oIndex ← oIndex ← oIndex + depth;

*Pad is coded as all 1's in the largest indicator field for the len field. The len field of the Pad codeword signifies 1 or [2..maxCopyLength] characters. In both cases, no leaf is put in the tree and, even though a cposition is consumed, it does not appear in the tree.*

Output[h, padLenIndicator, lenLast - lenStart + 1];
EncodeVar[h, depth - 1, lenStart, lenStep, lenLast];
IF depth = 1 THEN { --*Pad literal*
    char: BYTE ← BufR[@h.oBufIndexer, oIndex - 1];
    Output[h, char, 8];
    }
ELSE EncodeSVar[h, h.cCopyMark, cIndex]; --*Pad copy*

*Pad to 16-bit boundary: try to code this to work on both 16 and 32-bit machines: the compiler suppresses false arms of conditionals.*

IF h.outState # 0 THEN h.outBuf[h.outCount ← h.outCount + 1] ← h.outRemainder;
IF bytesPerWord = 4 THEN {
    extraCount ← IF h.outState > 16 THEN 0 ELSE (bytesPerWord - 2);
    }
ELSE IF bytesPerWord # 2 THEN BugTrap[];

*The oStopPos activities postponed for a partial copy have to be checked here because the previous call to PruneCWindow allowed for only one copy codeword in the worst case and because the expander will do a Purge.*

IF oIndex >= h.oStopPos THEN {
    prune: BOOL ← oIndex >= h.oPrunePos;
    IF oIndex >= oBufSize THEN {
        *An out-of-range value was stored in cWindow[cIndex] earlier if oIndex wrapped past oBufSize, so fix it here. PruneCWindow requires cWindow[cIndex] values in [0..oBufSize).*
        cWindow[cIndex] ← oIndex ← h.oIndex ← oIndex - oBufSize;
        h.oPrunePos ← h.oPrunePos - oBufSize;
        };
    [h.cStopPos, h.freeList] ← PruneCWindow[h, oIndex, cIndex, h.cStopPos, h.freeList];
    h.oStopPos ← MIN[h.oPrunePos, oBufSize];
    };

*Begin scanning next time at the root with depth = 0 and litLen = 0.*
h.depth ← 0;
h.scan ← h.root;
h.onLeafArc ← FALSE;
    }
ELSE IF h.litLen # 0 THEN BugTrap[]
ELSE IF (h.outState # 0) AND (h.outState # 16) THEN BugTrap[];

*Dump the output buffer*
IO.UnsafePutBlock[h.outputStream, [count: (h.outCount * bytesPerWord) - extraCount, base: LOOPHOLE[@h.outBuf[1]]]];
h.outCount ← h.outRemainder ← h.outState ← 0;
};

*Free all the data structures. In this way, only the IO.STREAM record and CountedVM.Handle record remain to be reclaimed.*

```
CSClose: PROC [self: IO.STREAM, abort: BOOL ← FALSE] = TRUSTED {
    ch: CountedVM.Handle ← NARROW[self.streamData];
    --CSFlush[self]; Don't flush any more because of problem when Close is done in
        UNWIND.
    Explicitly freeing storage avoids swap out: the Collector then reclaims only the Handle.
    CountedVM.Free[ch];
    };
```

Expand

```
expandStreamProcs: REF IO.StreamProcs ← IO.CreateStreamProcs[
    variety: $input,
    class: $Expand,
    getChar: ESGetChar,
    unsafeGetBlock: ESUnsafeGetBlock,
    endOf: ESEndOf,
    close: ESClose
    ];
```

*The [lo, hi] order is important here because eoIndexType is LOOPHOLE'd into a CARD32 for comparison in PruneLeaves. Because our peculiar D-machines reverse the low and high halves of 32-bit quantities, this won't work correctly on 32-bit machines.*

```
eoIndexType: TYPE = RECORD [lo, hi: CARD16];

ENodeRec: TYPE = RECORD [
    parent: enode,
    cposition: CARDINAL,
    depth: CARDINAL,    --No. characters between root and this node
    sons: CARDINAL,     --No. sons (non-leaves have at least two)
    nodeNumber: CARDINAL
    ];
enodeSize: CARDINAL = SIZE[ENodeRec];
enode: TYPE = LONG POINTER TO ENodeRec;

ELeafRec: TYPE = RECORD [ parent: enode ];
eleafSize: CARDINAL = SIZE[ELeafRec];
eleaf: TYPE = LONG POINTER TO ELeafRec;

inRefillBytes: CARDINAL = 512;  --Must be even

ExpandStreamData: TYPE = LONG POINTER TO ExpandStreamRec;
ExpandStreamRec: TYPE = RECORD [
    inputStream: IO.STREAM,
    inState: INTEGER ← 0,
    inRemainder: CARDINAL ← 0,
    inLast: CARDINAL ← 0,
    inRead: CARDINAL ← 0,
    inBlock: Basics.UnsafeBlock ← [startIndex: 2], dispStart: CARDINAL ← TRASH,
    lastNVals: CARDINAL ← TRASH,
    allLeavesInUse: BOOLEAN ← FALSE,
``` copyLenOffset: CARDINAL ← 0.

length: INTEGER ← 0, --*remaining characters in current copy (positive) or literal (negative).* cIndex: cIndexType ← 0, --*current cWindow position.*
cOldPos: cIndexType ← 0,
cStopPos: cIndexType ← 1, oIndex: eoIndexType ← [lo: 0, hi: 0], --*oBuffer pos. at which next input char. goes.*
oCopyMark: eoIndexType ← [lo: 0, hi: 0], --*oBuffer pos. of current copy codeword.* oStopPos: CARDINAL ← oBufReserve - 1,
oPrunePos: CARDINAL ← oBufReserve - 1, freeList: enode ← TRASH,
nodeNoBits: CARDINAL ← 0, --*Largest number of bits in a nodeNo - 1*
maxNodeNumber: CARDINAL ← 0,
nodeAtBoundary: CARDINAL ← 2B,

*The oBufIndexer krock bypasses the compiler's 32,768 or 65,536 implementation limit.*
oBufIndexer: ARRAY [0..32) OF LONG POINTER TO Basics.RawBytes ← ALL[NIL],
inFrom: PACKED ARRAY [0..inRefillBytes / 2] OF CARD16 ← ALL[TRASH]
];
enodeArray: TYPE = LONG POINTER TO ARRAY [0..maxNodes + 257) OF ENodeRec;
rnodeArray: TYPE = LONG POINTER TO ARRAY [0..maxNodes) OF ENodeRec;
eleafArray: TYPE = LONG POINTER TO ARRAY [0..maxCopyDisp) OF ELeafRec;
ecWindowArray: TYPE = LONG POINTER TO ARRAY [0..maxCopyDisp) OF eoIndexType;

enodesOffset: INT = SIZE[ExpandStreamRec];
rnodesOffset: INT = enodesOffset + (257 * enodeSize);
eleavesOffset: INT = rnodesOffset + (LONG[maxNodes] * enodeSize);
eoBufferOffset: INT = eleavesOffset + (LONG[maxCopyDisp] * eleafSize);
ecWindowOffset: INT = eoBufferOffset + ((oBufSize + maxCopyLength + bytesPerWord - 1) / bytesPerWord);
expanderStorageSize: INT = ecWindowOffset + (LONG[maxCopyDisp] * SIZE[eoIndexType]);
CreateDecodingStream: CodeControl.CreateDecoderProc = TRUSTED {
  PROC [input: IO.STREAM, methodState: REF] RETURNS [decodeStream: IO.STREAM]
  ch: CountedVM.Handle ← CountedVM.Allocate[expanderStorageSize];
  h: ExpandStreamData ← LOOPHOLE[ch.pointer];
  cWindow: ecWindowArray ← LOOPHOLE[h, LONG POINTER] + ecWindowOffset;
  enodes: enodeArray ← LOOPHOLE[h, LONG POINTER] + enodesOffset;
  eleaves: eleafArray ← LOOPHOLE[h, LONG POINTER] + eleavesOffset;
  parent, scan: enode;
  leaf: eleaf;
  IF methodState # NIL THEN ERROR CodeControl.BadCodingMethod["methodState not
      NIL"];
  h↑ ← [inputStream: input];
  h.inBlock.base ← LOOPHOLE[@h.inFrom];

*1 extra oBufIndexer entry to allow the codeword which wraps around to overflow.*
  FOR I: CARDINAL IN [0..oBufHighOvf + oBufHighOvf] DO
      h.oBufIndexer[I] ← LOOPHOLE[h, LONG POINTER] + eoBufferOffset + (I *
          LONG[(32768 / bytesPerWord)]);
      ENDLOOP;

```
parent ← @enodes[256]; --The root
parent.depth ← parent.cposition ← 0;
parent.sons ← maxCopyDisp + 4;
parent.parent ← parent;
scan ← @enodes[0];
FOR char: BYTE IN [0..256) DO
    scan.sons ← maxCopyDisp + 4; --2 or more extra sons so it won't ever be deleted.
    scan.depth ← 1;
    scan.cposition ← 0;
    scan.parent ← parent;
    scan ← scan + enodeSize;
    ENDLOOP;
scan ← h.freeList ← parent + enodeSize; --origin of node free list
Initialize the first free list node; others will be initialized as needed.
scan.sons ← 2;
scan.nodeNumber ← 0;
scan.parent ← NIL;

leaf ← @eleaves[0];
Do leaf.parent ← NIL, indicating "not in HT," for maxCopyDisp leaves (Initialization of a
fake parent = @h.enodes[0] is not needed when leaf.parent = NIL.).
FOR I: CARDINAL IN [0..eleafSize) DO
    PrincOpsUtils.LongZero[leaf, maxCopyDisp];
    leaf ← leaf + maxCopyDisp;
    ENDLOOP;

cWindow[0] ← [lo: 0, hi: 0];

RETURN[IO.CreateStream[streamProcs: expandStreamProcs, streamData: ch]];
};

ESUnsafeGetBlock: PROC [self: IO.STREAM, block: Basics.UnsafeBlock] RETURNS
        [nBytesRead: INT] = TRUSTED { base: LONG POINTER TO Basics.RawBytes ← LOOPHOLE[block.base];
startIndex: CARDINAL ← block.startIndex; --Will bounds-check [0..64k)
last: CARDINAL ← startIndex + (nBytesRead ← block.count);

h: ExpandStreamData ← LOOPHOLE[NARROW[self.streamData,
        CountedVM.Handle].pointer];
enodes: enodeArray ← LOOPHOLE[h, LONG POINTER] + enodesOffset;
rnodes: rnodeArray ← LOOPHOLE[h, LONG POINTER] + rnodesOffset;
eleaves: eleafArray ← LOOPHOLE[h, LONG POINTER] + eleavesOffset;
cWindow: ecWindowArray ← LOOPHOLE[h, LONG POINTER] + ecWindowOffset;
oBufIndexer: LONG POINTER TO ARRAY [0..32) OF LONG POINTER TO Basics.RawBytes ←
        @h.oBufIndexer;

length: INTEGER ← h.length;
cIndex: cIndexType ← h.cIndex;
cStopPos: cIndexType ← h.cStopPos;

oIndex: eoIndexType ← h.oIndex;
oIndexPtr: LONG POINTER TO Basics.RawBytes ← oBufIndexer[oIndex.hi];
``` oCopyMark: eoIndexType ← h.oCopyMark;
oCopyPtr: LONG POINTER TO Basics.RawBytes ← oBufIndexer[oCopyMark.hi];
oStopPos: CARDINAL ← h.oStopPos;
copyLenOffset: CARDINAL ← h.copyLenOffset;

freeList: enode ← h.freeList;
nodeNoBits: CARDINAL ← h.nodeNoBits;
maxNodeNumber: CARDINAL ← h.maxNodeNumber;
nFreeNodeValues: CARDINAL ← h.nodeAtBoundary - maxNodeNumber;

inputStream: IO.STREAM ← h.inputStream;
inRemainder: CARDINAL ← h.inRemainder;
inState: INTEGER ← h.inState;
inRead: CARDINAL ← h.inRead;
inLast: CARDINAL ← h.inLast;
inFrom: LONG POINTER TO PACKED ARRAY [0..256] OF CARD16 ← LOOPHOLE[@h.inFrom];

oldcIndex: cIndexType;
leaf: eleaf ← NIL;

*Remove a leaf from the tree: then if leaf.parent.sons = 2, remove leaf.parent from the tree and attach its 1 remaining son to leaf.parent.parent; otherwise, decrement leaf.parent.sons. leaf.parent is initialized NIL, meaning that the leaf for this iteration is not in use, and it may be set NIL if another leaf matches to depth = maxCopyLength, or if oBuffer overflows because oBufSize is not enought to accommodate the last maxCopyDisp cpositions; otherwise, leaf.parent # NIL after the first maxCopyDisp copy codewords + literal characters.*
RemoveEleaf: PROC [leaf: eleaf] ~ TRUSTED INLINE {
    parent: enode;
    IF (parent ← leaf.parent) # NIL THEN {
        --leaf.parent ← NIL;
        IF parent.sons = 2 THEN {
            *parent must be deleted: insert an arc from parent.parent to the other son; then deallocate parent.*
            otherSon: enode ← LOOPHOLE[@eleaves[parent.cposition].enode];
            UNTIL otherSon.parent = parent DO
                otherSon ← otherSon.parent;
                ENDLOOP;
            otherSon.parent ← parent.parent;
            parent.parent ← freeList; --*Finally free parent.*
            freeList ← parent;
            }
        ELSE parent.sons ← parent.sons - 1;
        };
    };

*PruneEWindow, analogous to the compressor's PruneCWindow, is conditionally called in the oStopPos conditional to prune tree leaves just enough that during the next oBufReserve characters, no characters needed by the tree will be overwritten. Since Literal and Pad literal coding does not vary, it is not harmful for the compressor to prune cpositions before coding a literal, while the expander prunes cpositions after decoding. However, both the compressor and expander must have pruned cpositions identically at the time of encoding/decoding a NodeCopy, LeafCopy or Pad copy. cIndex and oIndex are the cposition and oposition of the next codeword or literal character.*

PruneEWindow: PROC [h: ExpandStreamData, oIndex: eoIndexType, cIndex, cStopPos: cIndexType] RETURNS [cIndexType] ~ TRUSTED {

PruneLeaves: PROC [h: ExpandStreamData, toPosLow, toPosHigh: eoIndexType, cOldPos: cIndexType] RETURNS [cIndexType] ~ TRUSTED {
        cWindow: ecWindowArray ← LOOPHOLE[h, LONG POINTER] + ecWindowOffset;
        eleaves: eleafArray ← LOOPHOLE[h, LONG POINTER] + eleavesOffset;
        oldLeaf: eleaf ← @eleaves[cOldPos];
        WHILE LOOPHOLE[cWindow[cOldPos], CARD32] IN [LOOPHOLE[toPosLow, CARD32]..LOOPHOLE[toPosHigh, CARD32]) DO
            RemoveEleaf[oldLeaf]; oldLeaf.parent ← NIL;
            IF cOldPos = maxCopyDisp - 1 THEN { cOldPos ← 0; oldLeaf ← @eleaves[0]; }
            ELSE { cOldPos ← cOldPos + 1; oldLeaf ← oldLeaf + eleafSize; };
        ENDLOOP;
        RETURN[cOldPos];
    };

toPosLow, toPosHigh: eoIndexType;
    cOldPos, origcOldPos: cIndexType;
    cOldPos ← origcOldPos ← IF h.allLeavesInUse THEN (IF cIndex = maxCopyDisp - 1 THEN 0 ELSE (cIndex + 1)) ELSE h.cOldPos;
    toPosLow ← oIndex;
    IF (toPosHigh.lo ← toPosLow.lo + maxCopyLength + oBufReserve) >= 100000B THEN {
        toPosHigh.hi ← toPosLow.hi + 1;
        toPosHigh.lo ← toPosHigh.lo - 100000B;
        }
    ELSE toPosHigh.hi ← toPosLow.hi;
    IF toPosHigh.hi >= (oBufHighOvf + oBufHighOvf) THEN {
        cOldPos ← PruneLeaves[h, toPosLow, [lo: 0, hi: oBufHighOvf + oBufHighOvf], cOldPos];
        toPosLow ← [lo: 0, hi: 0];
        toPosHigh.hi ← 0;
    };
    h.oPrunePos ← oIndex.lo + oBufReserve;
    IF (h.cOldPos ← PruneLeaves[h, toPosLow, toPosHigh, cOldPos]) # origcOldPos THEN
        {
        h.allLeavesInUse ← FALSE; cStopPos ← cIndex + 1;
        };
    RETURN[cStopPos];
    };

*A tricky problem here is how to simultaneously get bytes efficiently, raise EndOfStream at the correct time, avoid blocking for bytes that aren't available, and work efficiently on both 16 and 32-bit word size machines. Because the compressor on the other end of a communication stream has done a Flush prior to dismissing for a "long time" and because a Flush is issued immediately before EndOfStream, it is safe to obtain input in 16-bit units. For file streams, it is reasonable to keep asking for large blocks until EOF, but for terminal streams it would be a poor idea to ask for a large block of input which might not become available for an indefinite period. However, on terminal streams, CharsAvail[inputStream] returns a conservative estimate of the no. bytes that can be obtained quickly from the stream, so the code here will not ask for too many (rounding up to an even no. is ok because of the 16-bit alignment restriction).*

FillInputBuffer: PROC [] RETURNS []~ TRUSTED {
*CharsAvail returns # 0 at EndOfStream: otherwise, it returns a conservative estimate of the no. bytes that can be obtained quickly without waiting.*
   count: CARDINAL;
   IF (count ← MIN[IO.CharsAvail[inputStream], inRefillBytes]) < 2 THEN count ← 2
   ELSE count ← BITAND[count + 1, LAST[CARDINAL] - 1]; *--round up to an even no.*
   h.inBlock.count ← count;
   count ← LowHalf[IO.UnsafeGetBlock[inputStream, h.inBlock]];
   IF BITAND[count, 1] # 0 THEN IO.Error[SyntaxError, inputStream] *--Odd byte length => missing Pad?*
   ELSE IF count < 2 THEN ERROR IO.EndOfStream[inputStream];
   inLast ← BITSHIFT[count, -1];
   inRead ← 0;
   };

*code ← nBits bits right-justified (0 <= nBits <= 16).*
*inState is the number of left-justified bits left in inRemainder.*
*inRemainder has inState bits left-justified, zeroes in the rest of the word.*
Input: PROC [nBits: NAT] RETURNS [code: CARDINAL] ~ TRUSTED INLINE {
   code ← BITSHIFT[inRemainder, nBits - bitsPerWord];
   IF (inState ← inState - nBits) >= 0 THEN {
      inRemainder ← BITSHIFT[inRemainder, nBits];
      }
   ELSE {
      IF inRead = inLast THEN FillInputBuffer[];
      inRemainder ← inFrom[inRead ← inRead + 1];
      code ← BITSHIFT[inRemainder, - (inState ← inState + 16)] + code;
      inRemainder ← BITSHIFT[inRemainder, bitsPerWord - inState];
      };
   };

DecodeVar: PROC [start, step, last: CARDINAL] RETURNS [in: CARDINAL ← 0] ~ TRUSTED INLINE {
   UNTIL Input[1] = 0 DO
      in ← in + Power2[start];
      IF (start ← start + step) = last THEN EXIT;
      ENDLOOP;
   in ← in + Input[start];
   };

*DecodeLVar[] = DecodeVar[lenStart, lenStep, lenLast] with special treatment for Pad codewords when start reaches lenLast.*
DecodeLVar: PROC [] RETURNS [in: CARDINAL ← copyLenOffset, padInd: BOOL ← FALSE] ~ TRUSTED INLINE {
   start: CARDINAL ← lenStart;
   UNTIL Input[1] = 0 DO
      in ← in + Power2[start];
      IF (start ← start + lenStep) = lenLast THEN {
         padInd ← TRUE; start ← lenStart; in ← 0; LOOP;
         };
      ENDLOOP;
   in ← in + Input[start];
   };

*Decode the relative cposition field of a LeafCopy codeword (offset by 2).*
DecodeSVar: PROC [] RETURNS [in: CARDINAL ← 2] ~ TRUSTED INLINE {
   start: CARDINAL ← h.dispStart;
   last: CARDINAL ← start + sdispLast - sdispStart;
   DO
      IF Input[1] = 0 THEN { in ← in + Input[start]; EXIT; };
      in ← in + Power2[start];
      IF (start ← start + sdispStep) = last THEN {
         *This is the tricky case. As the progression phases in, ComputeEncoding will be*
         *called to increment h.dispStart at precisely the correct time: for example,*
         *immediately before a transition suppose that a ⟨3, 2, 7⟩ unary code was used with*
         $2\uparrow3 + 2\uparrow5 + 2\uparrow7 = 168$ *values. Immediately after the step to the next larger*
         *size, 169 values must be coded in a ⟨4, 2, 8⟩ progression with* $2\uparrow4 + 2\uparrow6 + 2\uparrow8$
         $= 336$ *values: but only 89 values are needed in the largest 8-bit field. This code*
         *first determines nv, the number of values coded in the largest field; then it shrinks*
         *the field to the smallest size that covers the values (in this case, to 7 bits) and*
         *computes y, the no. free values in the reduced field. Finally, it decodes a field of*
         *size start - 1 for the smallest y values or of size start for the others.*
         x, y: CARDINAL;
         nv: CARDINAL ← IF h.allLeavesInUse THEN maxCopyDisp - 1 - h.lastNVals ELSE
            ((IF cIndex >= h.cOldPos + 1 THEN cIndex - 1 ELSE cIndex - 1 +
            maxCopyDisp) - h.cOldPos - h.lastNVals);
         WHILE Power2M1[start - 1] >= nv DO start ← start - 1; ENDLOOP;
         x ← Input[start - 1];
         in ← in + (IF x >= (y ← Power2M1[start] - nv + 1) THEN x + x - y + Input[1]
            ELSE x);
         EXIT;
      };
   ENDLOOP;
   RETURN[IF cIndex >= in THEN cIndex - in ELSE cIndex - in + maxCopyDisp];
   };

FOR i: CARDINAL IN [startIndex .. last) DO
   ENABLE IO.EndOfStream => {
      nBytesRead ← i - startIndex;
      *Check for EndOfStream raised when more literal characters are expected.*
      IF length # 0 THEN IO.Error[SyntaxError, inputStream];
      EXIT;
   };
   IF length > 0 THEN { --*Another char. from body of a copy*
      *Note that either oIndex or oCopyMark can overflow beyond oBufSize during a copy,*
      *so that no overflow checks are needed in this loop: if oIndex overflows, the excess*
      *bytes will be copied back to the beginning before the next codeword; if oCopyMark*
      *overflows, then enough bytes were copied to the overflow area before starting the copy.*
      base[i] ← oIndexPtr[oIndex.lo - LOOPHOLE[length, CARDINAL]] ←
            oCopyPtr[oCopyMark.lo - LOOPHOLE[length, CARDINAL]];
      length ← length - 1;
   }
   ELSE { --*Another literal char. or a new codeword*
      *It is critical to do all leaf and node removals and insertions in the same sequence as the*
         *compressor.*
      scan, parent, previous: enode;
      code: CARDINAL;

```
leaf ← @eleaves[cIndex];
RemoveEleaf[leaf];
IF oIndex.lo >= oStopPos THEN {
    prune: BOOL ← oIndex.lo >= h.oPrunePos;
    IF oIndex.lo >= 100000B THEN {
        oIndex.lo ← oIndex.lo - 100000B;
        h.oPrunePos ← h.oPrunePos - 100000B;
        IF (oIndex.hi ← oIndex.hi + 1) >= (oBufHighOvf + oBufHighOvf) THEN {
            Copy overflow bytes back to the beginning of oBuffer.
            oBuffer: LONG POINTER TO Basics.RawBytes ← oBufIndexer[0];
            oBufferHi: LONG POINTER TO Basics.RawBytes ←
                    oBufIndexer[oBufHighOvf + oBufHighOvf];
            oIndex.hi ← 0;
            FOR I: CARDINAL IN [0..oIndex.lo) DO oBuffer[I] ← oBufferHi[I];
                ENDLOOP;
            };
        oIndexPtr ← oBufIndexer[oIndex.hi];
        };
    IF prune THEN cStopPos ← PruneEWindow[h, oIndex, cIndex, cStopPos];
    oStopPos ← MIN[h.oPrunePos, 100000B];
    UNTIL freeList # NIL DO  --Node storage exhausted
        cOldPos: cIndexType ← IF h.allLeavesInUse THEN (IF cIndex =
            maxCopyDisp - 1 THEN 0 ELSE cIndex + 1) ELSE h.cOldPos;
        h.allLeavesInUse ← FALSE;
        FOR I: CARDINAL IN [0..leavesToFree) DO  --Purge leaves
            oldLeaf: eleaf ← @eleaves[cOldPos];
            RemoveEleaf[oldLeaf]; oldLeaf.parent ← NIL;
            cOldPos ← IF cOldPos = maxCopyDisp - 1 THEN 0 ELSE cOldPos + 1;
            ENDLOOP;
        h.cOldPos ← cOldPos;
        cStopPos ← cIndex + 1;
        ENDLOOP;
    };
It's ok to smash cWindow[cIndex] (after calling PruneEWindow) because the
compressor removed the oldest cWindow position from its tree before looking for the
longest match, so the smashed value will not be used.
cWindow[cIndex] ← oIndex;
IF (cIndex ← (oldcIndex ← cIndex) + 1) = cStopPos THEN {
    IF cIndex = maxCopyDisp THEN cIndex ← 0;
    IF NOT h.allLeavesInUse THEN [h.dispStart, cStopPos, h.allLeavesInUse,
        h.lastNVals] ← ComputeEncoding[cIndex, h.cOldPos]
    ELSE cStopPos ← maxCopyDisp;
    };

{ --This bracket for the tree structure exits
    IF length = 0 THEN {  --Expand next codeword
        Determine parameters for the next Literal, NodeCopy, LeafCopy, or Pad
        codeword: length ← copy length - 1 on a Copy or Pad copy, - literal length +
        1 on a Literal or Pad literal; oCopyPtr[oCopyMark.lo] is the absolute window
        position for a copy. Give IO.EndOfStream error (via the Input subroutine) if
        no codewords are left.
        IF Input[1] = 0 THEN {  --NodeCopy codeword
            lengthFieldSize, arcLength, nal: NAT;
```

```
        copyLenOffset ← 0;
        code ← Input[nodeNoBits];
        IF code >= nFreeNodeValues THEN code ← code + code -
                nFreeNodeValues + Input[1];
        scan ← @rnodes[code];
        oCopyMark ← cWindow[scan.cposition];
        IF (arcLength ← scan.depth - scan.parent.depth) < 2 THEN GO TO
           nodeExit;
        [lengthFieldSize, nal] ← lengthFieldMap[arcLength];
        IF nal = 0 THEN length ← Input[lengthFieldSize]
        ELSE {
            length ← Input[lengthFieldSize - 1];
            IF length >= nal THEN length ← length + length - nal + Input[1];
            };
        IF length = 0 THEN GO TO nodeExit  --attach new leaf to existing node
        ELSE {
            length ← (parent ← scan.parent).depth + length - 1;  --copy length - 1
            GO TO arcExit;
            };
        }
    ELSE {  --LeafCopy, Literal, or Pad codword
        padInd: BOOL;
        [length, padInd] ← DecodeLVar[];
        IF NOT padInd THEN {
            IF length = 0 THEN {  --A literal
                length ← - DecodeVar[litStart, litStep, litLast];
                copyLenOffset ← IF length # (- maxLitLength + 1) THEN 1 ELSE
                    0;
                GO TO litExit;
                };
            A LeafCopy, length = arc displacement = [1..maxCopyLength)
            copyLenOffset ← 0;
            code ← DecodeSVar[];
            oCopyMark ← cWindow[code];
            scan ← LOOPHOLE[@eleaves[code], enode];
            length ← (parent ← scan.parent).depth + length - 1;  --copy length - 1
            IF length < maxCopyLength - 1 THEN GO TO arcExit
            ELSE IF length >= maxCopyLength THEN BugTrap[]
            ELSE GO TO cutOffExit;
            }
        ELSE {  --A Pad codeword
            leaf.parent ← NIL;  --Complete the work of RemoveEleaf
            copyLenOffset ← 0;
            IF length = 0 THEN {  --Pad literal
                base[i] ← oIndexPtr[oIndex.lo] ← Input[8];
                oIndex.lo ← oIndex.lo + 1;
                16-bit align the input stream
                IF bytesPerWord = 2 THEN IF Input[inState] # 0 THEN
                        IO.Error[SyntaxError, inputStream]
                ELSE IF bytesPerWord = 4 THEN IF Input[BITAND[inState, 17B]] #
                        0 THEN IO.Error[SyntaxError, inputStream]
                ELSE BugTrap[];
                LOOP;
                }
```

```
ELSE { --Pad copy
    code ← DecodeSVar[];
    oCopyMark ← cWindow[code];
    16-bit align the input stream
    IF bytesPerWord = 2 THEN IF Input[inState] # 0 THEN
                IO.Error[SyntaxError, inputStream]
    ELSE IF bytesPerWord = 4 THEN IF Input[BITAND[inState, 17B]] #
                0 THEN IO.Error[SyntaxError, inputStream]
    ELSE BugTrap[];
            GO TO copyExit;
            };
        };
    };
}
ELSE { --Literal (length < 0)
    length ← length + 1; GO TO litExit;
    };
EXITS
    cutOffExit => {
        The longest match is on the arc scan (enode or eleaf): length holds
        copyLength - 1 = maxCopyLength - 1; oCopyMark is the starting
        position of the string. Replace the arc which matched to maxCopyLength
        with the new leaf.
        leaf.parent ← previous ← parent;
        scan.parent ← NIL;
        };

arcExit => {
        The longest match is on the arc scan (enode or eleaf): length holds
        copyLength - 1; oCopyMark holds the start of the string. Splice a new tree
        node into the arc from parent to scan; then hang scan and leaf from this
        new node.
        IF (freeList ← (previous ← freeList).parent) = NIL THEN {
            IF maxNodeNumber < (maxNodes - 1) THEN { --Make another node.
                freeList ← previous + enodeSize; freeList.sons ← 2;
                freeList.parent ← NIL;
                maxNodeNumber ← freeList.nodeNumber ← maxNodeNumber
                    + 1;
                }
            ELSE { --No node storage left: maybe free another node.
                maxNodeNumber ← maxNodes; oStopPos ← oIndex.lo;
                };
            The number of bits required to hold the node number of the best match
            increases after node 2↑n + 1 is initialized. Nodes [0..2↑n] may be
            indicated in the longest match on subsequent iterations.
            IF maxNodeNumber = (h.nodeAtBoundary + 1) THEN {
                Have to worry about 16-bit wrap-around here.
                h.nodeNoBits ← nodeNoBits ← nodeNoBits + 1;
                h.nodeAtBoundary ← h.nodeAtBoundary + h.nodeAtBoundary;
                };
            nFreeNodeValues ← h.nodeAtBoundary - maxNodeNumber;
            };
        node.sons is always 2 when node is put on the free list.
```

```
        previous.depth ← length + 1;
        previous.parent ← parent;
        leaf.parent ← scan.parent ← previous;
        };

nodeExit => {
        The longest match is to the node scan: oCopyMark is its position.
        length ← (leaf.parent ← previous ← scan).depth - 1;
        previous.sons ← previous.sons + 1;
        };

litExit => {
        base[i] ← code ← oIndexPtr[oIndex.lo] ← Input[8];
        oIndex.lo ← oIndex.lo + 1;
        Hang the leaf from the depth = 1 permanent node.
        leaf.parent ← previous ← @enodes[code];
        previous.sons ← previous.sons + 1; --***This statement could be avoided
        previous.cposition ← cIndex not needed at depth = 1.
        LOOP;
        };
    };
NodeCopy and LeafCopy codewords get here on the first character
Update node cpositions back through depth = 2.
FOR parent ← previous, parent.parent UNTIL parent.depth = 1 DO
    parent.cposition ← oldcIndex;
    ENDLOOP;

GO TO copyExit;

EXITS
    copyExit => {
        oCopyPtr ← oBufIndexer[oCopyMark.hi];
        base[i] ← oIndexPtr[oIndex.lo] ← oCopyPtr[oCopyMark.lo];
        oIndex.lo ← oIndex.lo + LOOPHOLE[length, CARDINAL] + 1;
        IF (oCopyMark.lo ← oCopyMark.lo + LOOPHOLE[length, CARDINAL] + 1) >
                100000B THEN {
            IF oCopyMark.hi = (oBufHighOvf + oBufHighOvf - 1) THEN {
                Copy enough bytes from the beginning of oBuffer into the overflow area
                    to satisfy the copy operation, so that the performance-critical copy loop
                    doesn't have to check for buffer wrap-around on every byte. The copied
                    bytes may be overwritten (before being read) if oIndex.lo also overflows
                    during the copy. However, when oIndex has already recently
                    overflowed and been set back to 0, the copied bytes ahead of oIndex
                    will be ancient garbage; then garbage bytes in the overflow area will
                    not be updated ahead of the pointer. To fix this, first copy all valid
                    bytes from the beginning of the buffer; then go back to the beginning of
                    the copy and copy the rest that are needed. Since the first character
                    has been copied without overflowing (because both oCopyMark and
                    oIndex initially point inside [0..oBufSize)), the copied sequence begins
                    with the first character after that.
                count: CARDINAL ← oCopyMark.lo - 100000B; --No. overflow bytes
                    needed.
                oBuffer: LONG POINTER TO Basics.RawBytes ← oBufIndexer[0];
```

```
                    oBufferHi: LONG POINTER TO Basics.RawBytes ←
                            oBufIndexer[oBufHighOvf + oBufHighOvf];
                    firstOld: CARDINAL ← oIndex.lo - length;
                    IF (oIndex.hi = 0) AND (firstOld < count) THEN {
                            FOR I: CARDINAL IN [0..firstOld) DO
                                oBufferHi[I] ← oBuffer[I];
                                ENDLOOP;
                            FOR I: CARDINAL IN [firstOld..count) DO
                                oBufferHi[I] ← oCopyPtr[oCopyMark.lo - length - firstOld +
                                        I];
                                ENDLOOP;
                            }
                        ELSE FOR I: CARDINAL IN [0..count) DO
                            oBufferHi[I] ← oBuffer[I]; ENDLOOP;
                        };
                    };
                };
            };
        ENDLOOP;
        h.length ← length;
        h.cIndex ← cIndex;
        h.cStopPos ← cStopPos;
        h.oIndex ← oIndex;
        h.oCopyMark ← oCopyMark;
        h.oStopPos ← oStopPos;
        h.freeList ← freeList;
        h.maxNodeNumber ← maxNodeNumber;
        h.copyLenOffset ← copyLenOffset;

h.inState ← inState;
        h.inRemainder ← inRemainder;
        h.inRead ← inRead;
        h.inLast ← inLast;
        RETURN[nBytesRead];
        };

ESGetChar: PROC [self: IO.STREAM] RETURNS[echar: CHAR] = TRUSTED {
    buff: PACKED ARRAY [0..1] OF CHAR;
    IF ESUnsafeGetBlock[self, [base: LOOPHOLE[LONG[@buff]], startIndex: 0, count: 1]] = 0
            THEN
        ERROR IO.EndOfStream[self];
    RETURN[buff[0]];
    };
```

*EndOf returns FALSE until the current copy or literal is exhausted and EndOf[h.inputStream] has been reached.*

```
ESEndOf: PROC [self: IO.STREAM] RETURNS [BOOL] = TRUSTED {
    h: ExpandStreamData ← LOOPHOLE[NARROW[self.streamData,
            CountedVM.Handle].pointer];
    RETURN[(h.length = 0) AND (h.inLast = h.inRead) AND IO.EndOf[h.inputStream]];
    };

ESClose: PROC [self: IO.STREAM, abort: BOOL ← FALSE] = TRUSTED {
    ch: CountedVM.Handle ← NARROW[self.streamData];
```

*Explicitly freeing storage avoids swap out: the Collector reclaims only the Handle.*
CountedVM.Free[ch];
};

IF HighHalf[oBufSize] >= 15 THEN BugTrap[]; --*Must enlarge h.oBufIndexer table.*
*Initialize lengthFieldMap, whose entries hold [lengthFieldSize, nFreeValues].*
--IF maxCopyLength > 2048 THEN BugTrap[];
FOR arcLen: NAT IN [2049..maxCopyLength] DO lengthFieldMap[arcLen] ← [12, 4096 - arcLen];
    ENDLOOP;
FOR arcLen: NAT IN [1025..2048] DO lengthFieldMap[arcLen] ← [11, 2048 - arcLen]; ENDLOOP;
FOR arcLen: NAT IN [513..1024] DO lengthFieldMap[arcLen] ← [10, 1024 - arcLen]; ENDLOOP;
FOR arcLen: NAT IN [257..512] DO lengthFieldMap[arcLen] ← [9, 512 - arcLen]; ENDLOOP;
FOR arcLen: NAT IN [129..256] DO lengthFieldMap[arcLen] ← [8, 256 - arcLen]; ENDLOOP;
FOR arcLen: NAT IN [65..128] DO lengthFieldMap[arcLen] ← [7, 128 - arcLen]; ENDLOOP;
FOR arcLen: NAT IN [33..64] DO lengthFieldMap[arcLen] ← [6, 64 - arcLen]; ENDLOOP;
FOR arcLen: NAT IN [17..32] DO lengthFieldMap[arcLen] ← [5, 32 - arcLen]; ENDLOOP;
FOR arcLen: NAT IN [9..16] DO lengthFieldMap[arcLen] ← [4, 16 - arcLen]; ENDLOOP;
FOR arcLen: NAT IN [5..8] DO lengthFieldMap[arcLen] ← [3, 8 - arcLen]; ENDLOOP;
FOR arcLen: NAT IN [3..4] DO lengthFieldMap[arcLen] ← [2, 4 - arcLen]; ENDLOOP;
lengthFieldMap[2] ← [1, 0];
lengthFieldMap[1] ← lengthFieldMap[0] ← [0, 0]; --*Not used*

*Initialize litLenMap whose entries hold [literal length code, nbits].*
litLenMap[0] ← [0, 99]; --*Never happens*
litLenMap[1] ← [10B, 4]; --100.0
litLenMap[2] ← [44B, 6]; --100.10x
litLenMap[3] ← [45B, 6]; --100.10x
FOR litLen: CARDINAL IN [4..7] DO --100.110xx
    litLenMap[litLen] ← [230B + litLen - 4, 8];
    ENDLOOP;
FOR litLen: CARDINAL IN [8..15] DO --100.1110xxx
    litLenMap[litLen] ← [1160B + litLen - 8, 10];
    ENDLOOP;
FOR litLen: CARDINAL IN [16..31] DO --100.11110xxxx
    litLenMap[litLen] ← [4740B + litLen - 16, 12];
    ENDLOOP;
FOR litLen: CARDINAL IN [32..63] DO --100.11111xxxxx
    litLenMap[litLen] ← [11740B + litLen - 32, 13];
    ENDLOOP;

*Register C2 with CodeControl's registry.*
CodeControl.RegisterCodingMethod[methodName, CreateEncodingStream,
  CreateDecodingStream, , NIL, FALSE, FALSE, compressorStorageSize * bytesPerWord,
  expanderStorageSize * bytesPerWord, "General stream", "155050", "280529"];

}.

What is claimed:

1. In a textual substitution data compressor, the improvement comprising a finite, substantially fixed length search window for storing recently compressed data symbols;

a search tree data structure having a predetermined cut-off depth for linking said recently compressed symbols to each other in accordance with the order of their occurrence and for tracking said recently compressed symbols as they advance across said search window, the cut-off depth of said search tree being selected based on a maximum permissible copy length;

means for inserting uncompressed symbols into said search tree for identifying prior occurrences of reoccurring symbol strings and for determining the string length and position within said search window of the longest of said prior occurrences for each of said reoccurring symbol strings; and means for providing copy codewords and literal codewords with a variable number of appended literal symbols for encoding said uncompressed symbols depending on whether said uncompressed symbols define or fail to define, respectively, reoccurring symbol strings of minimum length; each of said copy codewords identifying the length and the search window position of the prior occurrence of the reoccurring symbol string it represents; and each of said literal codewords identifying the number of literal symbols that are appended to it.

2. The improvement of claim 1 wherein said copy codewords and said literal codewords have fixed lengths.

3. The improvement of claim 1 wherein the minimum reoccurring string length for encoding with a copy codeword is increased by one symbol while symbols are being accumulated for a literal codeword.

4. The improvement of claim 3 wherein the minimum reoccurring string length for encoding with a copy codeword is increased from two symbols to three symbols while symbols are being accumulated for a literal codeword.

5. The improvement of claim 1 wherein said copy codewords and said literal codewords have statistically sensitive, variable lengths.

6. The improvement of claim 1 wherein said search tree has a root and nodes representing symbols within said search window, and said uncompressed symbols are inserted into said tree by returning to its root to find a search path for the insertion of each symbol string.

7. The improvement of claim 6 wherein said nodes include position fields for identifying the search window position of the symbols they represent, and the position fields of the nodes on the search path for each symbol string inserted into said tree are updated to refer to the most recent occurrence of the symbols they represent as said symbol string is being inserted into said tree.

* * * * *